United States Patent
Omura et al.

(10) Patent No.: US 6,534,998 B1
(45) Date of Patent: Mar. 18, 2003

(54) SEMICONDUCTOR DEVICE AND CONTROL METHOD THEREOF

(75) Inventors: Ichiro Omura, Yokohama (JP); Wolfgang Fichtner, Zurich (CH); Hiromichi Ohashi, Yokohama (JP); Tsuneo Ogura, Kamakura (JP); Hideaki Ninomiya, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 155 days.

(21) Appl. No.: 09/716,381

(22) Filed: Nov. 21, 2000

Related U.S. Application Data

(62) Division of application No. 09/041,792, filed on Mar. 13, 1998, now Pat. No. 6,153,896.

(30) Foreign Application Priority Data

Mar. 14, 1997 (JP) .............................................. 9-061307
Mar. 12, 1998 (JP) ........................................... 10-061224

(51) Int. Cl.[7] ............................................ G01R 31/08
(52) U.S. Cl. ........................................ 324/536; 327/327
(58) Field of Search ................................ 324/536, 456, 324/457, 458, 700, 719; 327/390, 434, 313, 327; 365/185.02, 185.14, 185.18, 185.23, 185.31

(56) References Cited

U.S. PATENT DOCUMENTS

| | | | |
|---|---|---|---|
| 3,675,091 A | * 7/1972 | Naomoto et al. ....... | 317/235 R |
| 4,661,833 A | * 4/1987 | Mizutani ..................... | 357/54 |
| 5,329,142 A | 7/1994 | Kitagawa et al. | |
| 5,636,160 A | * 6/1997 | Omino et al. .......... | 365/185.02 |
| 5,652,722 A | * 7/1997 | Whitefield ............. | 365/185.23 |
| 5,787,034 A | * 7/1998 | Omino et al. .......... | 365/185.02 |
| 5,815,436 A | * 9/1998 | Tanaka et al. ......... | 365/185.03 |
| 5,939,927 A | * 8/1999 | Myers ......................... | 327/390 |

OTHER PUBLICATIONS

B.J. Baliga, "Power Semiconductor Devices–Insulated Gate Bipolar Transistor", Chapter 8, (1995), pp. 426–502.

* cited by examiner

*Primary Examiner*—Christine Oda
*Assistant Examiner*—Etienne P LeRoux
(74) *Attorney, Agent, or Firm*—Oblon, Spivak, McClelland, Maier & Neustadt, P.C.

(57) ABSTRACT

Disclosed is a semiconductor device capable of stabilizing a gate voltage at high voltage and high current, protecting the device from breakdown by preventing current nonuniformity and oscillations and the like, thereby improving reliability, and a method for controlling the semiconductor device. The semiconductor device comprises an n-type base layer, a p-type emitter layer, which is formed on a surface of the n-type base layer, a collector electrode, formed on a surface of the p-type emitter layer, a p-type base layer, formed on a surface on the n-type base layer which is opposite to the p-type emitter layer, an n-type source layer, formed in a surface of the p-type base layer, an emitter electrode, formed on the n-type source layer and the p-type base layer, and a gate electrode, contacting the n-type source layer, the p-type base layer and the n-type base layer, with a gate insulating film interposed therebetween, wherein when a voltage is applied between the collector electrode and the emitter electrode, the capacitance of the gate electrode is always a positive value or zero.

4 Claims, 35 Drawing Sheets

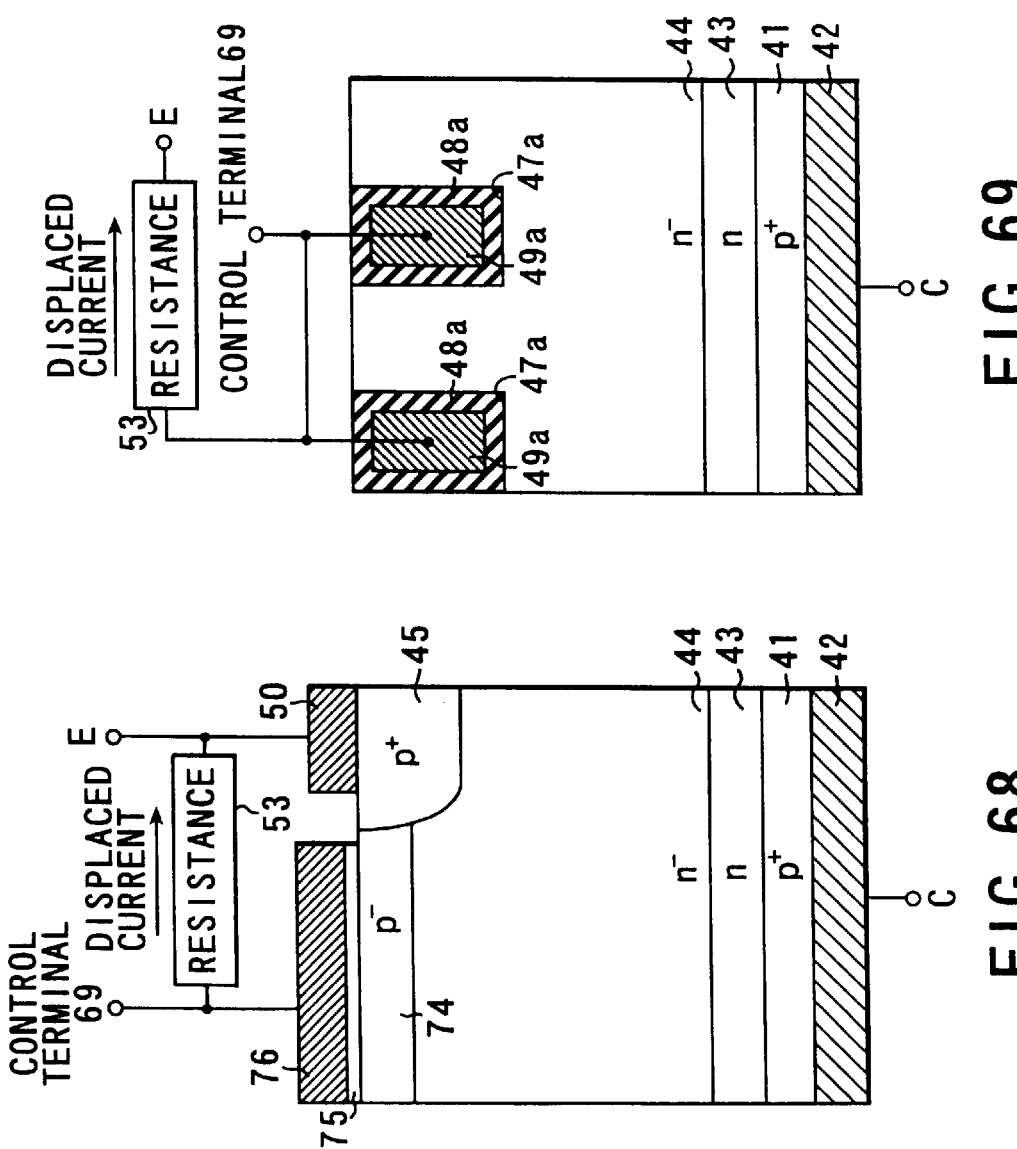

SEMICONDUCTOR DEVICE AND CONTROL METHOD THEREOF

This is a division of application Ser. No. 09/041,792, filed Mar. 13, 1998, now U.S. Pat. No. 6,153,896.

BACKGROUND OF THE INVENTION

The present invention relates to a semiconductor device for controlling electric power and a control method thereof, and more particularly to a semiconductor device capable of improving stability by optimizing the capacitance of a control terminal and a control method thereof.

Generally, IGBT (Insulated Gate Bipolar Transistor) and IEGT (Injection Enhanced Gate Bipolar Transistor) and the like, which control large power using a control terminal having an MOS structure (hereinafter referred to as a gate), are widely used as semiconductor devices for controlling power.

FIG. 1 is a cross-sectional view of a configuration of this type of IGBT. As FIG. 1 shows, a collector electrode 2 is formed on a p-type emitter layer 1, and an n-type base layer 3 is formed on the surface of side which is opposite to the collector electrode 2. P-type base layers 4 are formed on the surface of the n-type base layer 3 by selective diffusion. N-type source layers 5 are selectively formed in the surfaces of the p-type base layers 4.

A gate electrode 7 is formed, via a gate insulating film 6, above the region which extends from one of the n-type source layers 5, through one p-type base layer 4, the n-type base layer 3 and the other p-type base layer 4, to the other n-type source layer 5. Further, a joint emitter electrode 8 is formed on the p-type base layers 4 and the n-type source layers 5.

In order to turn the IGBT ON, with a voltage (main voltage) which is positive with respect to the emitter electrode 8 side being applied at the collector electrode 2 side, a voltage, which is positive with respect to the emitter electrode 8, is applied to the gate electrode 7. As a result, n-type channels are formed on the surfaces of the p-type base layers 4, which are sandwiched between the n-type base layer 3 and the n-type source layers 5, and a current of electrons flows through the n-type base layer 3. And, positive hole current flows from the p-type emitter layer 1 to the n-type base layer 3, causing a conductivity modulation in the n-type base layer 3, whereby the IGBT turns ON.

In order to turn the IGBT OFF, a voltage, which is zero or negative with respect to the emitter electrode 8, is applied to the gate electrode 7. The n-type channels are thereby destroyed, ending the injection of electrons to the n-type base layer 3. As a result, the IGBT turns OFF. In this state, the main voltage is still being applied at the collector electrode 2 side.

When actually manufactured, a plurality of the above type of individually micromachined IGBTs are integrated within a chip. In other words, among the entire plurality of IGBTs integrated in the chip, the IGBT shown in FIG. 1 constitutes a unit region known as a cell, which consists of two IGBTs corresponding to two ends of one gate electrode 7. The IGBTs of these cells are integrated in parallel so as to form a chip-shaped IGBT arrangement.

However, in semiconductor devices such as the IGBT described above, there is the danger that the semiconductor device may become unable to control current as a result of instability of the gate voltage $V_G$ or nonuniformity of the ON current (collector current) in the chip or in the cell. This can lead to breakdown of the IGBT itself.

Instability of the gate voltage $V_G$ is caused by problems such as noise mixing into the gate circuit, discrepancies in the characteristics of the gate resistors and nonuniformity among the IBGTs.

For instance, FIG. 2 shows a pair of IGBTs 1 and 2 in the ON state, wherein, when 1V of noise becomes mixed into the 300 W gate resistance of the IGBT 1 for a single moment (approximately 10 nsec), the gate voltage $V_G$ inclines toward the other IGBT 2 as shown in FIG. 3. Consequently, as FIG. 4 shows, the ON current flows only to the IGBT 2.

The above is only one example of undesired phenomena resulting from noise and the like. Other potential phenomena are oscillation of the gate voltage $V_G$ and concentration of current within the cell and the like. When the IGBT is operating at high voltage and high current, any of these phenomena is liable to cause breakdown of the IGBT, lowering the reliability of the semiconductor device.

Furthermore, a system of short-circuit protection is conventionally known as a method for improving the reliability of this type of semiconductor device. FIG. 5 shows a circuit diagram illustrating this short-circuit protection system, and FIG. 6, a front view of the outside of this semiconductor device.

The main element of the semiconductor device is a main IGBT element M1, which is electrically connected in parallel to a sensing IGBT element S1 for detecting current, these elements being provided within a single chip. The area ratio of the elements within the chip may be expressed as in the range of 1:100–1000, the sensing IGBT element S1 being 1, and the main IGBT element M1 being 100–1000.

The current flowing to the main IGBT element M1 is detected from the voltage drop across a resistance Rs which is connected to the emitter of the sensing IGBT element S1. In other words, when large current resulting from a short circuit or the like flows into the sensing IGBT element S1, there is a voltage drop at the resistance Rs. As FIG. 5 shows, this voltage drop causes current to flow to the base of a transistor Tr1, the collector of which is connected to the gate circuit. Consequently, the transistor Tr1 turns ON, reducing the gate voltages of the main IGBT element M1 and the sensing IGBT element S1.

However, the above short-circuit protection has the following disadvantages.

When the operating mode changes abruptly, as when the device is turned ON and OFF, the detected current may not always correspond exactly to the current of the whole IGBT chip. As a result, there are many cases where the protection system fails to operate when a short circuit occurs. An additional disadvantage is that manufacturing discrepancies are considerable.

Moreover, since the sensing IGBT element S1 is provided in the same chip as the main IGBT element M1, there is the disadvantage that the effective area of the main IGBT element M1 is decreased. And, the protection operation tends to be delayed and to suffer from unstable oscillations and the like because the feedback loop from the detection of large current to the gate voltage reduction is so long. Further, once the sensing IGBT element S1 has been provided, it is extremely difficult to perform adjustments and the like to the protection level. There is also the disadvantage that the semiconductor device has a four-terminal structure, comprising the collector, gate and emitter terminals of the main IGBT element M1 and the emitter of the sensing IGBT element S1. The configuration of the semiconductor device is therefore complex and costs are increased.

Next, the protection of the semiconductor device when turned OFF will be described.

A timechart (a) in FIG. 7 is showing the change over time of the voltage $V_{CE}$, which is applied to the main IGBT element M1, and the current $I_{CE}$, which flows through the main IGBT element M1, when the main IGBT element M1 is turned OFF. A timechart (b) in FIG. 7 is showing differential versions of the voltage waveforms of (a) in FIG. 7. In each diagram, a solid line is used to depict the state when gate resistance Rg, which is connected is parallel to the MOS gate circuit, is small, and a broken line depicts the state when the gate resistance Rg is large.

When driven by high-frequency signals, the ON/OFF loss (the product of voltage and current integrated over time) not only at the main IGBT element M1 but also in the power element must be reduced. Therefore, the gate resistance Rg must be reduced in order to increase the turn-OFF speed. However, as (b) in FIG. 7 shows, the dV/dt peak value is higher when the time taken to perform turn-OFF is shorter. Here, since the target voltage $V_{CE}$ is fixed, the two differential waveforms shown at (b) in FIG. 7 have equal time axes and areas.

Moreover, in the case where the gate resistance Rg has been reduced to increase the boost rate dV/dt of the voltage $V_G$ applied to the main IGBT element M1, when the dV/dt peak value exceeds a predetermined value, there is the problem that the main IGBT element M1 fails to turn OFF and breakdown as a result of displaced current which is proportional to the dV/dt.

On the other hand, in the case where the gate resistance Rg has been increased to protect the main IGBT element M1 from breakdown caused by the dV/dt, there are the disadvantages that turn-OFF speed is slower, there is increased turn-OFF loss, and it is difficult to increase switching speed.

BRIEF SUMMARY OF THE INVENTION

It is therefore an object of the present invention to provide a semiconductor device which is capable of stabilizing gate voltage when operating at high voltage and large current, preventing nonuniformity and oscillation and the like, and improving reliability by protecting the device from breakdown, and a control method therefore.

Furthermore, it is another object of the present invention to provide a semiconductor device which can be protected from breakdown caused by displaced current, thereby improving reliability, by detecting dV/dt at turn-OFF and controlling Rg accordingly.

The present invention has been achieved based on the knowledge, discovered by the present applicant and the like, that one of the main causes of IGBT breakdown is the fact that, at high collector voltage, a gate has negative differential capacitance ($C_G = dQ_G/dV_G$, where $Q_G$ is charge accumulating at the gate). In other words, the essential point of the present invention is to protect the semiconductor device from breakdown by eliminating negative differential capacitance at the gate, thereby improving the stability of the device.

Next, the knowledge upon which the invention is based will be explained.

As FIG. 8 shows, the present applicant and the like performed tests to determine the gate voltage $V_G$ dependency (inclination of which denotes gate capacitance) of the gate charge Qc, for various collector voltages $V_{CE}$ in an IGBT having a dielectric withstanding voltage of 1200V (Toshiba, Product Name: GT25Q101, wherein length of n-type base layer 3 is not less than approximately 100 $\mu$m, and density of impurities is not more than: $5 \times 10^{13}$ cm$^{-3}$). The gate voltage $V_G$ comprises a one-pulse sine wave with amplitude of approximately 15V which is multiplexed onto a direct current bias shown on the horizontal axis. In other words, a conventionally known C-V measuring method could not be used here, because such a method does not take into account the boost in element temperature during measuring. Instead, a one-pulse sine wave was applied to the gate, and the amount of charge flowing into the gate during the application of the sine wave was simultaneously measured. Then, the respective amounts were input to an oscilloscope, with the gate voltage as the horizontal deflection and the charge amount as the vertical deflection. FIG. 8 shows the results obtained. Here, the sine wave frequency is 10–20 kHz.

As FIG. 8 shows, when the collector voltage $V_{CE}$ is 881V, the gate charge QG decreases as the gate voltage $V_G$ is boosted, resulting in negative differential capacitance at the gate.

FIG. 9 and FIG. 10 show similar results obtained by simulating the FIG. 8 test. In other words, as FIG. 10 shows, the gate capacitances determined from a simulation reveal that at high collector voltage $V_{CE}$, negative capacitance occurs above the gate threshold voltage Vth.

This negative capacitance occurs through the mechanism described in (M1)–(M3) below, and results in the effects described in (M4).

(M1) At high collector voltage, positive holes injected from a p-type emitter layer 1 are accelerated by the high electromagnetic field in an n-type base layer 3 and arrive at the interface between the n-type base layer 3 and a gate insulating film 6. (M2) At high collector voltage, the potential of the n-type base layer 3 is higher than the gate voltage $V_G$. As a result, a positive hole channel (accumulation layer) is formed at the interface with the n-type base layer 3. (M3) The positive charge of this positive hole channel causes negative charge within the gate electrode 7, resulting in negative capacitance.

(M4) When a gate resistance is connected to the gate electrode 7, the negative C.R time constant causes instability in the gate voltage $V_G$. Consequently, as FIG. 3 showed, the gate voltage $V_G$ either boosts or drops. Moreover, the gate voltage $V_G$ is caused to oscillate, which can make the gate impossible to control.

This type of negative capacitance can be expressed by an equation to be explained below.

FIG. 11 shows the above mechanisms (M1)–(M3) in more detail. The circuit shown in FIG. 11 can be substituted by the equivalent circuit of FIG. 12. The equivalent circuit shown in FIG. 13 illustrates the relation between capacitance and voltage at each component.

Based on the equivalent circuit of FIG. 12, the electronic current Ie, which is injected via the n-channel at the interface with the p-type base layer 4 to the n-type base layer 3, can be expressed by the following equation (1):

$$Ie = gm^{n\text{-}ch}(V_{GE} - Vth^{n\text{-}ch}) \tag{1}$$

Here, gm$^{n\text{-}ch}$ denotes the mutual conductance, and $V_G - Vth^{n\text{-}ch}$ denotes the threshold voltage of the n-channel.

And, hole current Ih, which is injected from the p-type emitter layer 1, can be expressed by the following equation (2) using the current amplitude rate β of the pnp transistor portion of the IGBT (IEGT)

$$Ih = \beta Ie \tag{2}$$

Assuming a case in which the hole current Ih passes through all the p-channels on the interface with the n-type base layer 3 as it flows to the p-type base layer 4, the hole current Ih can be expressed with the following equation (3):

$$Ih = gm^{p\text{-}ch}(Vpch - V_G - Vth^{p\text{-}ch}) \quad (3)$$

Here, an equation expressing the relations of voltages of all components can be obtained by substituting equation (1) and equation (2) into equation (3) as follows:

$$gm^{p\text{-}ch}(Vpch - V_G - Vth^{p\text{-}ch}) = \beta gm^{n\text{-}ch}(V_G - Vth^{n\text{-}ch}) \quad (4)$$

And, from the equivalent circuit shown in FIG. 13, charge $\Delta Q_G$ which is accumulated at the gate can be expressed as follows:

$$\Delta Q_G = C_{G\text{-}S} \Delta V_{GE} + C_{G\text{-}p\text{-}ch} \Delta (V_{GE} - V_{pch})$$

Equation (4) gives: $\Delta(V_{GE} - V_{pch}) = -\beta \ (gm^{n\text{-}ch}/gm^{p\text{-}ch}) \Delta V_{GE}$. Therefore, the gate capacitance $C_G$ can be expressed with the following equation (5):

$$C_G = \Delta Q_G / \Delta V_{GE} = C_{G\text{-}S} - C_{G\text{-}p\text{-}ch} \cdot \beta \cdot gm^{n\text{-}ch}/gm^{p\text{-}ch} \quad (5)$$

The second article on the right side of the above equation has a negative value, which causes negative capacitance.

The knowledge relating to negative (differential) capacitance explained above has been discovered for the first time through research conducted by the present applicants and the like.

Next, the essence of the present invention, which is based upon this knowledge, will be explained.

FIG. 14 and FIG. 15 show the negative capacitance of FIG. 10 in schematic form. The gate capacitance $C_G$ is considered to be a parallel compound capacitance including a capacitance C2, comprising n-type base layer 3/gate insulating film 6 gate electrode 7, and a capacitance C1, comprising (n-type source layer 5·p-type base layer 4)/gate insulating film 6/gate electrode 7.

As FIG. 16 shows, the capacitance C1 has an almost constant value which is unrelated to the gate voltage $V_G$. As FIG. 17 shows, the capacitance C2 decreases in a step shape as the gate voltage $V_G$ rises. As can be supposed from FIG. 10, the ratio between positive capacitance C2$^+$ and negative capacitance C2$^-$ is approximately 2:1.

As FIG. 18 shows, the present invention eliminates negative capacitance C2$^-$ by actively increasing capacitance C1, thereby raising the bottom of the capacitance C2. More specifically, C1>C2$^{-}$=(½) C2$^+$. In other words, when the following equation (6) is satisfied, gate capacitance CG always has a zero or positive value, never a negative value.

$$\frac{C1}{C2^+ + C1} \geq \frac{1}{3} \quad (6)$$

Equation (6) can easily be realized by, for instance, designing a mask pattern using an area (corresponding to C2) having a MOS configuration, including an n-type base layer 3, and an area (corresponding to C1) having a MOS configuration, including an n-type source layer 5 and a p-type base layer 4. Furthermore, equation (6) can be realized not only in the areas having MOS configurations, but also, for instance, by setting the thickness and material (permittivity ε) of the gate insulating film used in the MOS configurations to correspond to the capacitances C1 and C2. Moreover, another phrase instead of "area having a MOS configuration" can be substituted in equation (6), provided that the substitution is equivalent. Or, "area of capacitance C2/total gate area=not more than ⅔" can be replaced by a different relationship.

The above knowledge, as well as the relation of the length of the n-type base layer 3 to the design parameters of the elements, have been confirmed by the method explained below. The length of the n-type base layer 3 (hereinafter N base length) referred to here corresponds to the distance covered by the n-type base layer 3 from the p-type emitter layer 1 to the bottom of the p-type base layer 4, the n-type base layer 3 being provided therebetween.

FIG. 19 is a graph illustrating a relationship between the length of the n-type base layer 3 and C1/(C2$^+$+C1) which was confirmed using four IGBTs. As FIG. 19 shows, when the length of the n-type base layer 3 is 100 μm, the C1/(C2$^+$+C1) value dropped from 0.33 to 0.2 (from ⅓ to ⅕). Thus it can be seen that the problem arises directly from the conventional notion that the gate length $L_G$ should be increased as the N base length increases due to the need to increase the number of carriers accumulating in the n-type base layer 3. In other words, the problem lies in the conventional method of design, wherein the length of the gate length $L_G$ is increased in order to stimulate the injection of electrons from the MOS channel, producing a low ON voltage. To achieve this, the C2$^+$ value is increased and the C1/(C2$^+$+C1) is lowered. But as a result, the C2$^-$ value also increases, facilitating the generation of negative gate capacitance Therefore, gate instability was investigated, using a noise pulse in the manner already described, for the two states shown in FIG. 19, namely an IGBT in which C1/(C2$^+$+C1)= 0.33 (the IGBT elements having N base length of approximately 63 μm, hereinafter referred to as IGBT elements A) and an IGBT in which C1/(C2$^+$+C1)=0.2 (the IGBT elements having N base length of approximately 100 μhereinafter referred to as IGBT elements B).

As FIG. 20 shows in detail, the two IGBT elements A1 and A2 are connected in parallel. Noise was applied into the gate of IGBT element A2 and the behaviour of the gate voltage was observed. The same test was performed using IGBT elements B1 and B2.

The results showed that when IGBT elements A1 and A2 were connected in parallel, the noise pulse caused a brief fluctuation in the gate voltages, but the gate voltages soon stabilized on the gate bias voltage (a voltage applied by means of a gate signal).

In contrast, as FIG. 21 shows, in the case of IGBT elements B1 and B2, the oscillations of the gate voltages following the application of noise did not stabilize and, actually increased. Moreover, since the noise pulse was applied to IGBT element B2, the gate voltage VG of the other IGBT element B1 oscillated widely. As a result, negative capacitance caused instability leading to oscillation between the IGBT elements B1 and B2, which are provided in parallel.

The above results show that when (C1/C2$^+$+C1)>0.33, there is not instability, but when (C1/C2$^+$+C1)>0.2, instability, such as oscillation and current nonuniformity, occurred. In view of such instability, the value of (C1/C2$^+$+ C1) must be greater than at least 0.2 (=⅕) and, more preferably, greater than 0.33 (=⅓).

Furthermore, when the N base length exceeds 100 μm, the value of (C1/C2$^+$+C1) falls to below approximately 0.2, as in the conventional design method. Therefore, the present invention is particularly effective for elements with an N base length exceeding 100 μm.

When the N base length exceeds 300 μm, the value of (C1/C2$^+$+C1) falls even further to less than approximately: 0.1 (=1/10). Therefore, in the case of elements having N base length exceeding 100 μm, the value must be raised to at least 0.2 (=⅕) in order to effectively correct the nonuniformity.

The above explanation referred to planar-type elements, but the research conducted by the present applicant has confirmed that similar negative capacitance occurs in the case of trench-type elements. However, the ratio of $C2^+:C2^-$ was found to be slightly different in the case of trench-type elements.

FIG. 22 is a diagram showing a configuration of a trench-type IEGT element without a gate bypass, FIG. 23, a diagram showing a configuration of a trench-type IEGT element with a gate bypass, and FIG. 24, a diagram showing the gate voltage dependency of a gate capacity in these two types of IEGT elements. In the present application, "bypass" denotes the omission of the n-type source layers 5.

In other words, instead of planar-type gate insulating films 6 and gate electrode 7 depicted in FIG. 22, the IEGT element TA, which does not have a bypass, comprises trenches dug in the surface of the n-type source layers 5 and extending through the p-type base layers 4 to a depth in the n-type base layer 3. Gate electrodes 7, which are provided on the p-type base layers 4 sandwiched between the n-type base layer 3 and the n-type source layers 5, are buried within the trenches and surrounded by gate insulating film 6 therein. These gate electrodes 7 are connected to a gate terminal which is not shown in the diagram.

In contrast, as FIG. 23 shows, the IEGT element TB differs from FIG. 22 in that it comprises p-type base layers 4 having n-type source layers 5, and p-type base layers 4 having no n-type source layers 5, these being arranged between the trenches alternately.

As FIG. 24 shows, the non-bypass IEGT element TA contains a slight portion where the gate capacitance has a negative value. However, the bypass IEGT element TB has a considerable negative gate capacitance $C_G$.

The changes in the gate capacitances $C_G$ of such trench-type elements are complicated, but it can be clearly seen that the ratio between $C2^+:C2^-$ becomes $C2^+:C2^-=5:1$ in the non-bypass configuration, and becomes $C2^+:C2^-=4:1$ in the bypass configuration.

Consequently, in a non-bypass configuration, the value of $C1/(C2^++C1)$ should preferably be no less than $\frac{1}{6}$. Similarly, in a bypass configuration, the value of $C1/(C2^++C1)$ should preferably be no less than $\frac{1}{5}$.

In FIG. 24, the gate voltage has its negative peak close to 4.5V. This negative peak has little influence on breakdown, since the negative peak occurs in an area of low current where the collector current has a small value, and can therefore be ignored.

Next, the method for controlling the semiconductor device based on research conducted by the present applicant will be explained.

As FIG. 25 and (a)–(b) in FIG. 26 show, the above research revealed that when the IGBT suffers a short circuit, the amount of charge accumulated at the gate is less than during normal operation. In other words, the state in which the charge accumulated at the gate has decreased can be viewed as evidence of a short circuit. Furthermore, when a short circuit has been detected in this way, the IGBT can be protected from the short circuit by lowering the gate voltage.

FIG. 27 shows a block diagram of a short-circuit protection circuit, which has been devised based on the above knowledge, wherein a charge counter is connected in series to a gate circuit of a main IGBT element M1.

In addition, a transistor Tr1 is connected between the gate circuit and earth.

A differential amplifier AM1 consults the gate voltage and determines whether or not the gate charge counted by the charge counter is lower than a predetermined value (the prohibited area of FIG. 25). When the differential amplifier AM1 has determined that the amount of charge is less than the predetermined value, the differential amplifier AM1 lowers the gate voltage.

The method for counting the amount of charge at the gate can also be similarly used for counting voltage and current at any given circuit.

Yet another method for controlling a semiconductor device will next be explained relating to dV/dt detecting. Here, the semiconductor device comprises a dV/dt detecting element which is electrically connected in parallel to a main switching element. Gate resistance is controlled in accordance with the detected result of this dV/dt detecting element.

Consequently, the main switching element can be turn OFF more quickly within a non-breakdown range. In addition, the amount of OFF loss can be reduced.

The measures used by the invention to achieve the object, based on the knowledge and essential points explained above, are as follows.

A first aspect of the invention provides a semiconductor device, comprising a base layer of the first conductivity type; an emitter layer of the second conductivity type, formed on a surface of the base layer of the first conductivity type; a collector electrode, formed on a surface of the emitter layer of the second conductivity type; a base layer of the second conductivity type, formed in a surface of the base layer of the first conductivity type which is opposite to the emitter layer of the second conductivity type; a source layer of the first conductivity type, formed in a surface of the base layer of the second conductivity type; an emitter electrode, formed on the source layer of the first conductivity type and the base layer of the second conductivity type; and a gate electrode, contacting the source layer of the first conductivity type, the base layer of the second conductivity type and the base layer of the first conductivity type, with a gate insulating film interposed therebetween; wherein when a voltage is applied between the collector electrode and the emitter electrode, capacitance of the gate electrode is always a positive value or zero.

According to a second aspect of the semiconductor device of the invention, when the flow of current between the collector electrode and the emitter electrode is interrupted, the minimum value of the capacitance is not less than a third of the maximum value of the capacitance.

According to a third aspect, the area of a portion of the gate electrode which contacts the base layer of the first conductivity type, with the gate insulating film therebetween, is not more than two thirds of the whole of the area of the gate electrode.

Moreover, according to a fourth aspect, the length of the base layer of the first conductivity type is not less than 100 μm.

According to a fifth aspect, the semiconductor device of the invention comprises a base layer of the first conductivity type; an emitter layer of the second conductivity type, formed on a surface of the base layer of the first conductivity type; a collector electrode, formed on a surface of the emitter layer of the second conductivity type; a base layer of the second conductivity type, formed in a surface of the base layer of the first conductivity type which is opposite to the emitter layer of the second conductivity type; a source layer of the first conductivity type, formed in a surface of the base layer of the second conductivity type; an emitter electrode, formed on the source layer of the first conductivity type and the base layer of the second conductivity type; a gate electrode, buried inside a first trench with a gate insulating film interposed therebetween, the first trench being provided extending from a surface of the source layer of the first conductivity type, through the base layer of the second conductivity type, to a depth within the base layer of the first conductivity type; and a buried electrode, buried inside a second trench with a gate insulating film interposed therebetween, the second trench being provided extending from a surface of the base layer of the second conductivity type to a depth within the base layer of the first conductivity type; wherein the buried electrode and the emitter electrode are electrically connected and substantially have a same potential.

According to a sixth aspect, the relation between the buried electrode and the emitter electrode is altered, so that the buried electrode has a fixed potential which is lower than the potential of the emitter electrode.

Next, according to a seventh aspect of the invention, a method for controlling a semiconductor device, having two main electrodes and a control electrode which controls a current flowing between the main electrodes, comprises steps of: detecting an amount of charge accumulated at the control electrode based on a voltage of the control electrode; and controlling a voltage applied to the control electrode and/or current flow to the control electrode based on a charge amount detected by the detecting.

Furthermore, according to an eight aspect, when the amount of charge has a negative value, the applied voltage and/or the current flow is/are lowered by the controlling.

Moreover, according to a ninth aspect, a method for controlling a semiconductor device, having two main electrodes and a control electrode which controls a current flowing between the main electrodes, comprises steps of detecting current, which crosses through the control electrode, before and after the current crosses; and controlling a voltage applied to the control electrode and/or current flow to the control electrode based on a difference between current detected before crossing and current detected after crossing.

Furthermore, according to a tenth aspect, the step of controlling comprises: reducing a voltage applied to the control electrode and/or current flow to the control electrode when an integral of the difference has a negative value.

Moreover, according to an eleventh aspect, the semiconductor device comprises a switching element, comprising a first high voltage side main electrode, a low voltage side main electrode and a gate electrode; an electrode for sensing, comprising a second high voltage side main electrode, which is joined with the first high voltage side main electrode, and an electrode for detecting potential, the electrode for detecting potential formed on a substrate surface on a side of the low voltage side main electrode and electrically connected, via a resistance component, to the low voltage side main electrode; a gate resistance controller for controlling the value of a gate resistance between the gate electrode and a gate driver based on a potential of the electrode for detecting potential; wherein when the switching element is turned OFF, the gate controller detects as voltage boost rate dV/dt, by means of the electrode for detecting potential, and raises the value of the gate resistance, thereby restricting the voltage boost rate dV/dt.

By instituting the means described above, in the first aspect of the invention, when a voltage is applied between the collector electrode and the emitter electrode, the resistance of the gate electrode is always a positive value or zero. By eliminating negative differential capacitance at high collector voltage in this way, the gate voltage can be stabilized and current nonuniformity and oscillation and the like can be prevented, even at high voltage and high current. Consequently, the device can be protected from breakdown and reliability can be improved.

In the second aspect of the invention, when the flow of current between the collector electrode and the emitter electrode is interrupted, the minimum value of the capacitance is not less than a third of the maximum value of the capacitance. Consequently, the effects of the first aspect can be more easily and reliably obtained.

Moreover, in the third aspect of the invention, the area of the portion of the gate electrode which contacts the base layer of the first conductivity type, with the gate insulating film interposed in between, is not more than two thirds of the whole of the area of the gate electrode. Consequently, the effects of the first aspect can be even more easily and reliably obtained.

Furthermore, in the fourth aspect of the invention, since the length of the base layer of the first conductivity type is not less than 100 $\mu$m, the effects of the third aspect can be achieved even in a semiconductor device operating at a dielectric withstanding voltage greater than, for instance, approximately 1200V.

In the fifth aspect of the invention, further provided is a buried electrode, which has the same configuration as the gate electrode but is not wired to the gate circuit (namely, an ineffective gate electrode). The buried electrode is fixed at the same potential as the emitter electrode, thereby enabling negative charge generated at the ineffective gate to be discharged, preventing any effects caused by the negative charge.

Further, in the sixth aspect of the invention, the buried electrode has a fixed potential which is lower than the potential of the emitter electrode. Consequently, it is possible to reduce the amount of recombination on the trench insulating film interface of the ineffective gate electrode, increase the accumulated carriers in the first conductive base payer, and thereby reduce the negative gate capacitance.

Moreover, in the seventh and eighth aspects of the invention, the amount of charge at a control electrode is detected, and when the charge amount is found to have a negative value, this is regarded as indicating a short circuit. Then, the applied voltage and/or the current flow to the control electrode is/are lowered, thereby protecting the semiconductor device from the short circuit.

In the ninth and tenth aspects of the invention, current which crosses through the control electrode, is detected before and after crossing, and the voltage applied to the control electrode and/or current flow to the control electrode is/are reduced when the integral of the difference between the currents detected has a negative value, thereby protecting the semiconductor device from the short circuit.

Finally, in the eleventh aspect of the invention, gate resistance is small during normal ON, but at turn OFF, the voltage boost rate dV/dt is detected and the gate resistance is charged to large. Consequently, breakdown due to high dV/dt when the main switching element is turned OFF can be prevented. In addition, turn OFF can be performed more quickly with reduced OFF loss.

Additional objects and advantages of the present invention will be set forth in the description which follows, and in part will be obvious from the description, or may be learned by practice of the present invention.

The objects and advantages of the present invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of invention.

FIG. 68 is a diagram showing a cross-sectional view of a configuration of a dV/dt detecting portion used in a semiconductor device according to a twenty-second embodiment of the invention;

FIG. 69 is a diagram showing a cross-sectional view of a configuration of a dV/dt detecting portion used in a semiconductor device according to a twenty-third embodiment of the invention; and FIG. 70 is a diagram showing a cross-sectional view of a configuration of a dV/dt detecting portion used in a semiconductor device according to a twenty-fourth embodiment of the invention.

DETAILED DESCRIPTION OF THE INVENTION

There will be detailed below the preferred embodiments of the present invention with reference to the accompanying drawings.

FIRST EMBODIMENT

Figure 28:
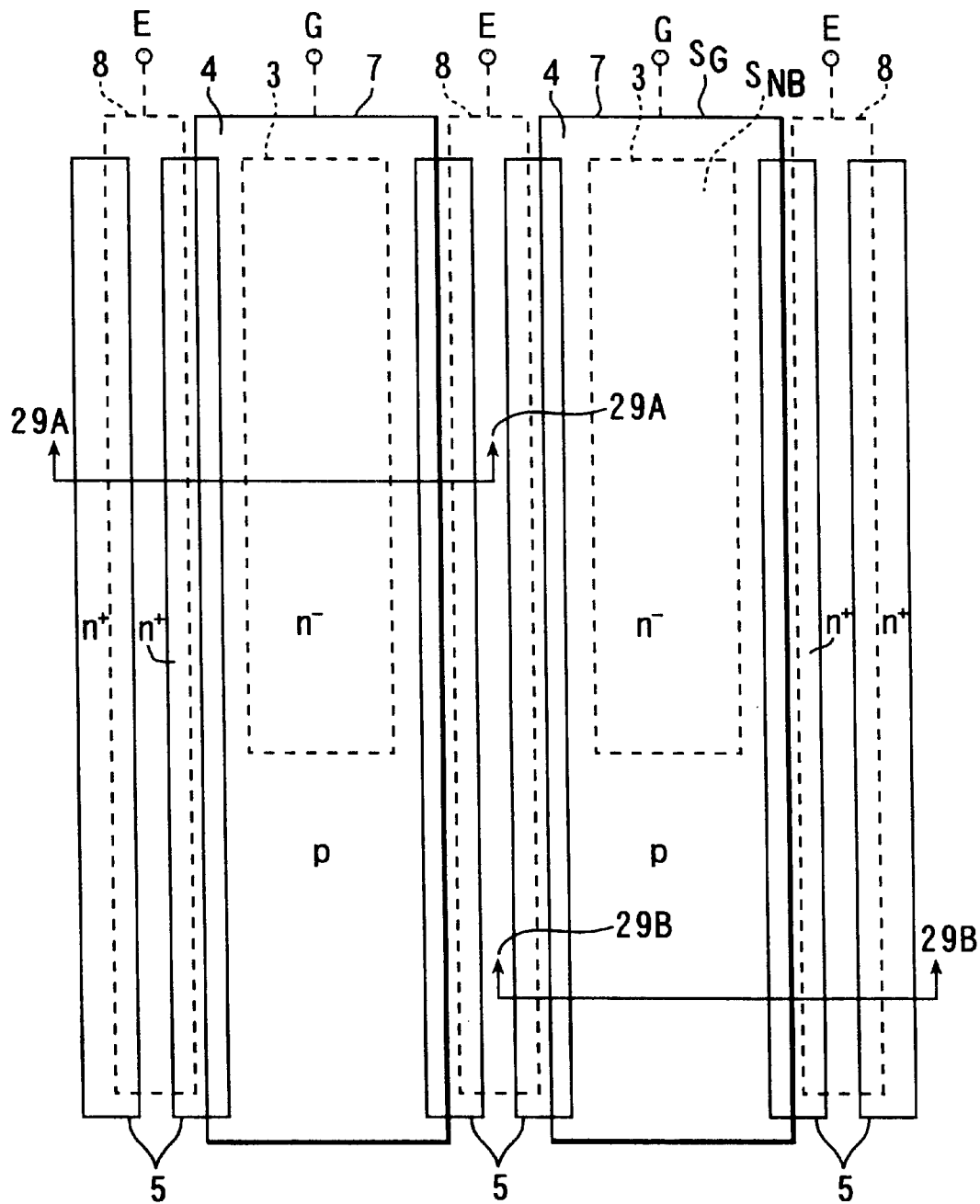
FIG. 28 is a diagram showing a front view of a configuration of an IGBT according to a first embodiment of the invention.
Figure 29:
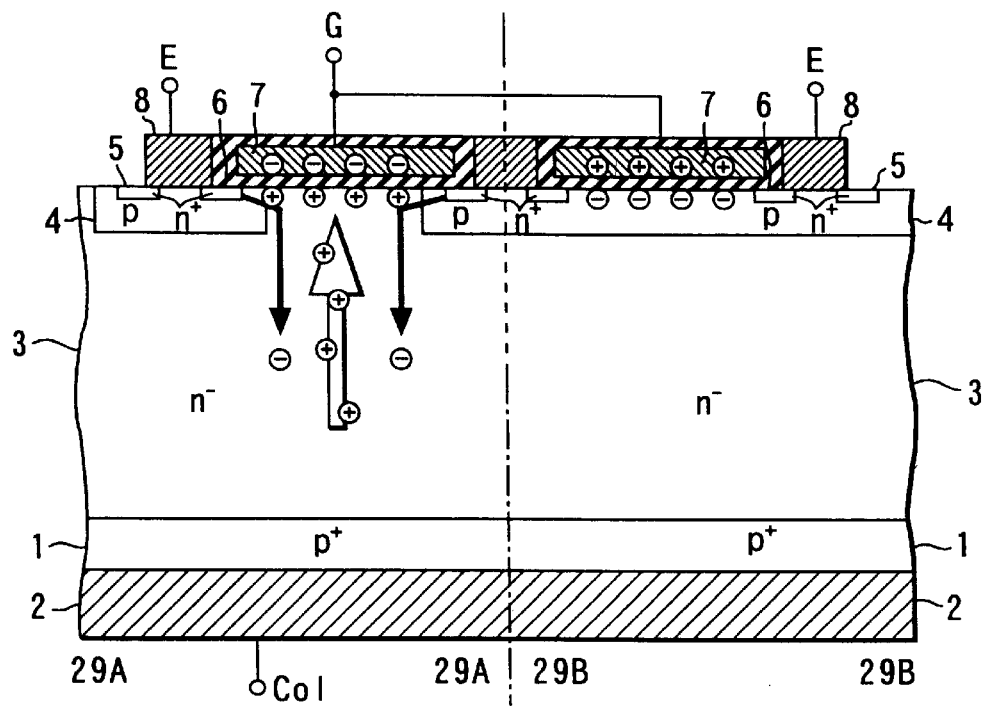
FIG. 29 is a diagram showing cross-sectional views taken along the lines 29A—29A and 29B—29B of FIG. 28.

FIG. 28 shows a front view of a configuration of an IGBT according to a first embodiment of the present invention, and FIG. 29, cross-sectional views taken along the lines 29A—29A and 29B—29B of FIG. 28. Like members are designated by like reference characters and only differing members will be explained, here and in the subsequent embodiments, to avoid repetition.

The semiconductor device of the present embodiment stabilizes gate voltage by eliminating negative capacitance from the gate. As FIG. 28 and FIG. 29 show, p-type base layers 4 are formed on n-type base layers 3 so as to partially extend across the widths of the gate insulating films 6. Therefore, the area of the interfaces where the n-type base layers 3 connect with the gate insulating films 6 is less than in the conventional device.

More concretely, the configuration is characterised in that the ratio between the area $S_G$ of the interface between the gate electrodes 7 and the gate insulating films 6 (namely, the area of the gate electrodes 7) and the area $S_{NB}$ of the portions of the n-type base layers 3 which are overlapped by the gate electrodes 7, with the gate insulating films 6 interposed in between, is stipulated by the following equation (7):

$$\frac{S_{NB}}{S_G} \leq \frac{2}{3} \tag{7}$$

Equation (7) denotes a relation equivalent to that denoted by equation (6) above. That is, according to equation (7), the stipulation of equation (6), that the capacitance C1 is not less than ⅓ of the total gate capacitance, is expressed in reverse. In other words, the area $S_{NB}$ of the capacitance C2 is stipulated to be no greater than ⅔ of the total gate capacitance.

Furthermore, the IGBT is designed so that those parts which have partially different thicknesses from the thickness $t_{OX}$ of the gate insulating films 6, such as terrace gates, satisfy the following equation (8):

$$\frac{\int_{\text{n-type base interface}} \frac{1}{t_{OX}} ds}{\int_{\text{all gate regions}} \frac{1}{t_{OX}} ds} \leq \frac{2}{3} \tag{8}$$

This IGBT operation will next be explained.

As explained above, when the IGBT is turned ON, at high collector voltage, positive holes injected from the p-type emitter layer 1 are accelerated by the high electromagnetic field in the n-type base layer 3 and arrive at the interface between the n-type base layer 3 and the gate insulating film 6.

At high collector voltage, the potential of the n-type base layer 3 is higher than the voltage of the gate. As a result, a positive hole channel (accumulation layer) is formed at the interface with the n-type base layer 3.

The positive charge of this positive hole channel causes negative charge within the gate electrode 7 along the cross-section 29A—29A.

However, as the cross-section 29B—29B shows, the IGBT of the present invention differs from the conventional device in that an n-channel is formed at the interface with the gate insulating film 6 within the p-type base layer 4. This n-channel cancels the negative charge within the gate electrode 7 and causes positive charge at the gate electrode 7. Consequently, no negative capacitance is generated. And, since positive holes are discharged from the emitter electrode 8 at high collector voltage, it is even more difficult for negative capacitance to occur, ensuring gate voltage stability.

According to the first embodiment described above, when voltage has been applied between the collectors 1 and the emitter electrodes 8, the capacitance at the gate electrodes 7 is either positive or zero, thereby eliminating negative differential gate capacitance at high collector voltage. This enables the gate voltage to be stabilized, prevents nonuniform current and oscillation and the like, and consequently improves reliability by protecting the device from breakdown even when operating at high voltage and high current.

Furthermore, in the case where the flow of current between the collectors 1 and the emitter electrodes 8 has been interrupted, since the area $S_{NB}$ of the portion where the gate insulating films 6 contact the n-type base layers 3 has been restricted to no greater than ⅔ of the total area $S_G$ of the gate electrodes 7 in order to keep the minimum capacitance at the gate electrodes 7 at a value greater than ⅓ of the maximum total capacitance, the above effect can be achieved easily and reliably.

Furthermore, since the length of the n-type base layers 3 is not less than 100 μm, the above effect can be achieved in an IGBT operating at a dielectric withstanding voltage greater than 1200V.

SECOND EMBODIMENT

An IGBT according to a second embodiment of the present invention will next be explained.

Figure 30:
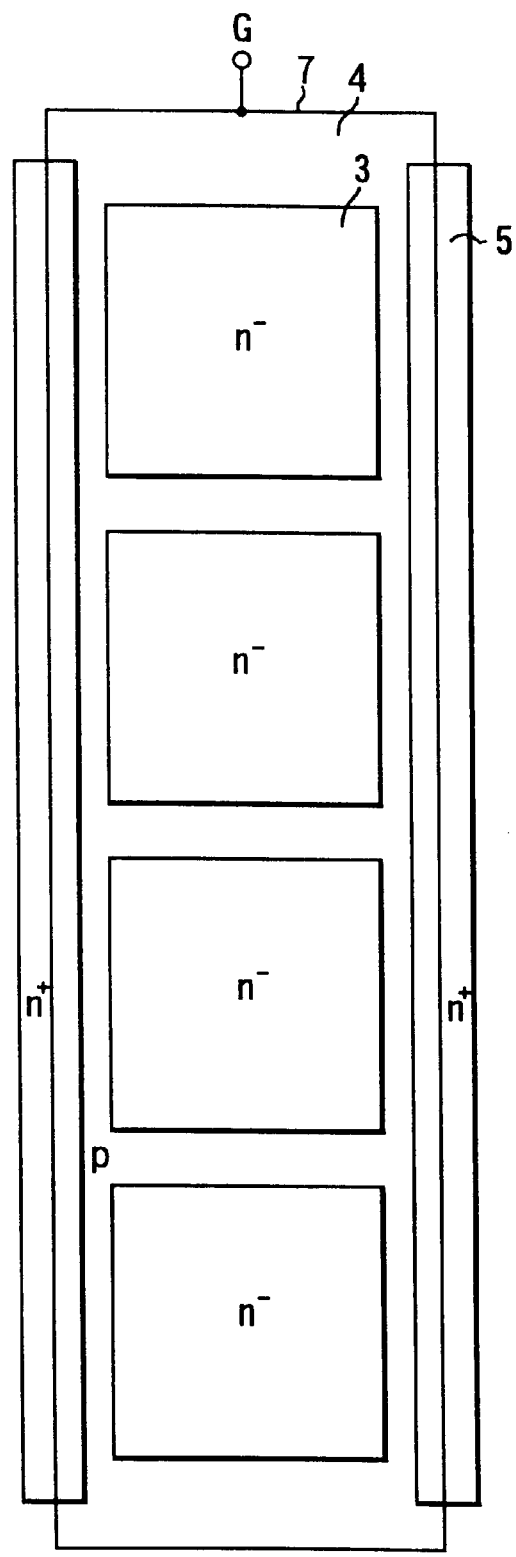
FIG. 30 is a diagram showing a front view of a configuration of an IGBT according to a second embodiment of the invention.

FIG. 30 is a front view of a configuration of the IGBT. The second embodiment has a different configuration from the first embodiment, in that the shape of the p-type base layers 4 when viewed from the front has been altered. As FIG. 30 clearly shows, the p-type base layer 4, which is formed in the n-type base layer 3 across the entire width of the gate insulating film 6, is ladder-shaped.

The above configuration achieves the same effects as the first embodiment, while also offering improved gate voltage stability due to the altered pattern of the p-type base layer 4, which is more uniform than in the configuration depicted in FIG. 28.

THIRD EMBODIMENT

An IGBT according to a third embodiment of the present invention will next be explained.

Figure 31:
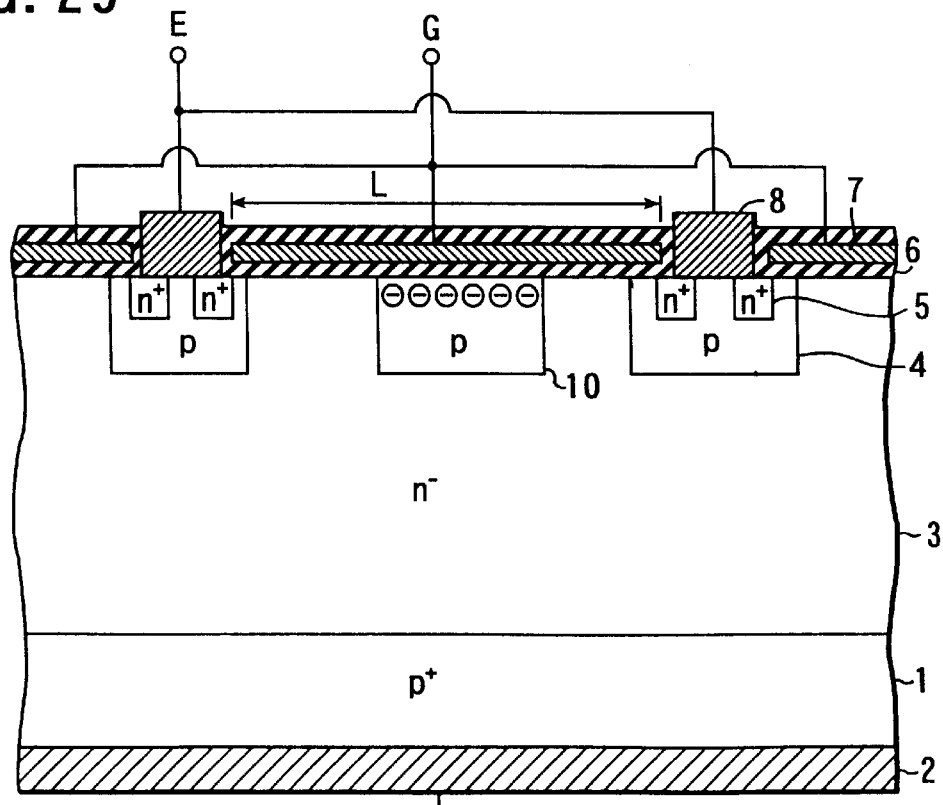
FIG. 31 is a diagram showing a front view of a configuration of an IGBT according to a third embodiment of the invention.

FIG. 31 is a cross-sectional view showing the configuration of the IGBT. In this embodiment, the p-type base layers 4 have a different configuration from the first embodiment. As FIG. 31 clearly shows, a p-type layer 10 is selectively formed on the surface of the n-type base layer 3 directly below the center of gate electrode 7.

The p-type layer 10 is connected to the p-type base layers 4 directly below the emitter electrode 8 (this connection is not depicted in the diagram).

In the above configuration, the potential of the p-type layer 10 is fixed by the emitter electrode 8. The surface of the p-type layer 10 is thus maintained at a low voltage, even when a high collector voltage is applied.

When the gate voltage is positive, an inversion layer is formed on the surface of the p-type layer 10. Consequently, the gate voltage can be maintained at a positive value, as in the first embodiment.

The configuration described above is particularly effective in an IGBT operating at a dielectric withstanding voltage of more than 2 kV. For instance, in the case of a dielectric withstanding voltage IGBT, in the ON state, the gate width L should preferably be not less than 60 μm so as to achieve low ON resistance and carrier accumulation. In such a case, the width of the p-type layer 10 should not be less than ⅓ (for instance, 20 μm) of the gate width L.

According to the above configuration, a wide gate width L enables the p-type layer 10 to be joined in a single piece with the p-type base layers 4, and low ON resistance can be obtained.

FOURTH EMBODIMENT

A semiconductor device according to a fourth embodiment of the present invention will next be explained.

Figure 32:
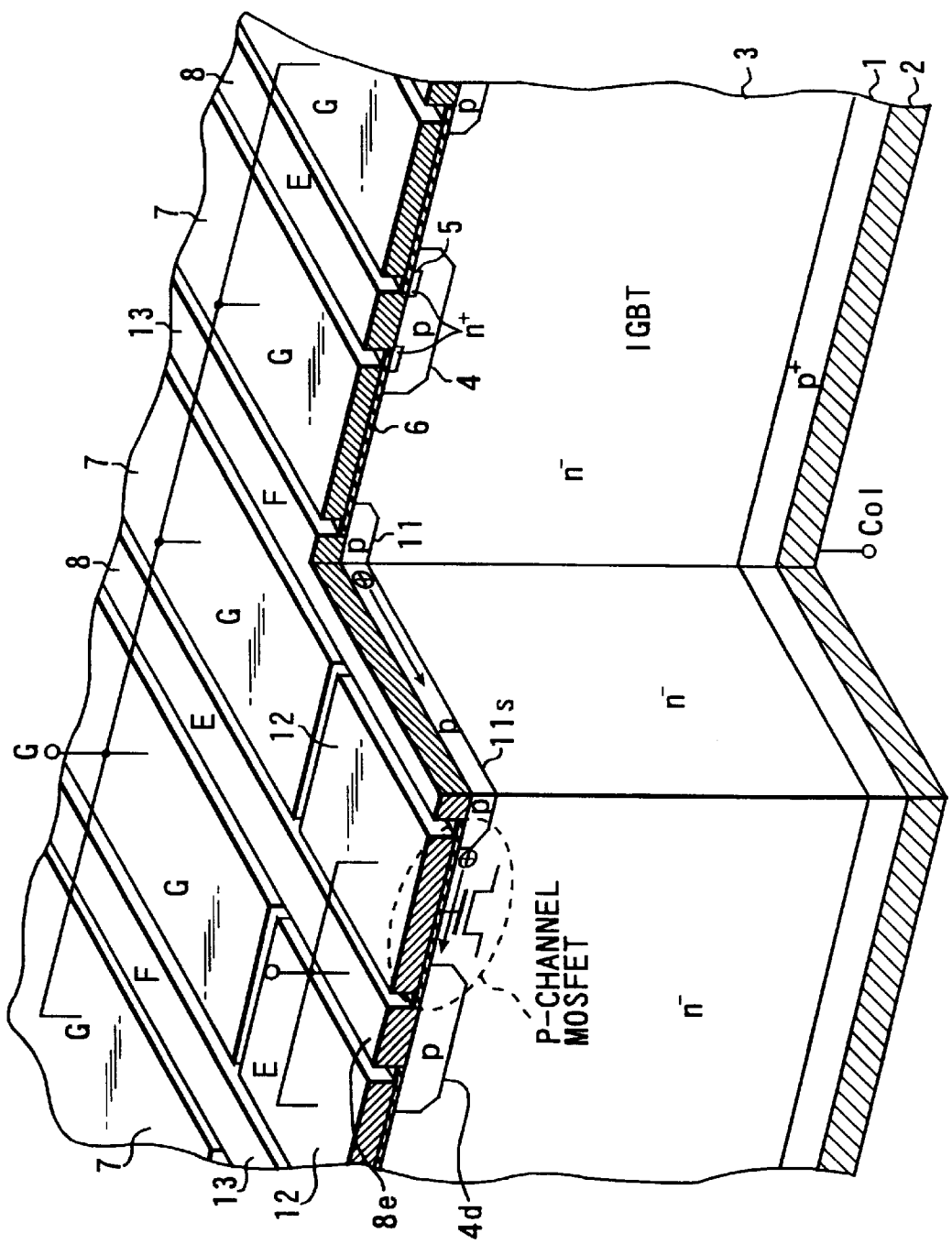
FIG. 32 a diagram showing a cross-sectional perspective view of a configuration of a semiconductor device according to a fourth embodiment of the invention.
Figure 33:
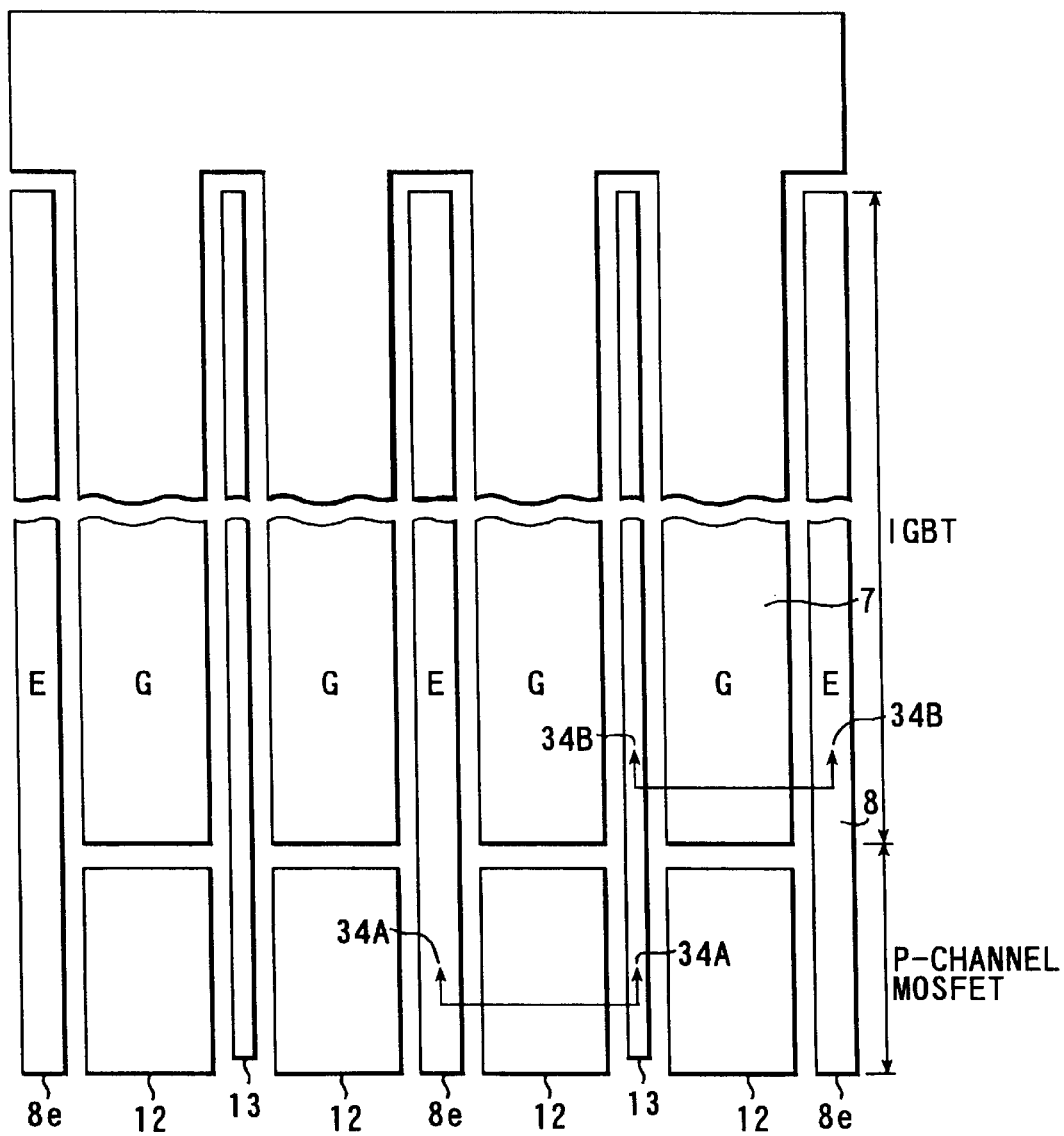
FIG. 33 is a diagram showing a front view of a configuration of the semiconductor device of the fourth embodiment.
Figure 34:
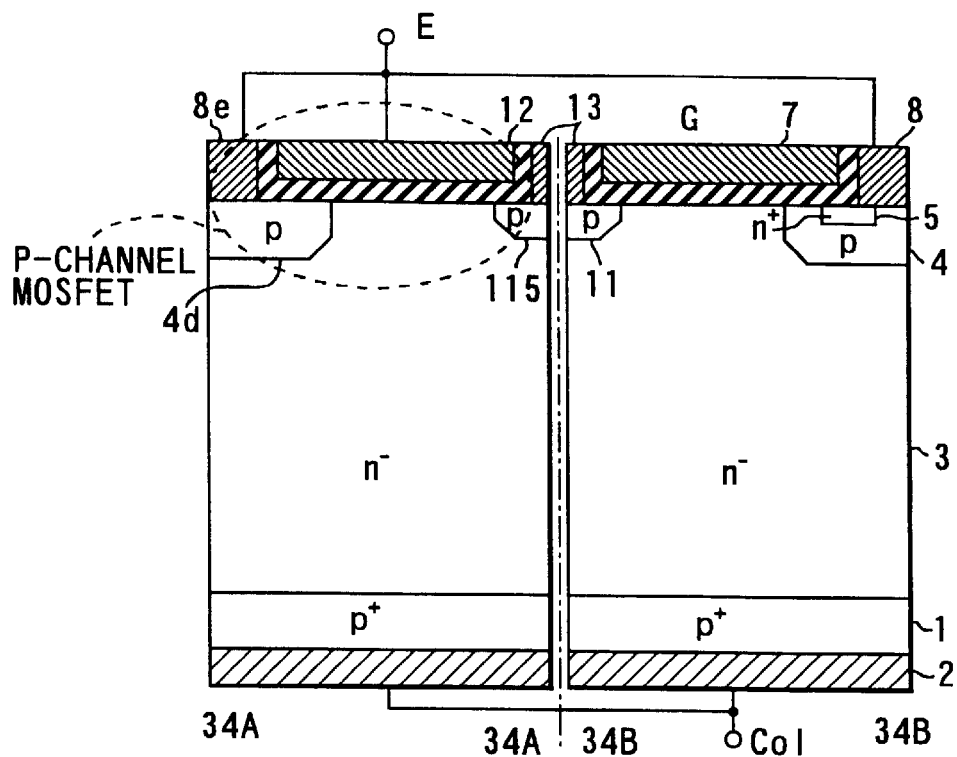
FIG. 34 is a diagram showing cross-sectional views taken along the lines 34A—34A and 34-34B of FIG. 33.

FIG. 32 is a perspective cross-sectional view of a configuration of a semiconductor device according to a fourth embodiment of the present invention, FIG. 33, a front view of the configuration of the semiconductor device, and FIG. 34, cross-sectional views taken along the lines 34A—34A and 34B—34B of FIG. 33.

The present embodiment is a modification of the configuration of the first embodiment, in which positive holes on the interface with the gate insulating film 6 in the n-type base layer 3 are actively discharged. As FIG. 32–FIG. 34 show in detail, an IGBT region, wherein a p-type layer 11 is selectively diffused into the surface of the n-type base layer 3, and a p-channel region MOSFET, which has the p-type layer 11 as its source, are formed within a single chip.

The p-channel MOSFET comprises a p-type layer source layer 11s, formed by extending the p-type layer 11 of the IGBT region along the length of the surface of the n-type base layer 3, a p-type drain layer 4d, formed by extending the IGBT p-type base layer 4 along the length of the surface of the n-type base layer 3, and an emitter electrode 8e, formed by extending the IGBT emitter electrode 8 along the top of the p-type base layer 4 and a long the top of the n-type source layer 5, the emitter electrode 8e being selectively provided above the p-type drain layer 4d.

The p-channel MOSFET further comprises a gate 12, provided above a part of the p-type drain layer 4d, a part of the p-type source layer 1a and part of the n-type base layer 3, with the gate insulating film 6 in between. The gates 12 are electrically connected to the emitter electrodes 8e and are electrically insulated from the IGBT gate electrodes 7.

And, floating gates 13 are provided above the p-type source layer 11s extending along the length thereof. The floating gates ensure that the potentials of the p-type layers 11s and 11 are uniform from the p-channel MOSFET region to the IGBT region. All the electrodes 7, 8, 8e and 12 of the p-channel MOSFET and the IGBT are insulated and floating.

Next, the operation of this type of semiconductor device will be explained.

As explained above, when the IGBT is turned ON, at high collector voltage, positive holes injected from the p-type emitter layer 1 are accelerated by the high electromagnetic field in the n-type base layer 3 and arrive at the interface between the n-type base layer 3 and the gate insulating film 6.

At high collector voltage, the potential of the n-type base layers 3 is higher than the voltage of the gates. As a result, positive hole channels (accumulation layers) are formed at the interfaces with the n-type base layers 3. Now, the p-type layer 11 of the IGBT is electrically floating and therefore does not prevent carrier accumulation at the interface between the n-type base layer 3 and the gate insulating film 6. As a result, there is no boost of ON voltage in the present embodiment.

When a high collector voltage is applied, the potential of the n-type base layer 3 is higher than the gate voltage. Consequently, a positive hole channel (accumulation layer) is formed at the interface with the n-type base layer 3.

In other words, when a high collector voltage is applied, the p-channel causes a short circuit between the p-type source layer 11s and the p-type drain layer 4d of the p-channel MOSFET. Moreover, the potentials of the p-type layer 11 and the p-type source layer 11a are boosted by several volts.

Consequently, the current of positive holes from the p-type layer 11 of the IGBT passes through the p-type source layer 11a and the p-channel to the p-type drain layer 4d, and the potential of the p-type source layer 11a is fixed at the p-channel MOSFET Vth (e.g. roughly 4V).

Therefore, the positive holes on the surface of the n-type base layer 3 of the IGBT can be discharged form the p-type layer 11, no negative gate capacitance is generated and the stability of the gate voltage can be improved. Here, the C capacitance complies to equation 11 which is explained later.

FIFTH EMBODIMENT

Next, an IGBT according to a fifth embodiment of the present invention will be explained.

Figure 1:
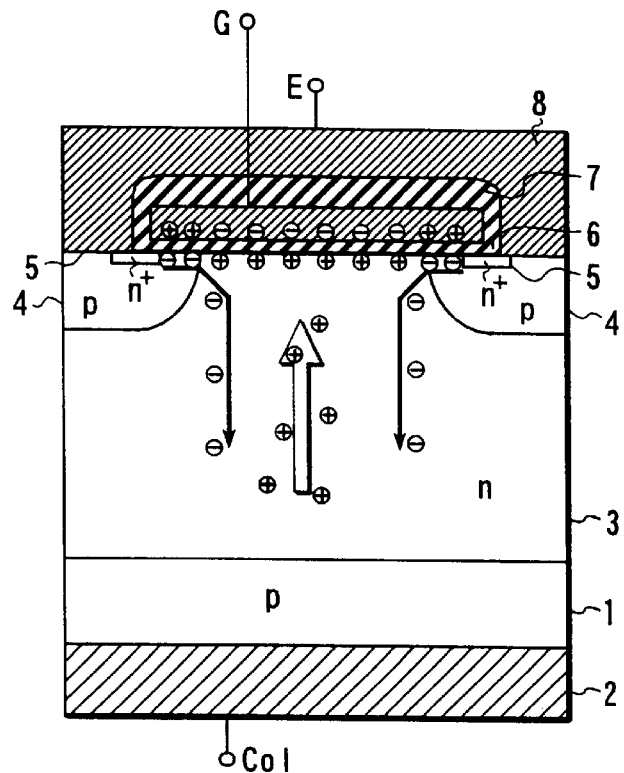
FIG. 1 is a diagram showing a cross-sectional view of a configuration of a conventional IGBT.
Figure 2:
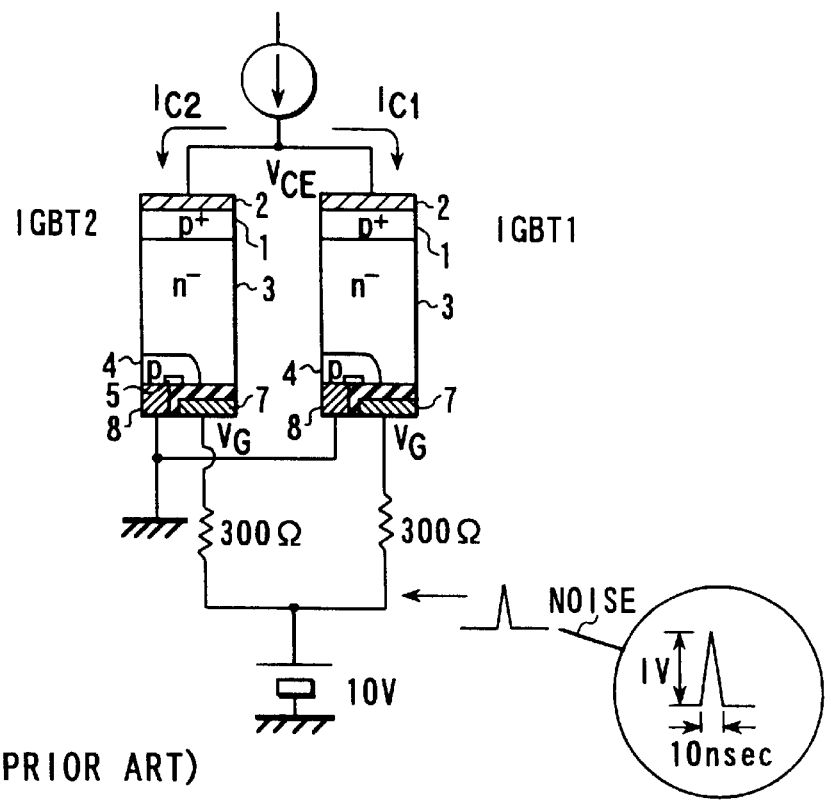
FIG. 2 is a diagram showing a schematic view of an IGBT illustrating conventional problems.
Figure 35:
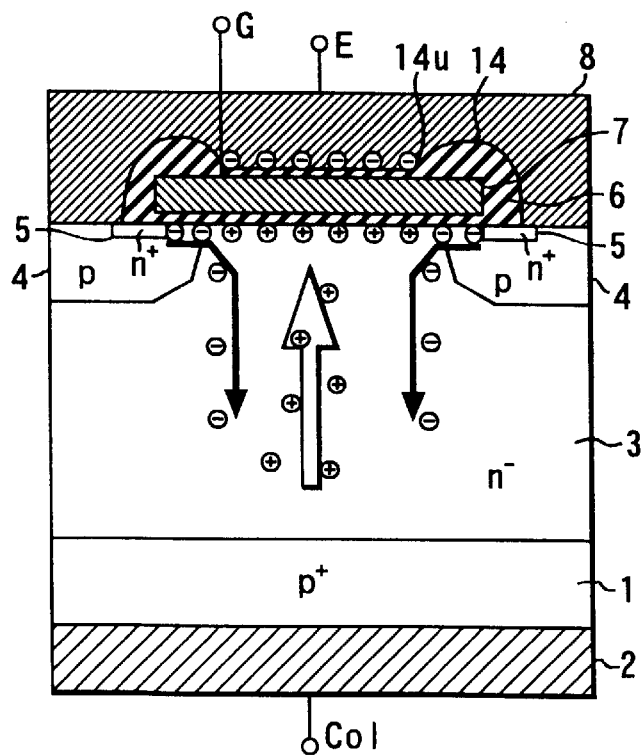
FIG. 35 is a cross-sectional view of a configuration of a semiconductor device according to a fifth embodiment of the invention.

FIG. 35 is a cross-sectional view of the configuration of the IGBT. The parts which differ from FIG. 1 will be explained. This embodiment differs from the method for raising capacitance C1 defined by equation (6) in that, in the present embodiment, emitter potential is used to prevents negative gate capacitance. As FIG. 35 shows in detail, the thickness of an insulating film 14u, which is formed above the gate electrodes 7 opposite to the n-type base layer 3, with the gate insulating film 6 and the gate electrode 7 provided in between, is thinner than the other parts of the insulating film 14 on the gate electrode 7. The emitters of all the IGBTs are connected together along the tops of the insulating films 14 and 14u above the gate electrodes 7.

In this configuration, the negative potential of the emitter electrode 8, transferred through the thin layer of the insulating film 14u, causes a position charge in the gate electrode 7, enabling negative capacitance of the gate to be prevented. Therefore, the same effects as the first and second embodiments can be achieved with no consequent reduction in the effective regions.

SIXTH EMBODIMENT

An IGBT package according to a sixth embodiment of the present invention will next be explained.

Figure 36:
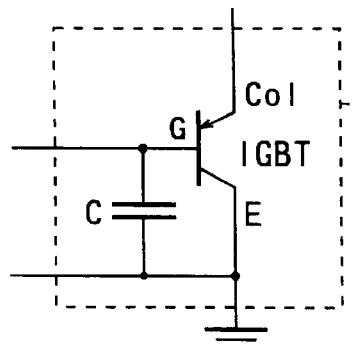
FIG. 36 is a circuit diagram showing a configuration of an IGBT package according to a sixth embodiment of the invention.

FIG. 36 is a circuit diagram illustrating the configuration of the IGBT package. The IGBT package 21 shown is accomplished by setting the capacitance of the IGBT of the present invention during packaging, capacitance C being connected between a gate G and an emitter E within the IGBT package.

Therefore, it is possible to increase the capacitance C1 and prevent negative capacitance at the gate.

Figure 37:
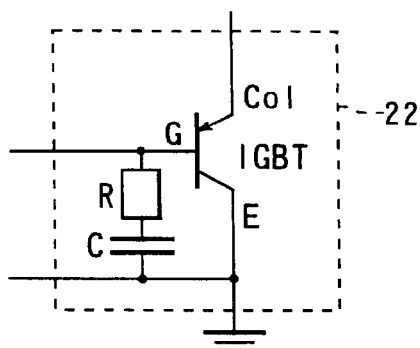
FIG. 37 is a circuit diagram showing a modified configuration of an IGBT package according to a sixth embodiment of the invention.

As FIG. 37 shows, as an addition to the configuration shown in FIG. 36, a resistance R can be connected, between the gate G and the emitter E, in series to the capacitance C. Now, in addition to the effect achieved by increasing the capacitance C1 as described above, the resistance R prevents oscilltaion due to inductance in the connecting wires, further improving the stability.

SEVENTH EMBODIMENT

An IGBT package according to a seventh embodiment of the present invention will next be explained.

Figure 38:
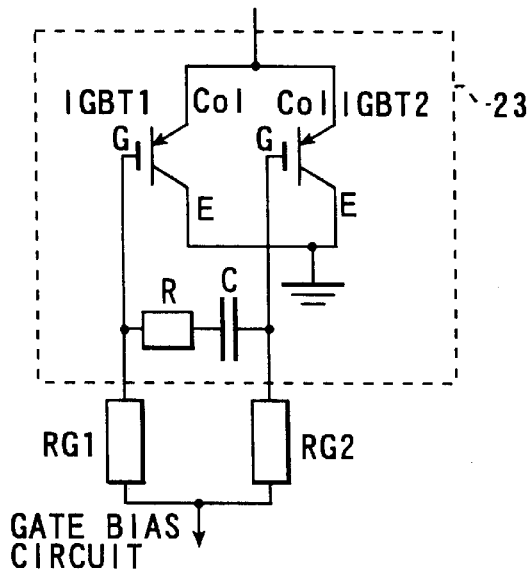
FIG. 38 is a circuit diagram showing a configuration of an IGBT package according to a seventh embodiment of the invention.

FIG. 38 is a circuit diagram illustrating the configuration of an IGBT package 23, in which a capacitance C and a resistance R have been connected in series between the gates of two IGBTs (regions or chips). The gates G can be connected to a gate-bias circuit, which is not depicted in the diagram, via separate resistances RG1 and RG2.

In contrast to the capacitances $C2^+$, C1 of the conventional IGBT, the capacitance C, which is inserted between the gates G, satisfies the following equation (9):

$$\frac{C1+2C}{C1+C2^++2C} \geqq \frac{1}{3} \tag{9}$$

Figure 3:
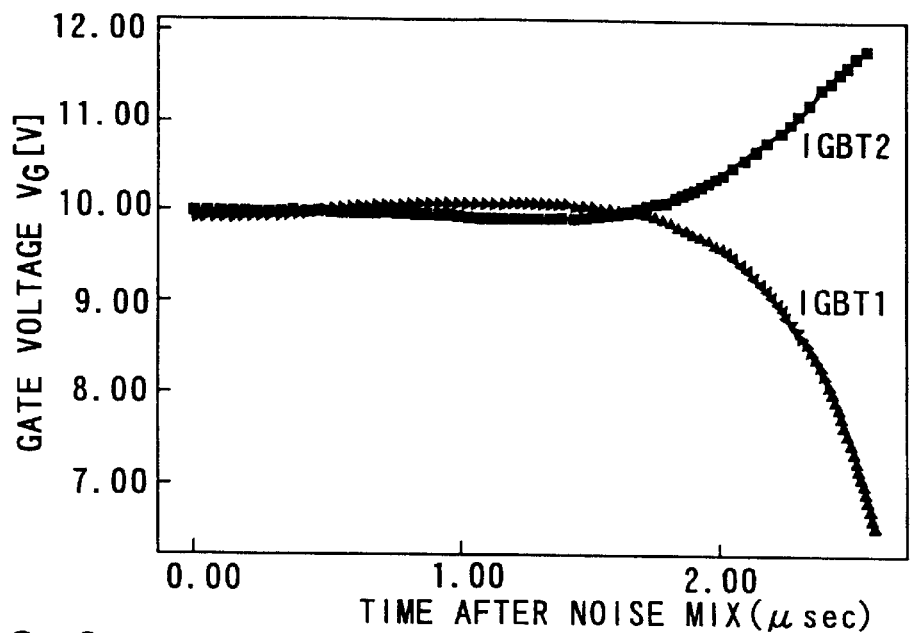
FIG. 3 is a diagram showing a view of the conventional behaviour of a gate voltage when noise becomes mixed therein.
Figure 5:
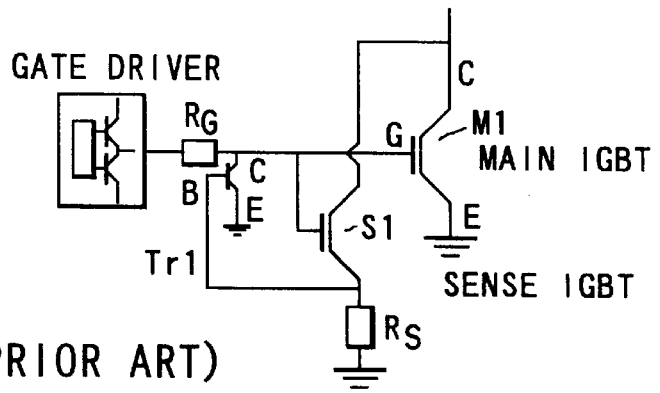
FIG. 5 is a circuit diagram illustrating a short-circuit protection method of a conventional semiconductor device.
Figure 6:
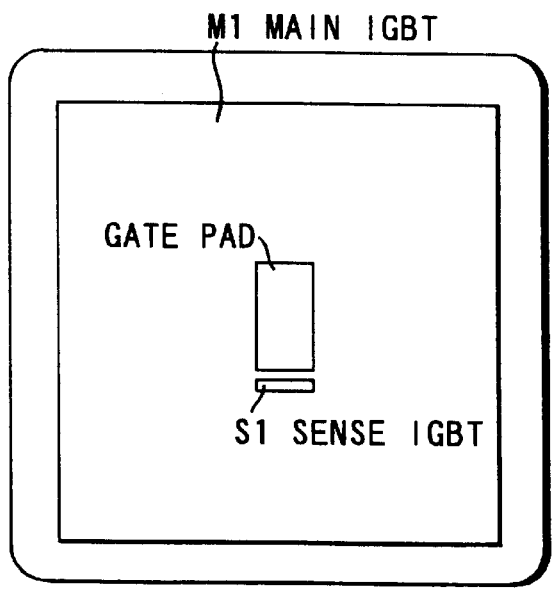
FIG. 6 is a diagram showing a front view of the outside of a conventional semiconductor device.
Figure 4:
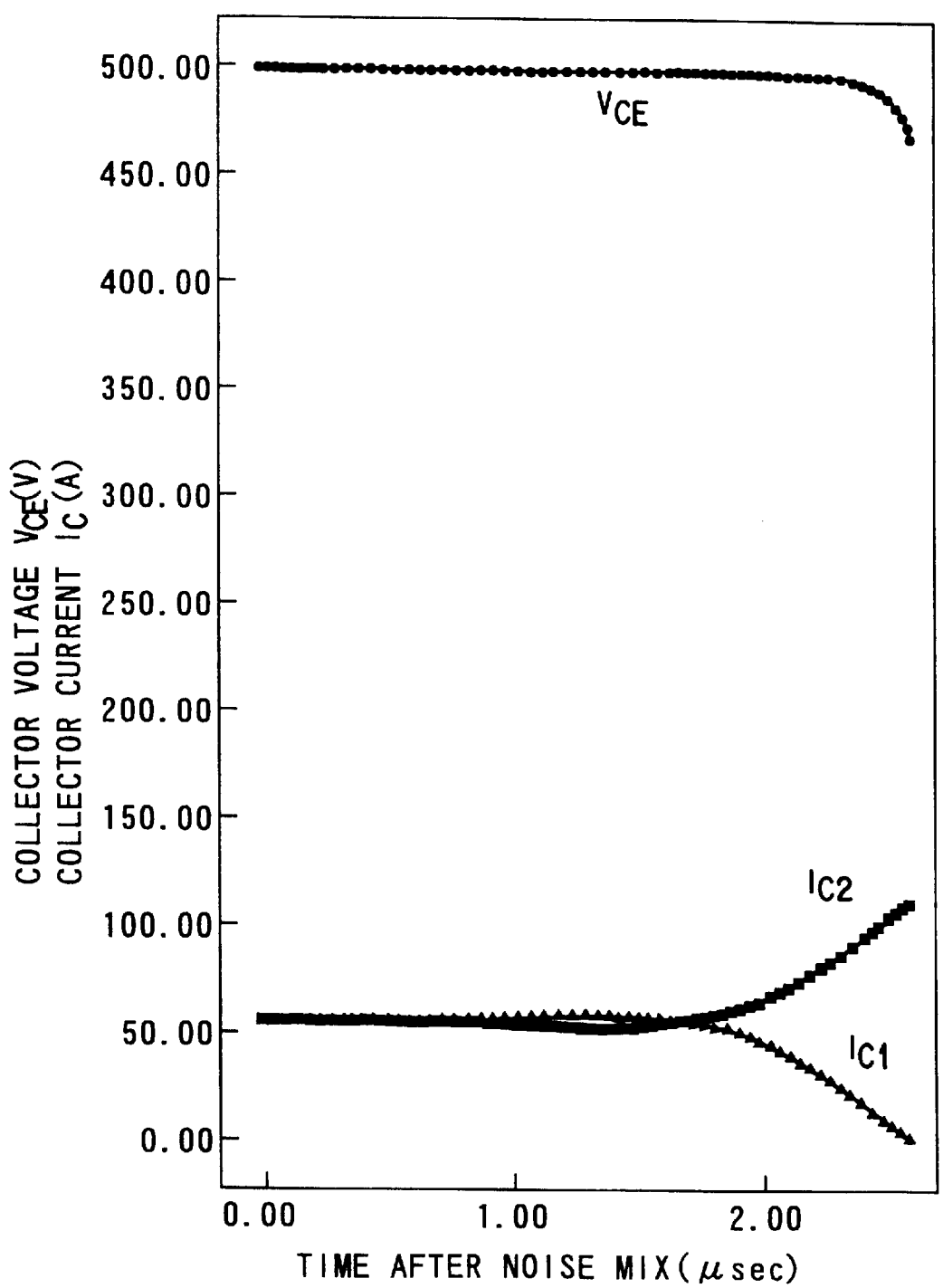
FIG. 4 is a diagram showing a view of the conventional behaviour of a collector voltage and a collector current when noise becomes mixed.

As expressed in equation (9), the capacitance C inserted between the gates G has half the value of the capacitance in the sixth embodiment. This is because inserting the capacitance C between the gates G has twice the effect on the gate voltages $V_G$ as that when the capacitance is inserted between the gate and the emitter, due to the fact that the gate voltages $V_G$ of two IGBTs move up and down symmetrically, as was demonstrated in FIG. 3.

The above configuration prevents nonuniformity in the current when IGBTs are connected in parallel.

Figure 39:
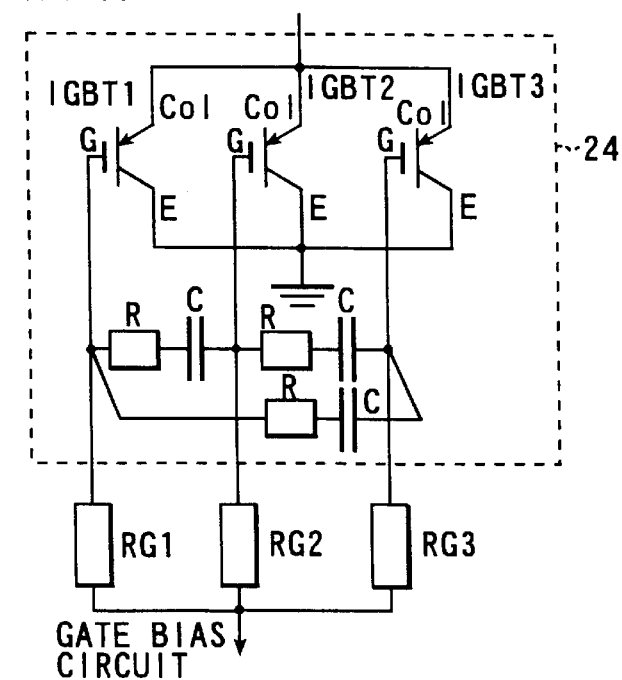
FIG. 39 is a circuit diagram showing a modified configuration of an IGBT package according to the seventh embodiment of the invention.

Similarly, FIG. 39 shows an alternative configuration wherein a series circuit of capacitances C and resistances R connects the respective gates G of three IGBTs, which are connected in parallel within IGBT package 24.

When three IGBTs are connected in series as above, the capacitance C is expressed as in the following equation (10):

$$\frac{C1+3C}{C1+C2^++3C} \geqq \frac{1}{3} \tag{10}$$

Similarly, in the case of an IGBT package comprising four or more IGBTs connected in parallel, the gates should be connected by capacitances C (and resistances R) having a value which is greater than the capacitance C of the sixth embodiment by a factor of (1/the number of IGBTS).

However, when capacitance C is inserted between IGBTs arranged in a star shape, the capacitance C is not dependent on the number of IGBTs, but instead satisfies the following equation (11):

$$\frac{C1+C}{C1+C2^++C} \geqq \frac{1}{3} \tag{11}$$

EIGHTH EMBODIMENT

An IEGT according to an eighth embodiment of the present invention will next be explained.

Figure 40:
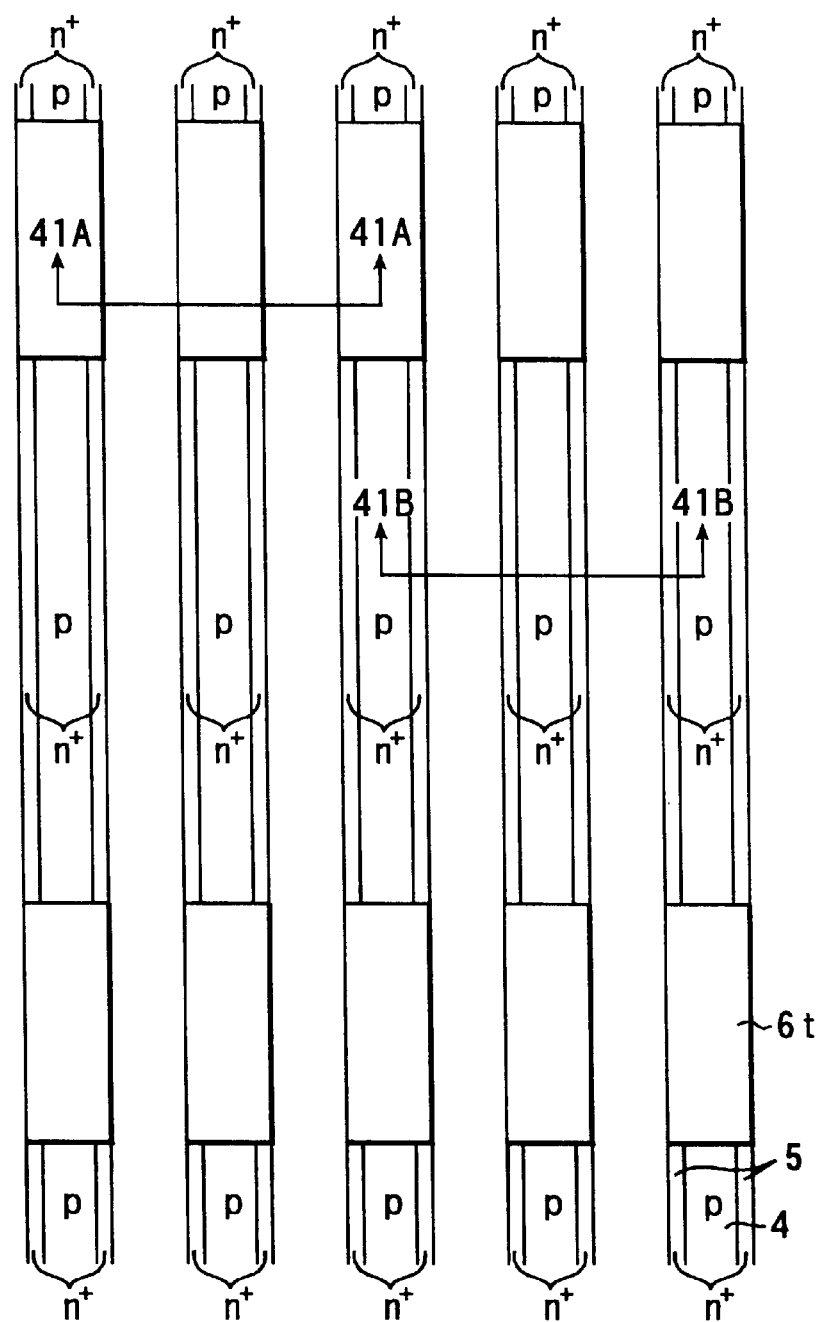
FIG. 40 is a diagram showing a front view of a configuration of an IEGT according to an eighth embodiment of the invention.
Figure 41:
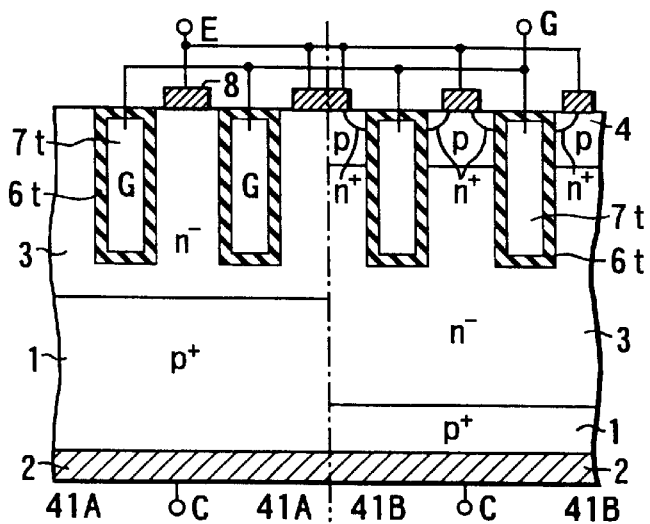
FIG. 41 is a diagram showing cross-sectional views taken along the lines 41A—41A and 41B—41B of FIG. 40.

FIG. 40 shows a front view of a configuration of an IEGT according to an eighth embodiment of the present invention, and FIG. 41, cross-sectional views taken along the lines 41A—41A and 41B—41B of FIG. 40. In this embodiment, the first and second embodiments are applied in a trench-type element. As FIG. 40 and FIG. 41 show clearly, trenches are formed in the surfaces of n-type source layers 5 so as to extend, through the p-type base layers 4, to the n-type base layer 3. Furthermore, planar-type gate insulating films 6 and gate electrodes 7 are formed.

In the trenches, the gate electrodes 7 are dug into the gate insulating film 6t, which is formed on the sides of the p-type base layers 4 sandwiched between the n-type base layer 3 and the n-type source layer 5. The gate electrodes 7 are connected to a gate terminal which is not depicted in the diagram.

Between the trenches, the p-type base layers 4, formed in such a manner that two n-type source layers 5 separately contact the surface of each trench, are selectively formed on the surface of the n-type base layer 3. In other words, IEGT regions which have n-type source layers 5 and p-type base layers 4, as shown along the line 41B—41B of FIG. 41, and invalid regions which do not have n-type source layers 5 or p-type base layers 4, as shown along the line 41A—41A of FIG. 41, are alternately formed between the trenches.

The p-type emitter layers 1 in the IEGT regions are formed at a greater depth than the p-type emitter layers 1 in the invalid regions.

The partial provision of regions with deeper p-type emitter layers 1, as described above, cancels the high electromagnetic field in the n-type base layer 3, thereby lowering the acceleration rate of the positive holes which are injected from the p-type emitter layers 1. Consequently, the amount of positive holes reaching the interface of the n-type base layer 3 and the gate insulating film 6*t* is reduced, and no inversion layer is created, enabling negative capacitance to be eliminated.

Negative capacitance can similarly be eliminated when the depths of the p-type emitter layers 1 are partially increased below the invalid gate electrodes 7*t*, which are connected to the gate terminal but not contacting the n-type source layers 5 or the p-type base layers 4.

NINTH EMBODIMENT

Next, an IEGT according to a ninth embodiment of the invention will be explained.

Figure 22:
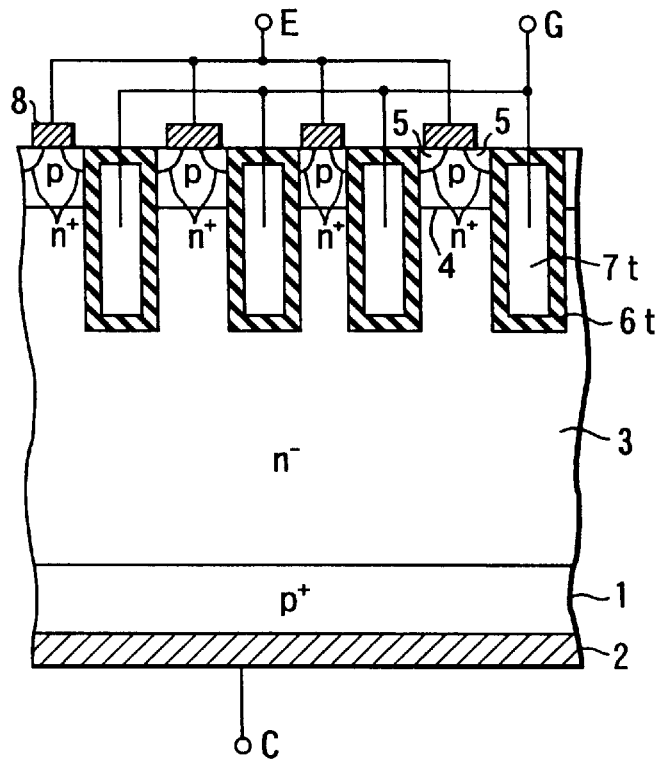
FIG. 22 is a diagram showing a configuration of a trench-type IEGT element without a gate bypass confirming the knowledge upon which the invention is based.
Figure 42:
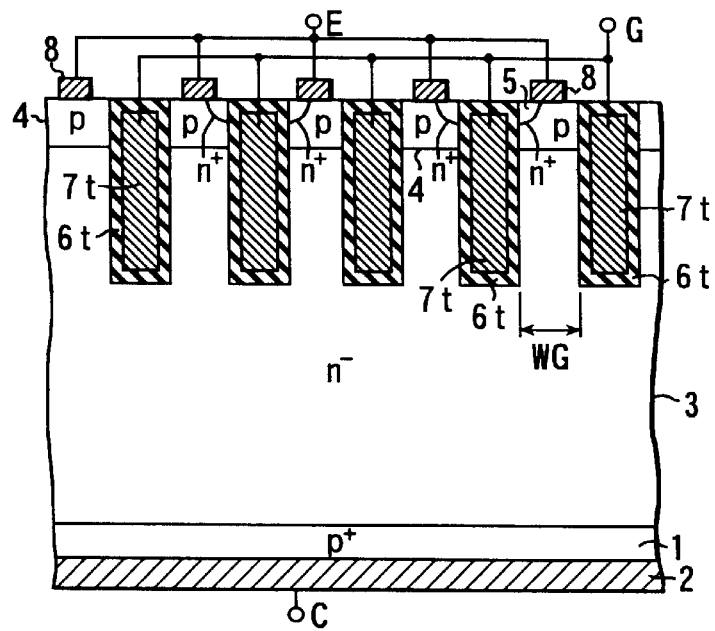
FIG. 42 a diagram showing a cross-sectional view of a configuration of an IEGT according to a ninth embodiment of the invention.

FIG. 42 is a cross-sectional view of the configuration of the IEGT of the ninth embodiment. Parts which differ from FIG. 22 will be explained. The present embodiment prevents negative capacitance by limiting the effect of the high electromagnetic field in the n-type base layer 3. As FIG. 42 shows in detail, the number of n-type source layers 5 provided between the gates, which is ordinarily two, is reduced to just one. In addition, the distance WG between the gates is reduced. In ninth embodiment through twelfth embodiment, the n-type source layers 5 and the p-type base layers 4 have a fixed configuration, namely extending along the direction of the stripes, in contrast to the configuration shown in FIG. 40. Furthermore, the distance WG between the gates is set, for instance, at approximately 3–4 μm.

Reducing the distance WG between the gates to approximately 3–4 μm makes it possible to increase the amount of electrons injected. This reduces the effect of the high electromagnetic field in the n-type base layer 3, thereby preventing negative capacitance.

And, since only one n-type source layer 5 is provided between each pair of adjacent gates, the distance WG between the gates can be more easily and reliably reduced to approximately 3–4 μm.

TENTH EMBODIMENT

Next, an IEGT according to a tenth embodiment of the invention will be explained.

Figure 23:
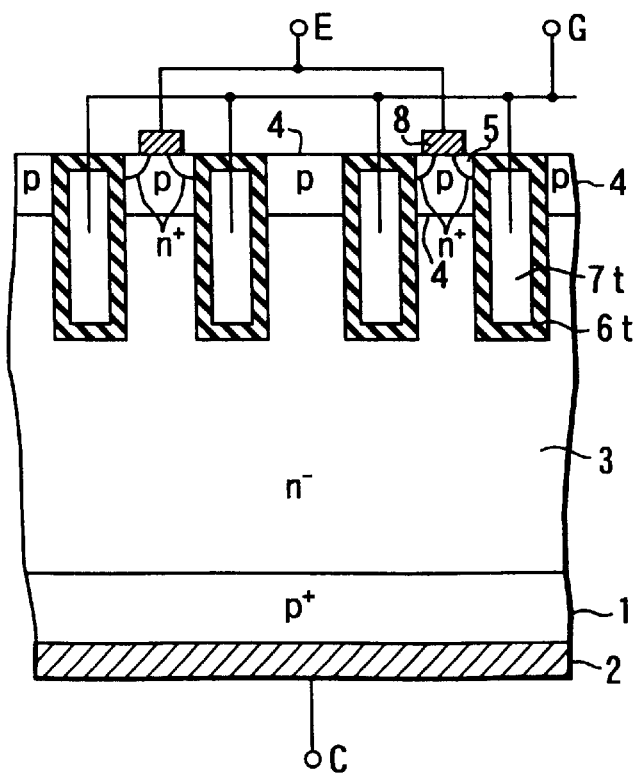
FIG. 23 is a diagram showing a configuration of a trench-type IEGT element with a gate bypass confirming the knowledge upon which the invention is based.
Figure 24:
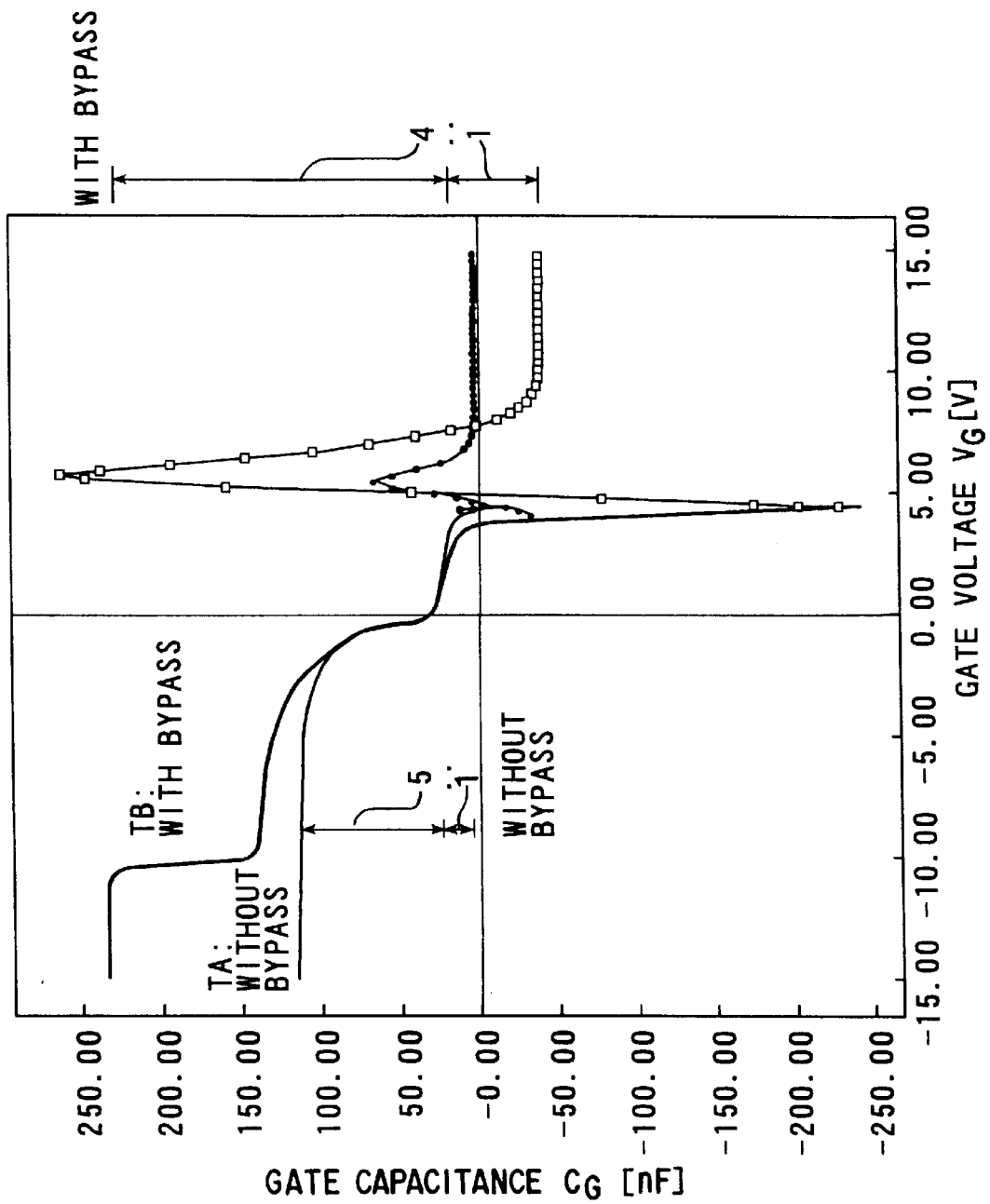
FIG. 24 is a diagram showing the gate voltage dependency of a gate capacity in two types of IGBT elements confirming the knowledge upon which the invention is based.
Figure 25:
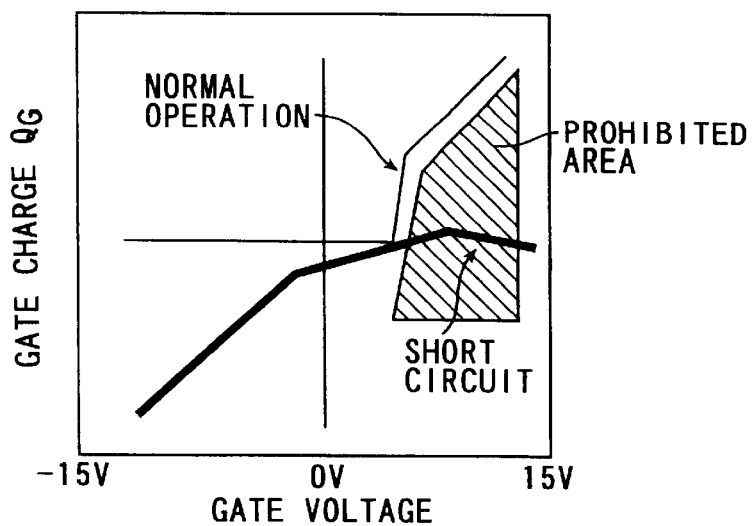
FIG. 25 and FIG. 26 are diagrams illustrating knowledge relating to short-circuit protection of the invention.
Figure 26:
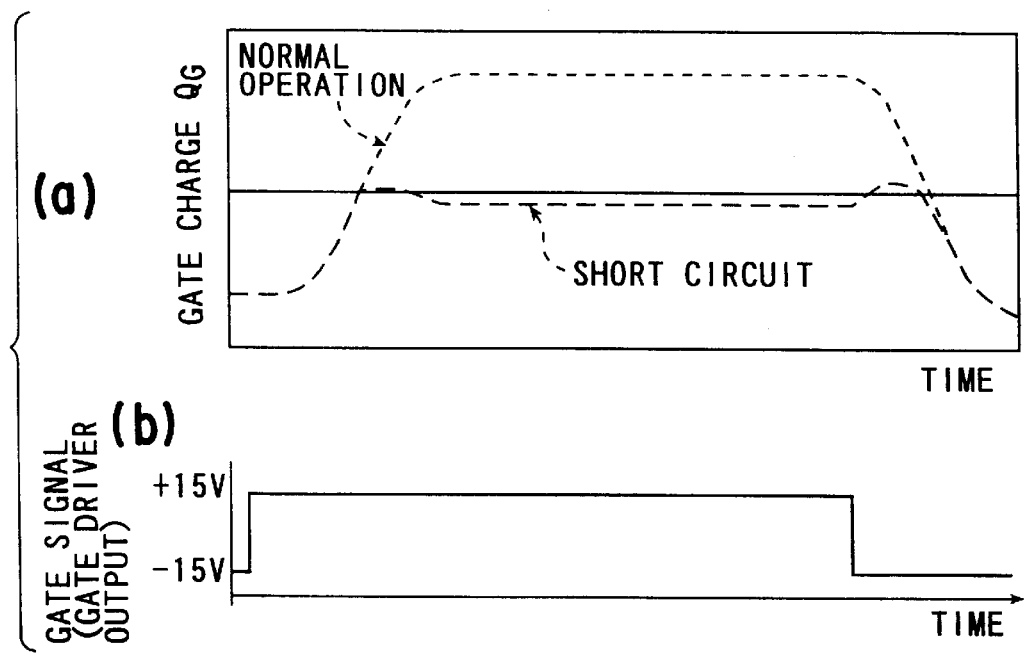
Figure 43:
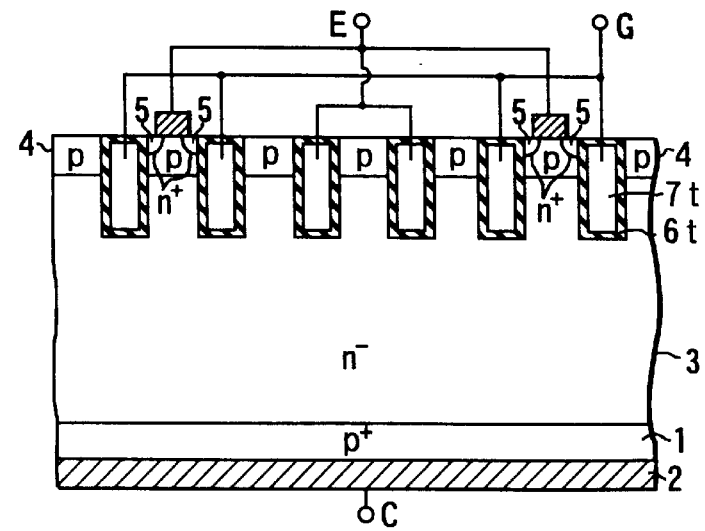
FIG. 43 is a diagram showing a cross-sectional view of a configuration of an IEGT according to a tenth embodiment of the invention.

FIG. 43 is a cross-sectional view of the configuration of the IEGT of the tenth embodiment. Parts which differ from FIG. 23 will be explained. According to the present embodiment, negative charge is discharged at the gate electrode in a bypass region. As FIG. 43 shows in detail, invalid gates 7*t*, provided between p-type base layers 4 which have no n-type source layers 5, are connected to the emitter terminal, instead of to the gate terminal.

Consequently, the gate electrodes 7*t* are secured at a fixed voltage with respect to the emitter, enabling negative charge at the gate electrodes 7*t* in the bypass regions to be discharged, thereby preventing any effects of the negative charge at the gate electrodes 7*t*.

ELEVENTH EMBODIMENT

Next, an IEGT according to an eleventh embodiment of the invention will be explained.

Figure 44:
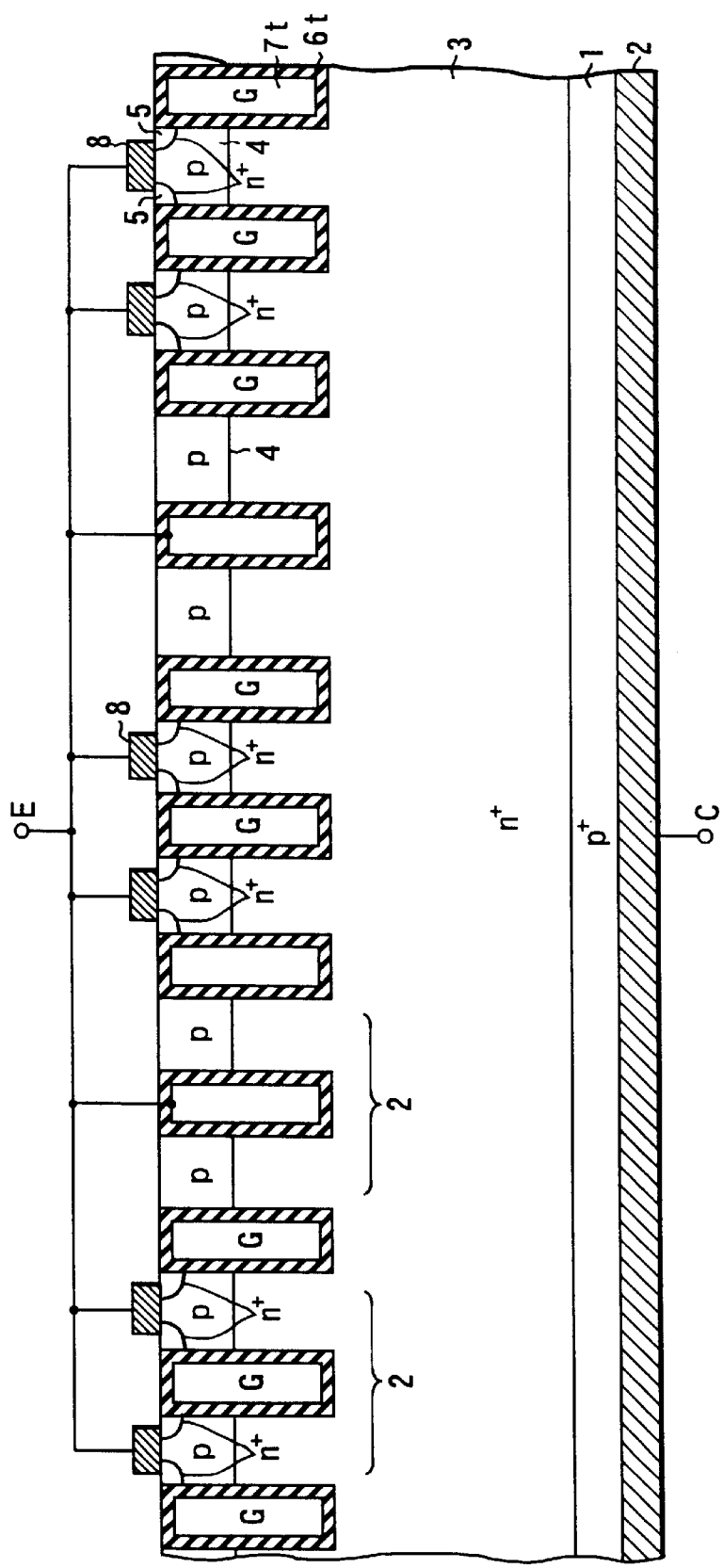
FIG. 44 is a diagram showing a cross-sectional view of a configuration of an IEGT according to an eleventh embodiment of the invention.

FIG. 44 is a cross-sectional view of the configuration of the IEGT of the eleventh embodiment. Parts which differ from FIG. 23 will be explained. The present embodiment reduces negative gate capacitance by arranging bypass regions and IEGT regions in groups. As FIG. 44 shows in detail, pairs of bypass regions (having no n-type source layers 5) alternate with pairs of IEGT regions. The ratio between the number of bypass regions and the number of IEGT regions is 2:2 (=1:1).

Furthermore, the gate electrodes 7*t* buried in the bypass regions are connected to the emitter terminal. But, the gate electrodes 7*t* which are indicated in the diagram by the symbol G are connected as usual to the gate electrode (not shown in the diagram). In all other respects the gate electrodes 7*t* are identical.

Although the IEGT described above has the same bypass ratio (1:1) as FIG. 23, the above IEGT is different in that the gate electrodes 7*t* in the bypass regions are maintained at a fixed potential with respect to the emitter. Therefore, negative gate capacitance is restricted as described above.

The invalid gates are potentially separated from the gate electrodes which are actually used and are connected to earth and maintained at a fixed potential. The characteristics of the invalid gates are consequently superior to the case when the invalid gates were connected to the gate potential. In other words, the reduction in gate capacitance achieves an increase in switching speed when the gates are switched to zero potential. Furthermore, since there is no excess of capacitance, the stability and reliability of the operation of the elements can be improved. Specifically, the safety operating area can be increased.

Figure 45:
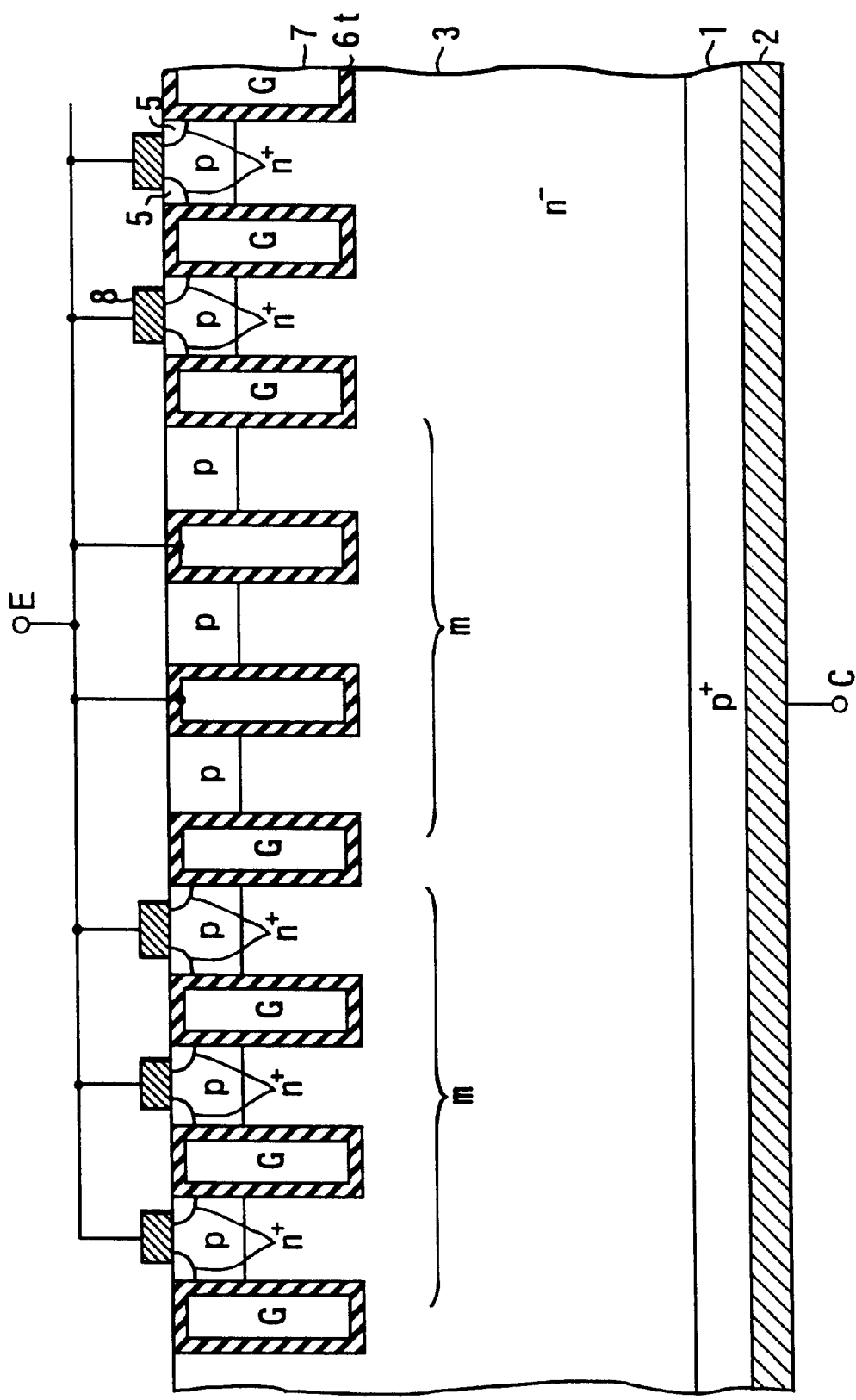
FIG. 45 is a diagram showing a cross-sectional view of a modified configuration of an IEGT

FIG. 45 shows a modified configuration of the embodiment in which the bypass regions and IEGT regions are arranged in groups of m regions each, the (n−1) invalid gates being maintained at a fixed potential with respect to the emitter.

The case has been described in which groups of bypass regions and IEGT regions comprising equal numbers of each were provided, but the present embodiment is not limited to such a case. An arrangement wherein different numbers of bypass regions and IEGT regions are grouped is also possible. As regards the characteristics of the element when operated at high dielectric withstanding voltage, large current and the like, the ratio of the number of IEGT regions to a single bypass region should preferably be in the range of four to one. Thus, a number m of bypass regions can be provided alternately with a number m−4m of IEGT regions.

TWELFTH EMBODIMENT

Next, an IEGT will be explained according to a twelfth embodiment of the invention.

Figure 46:
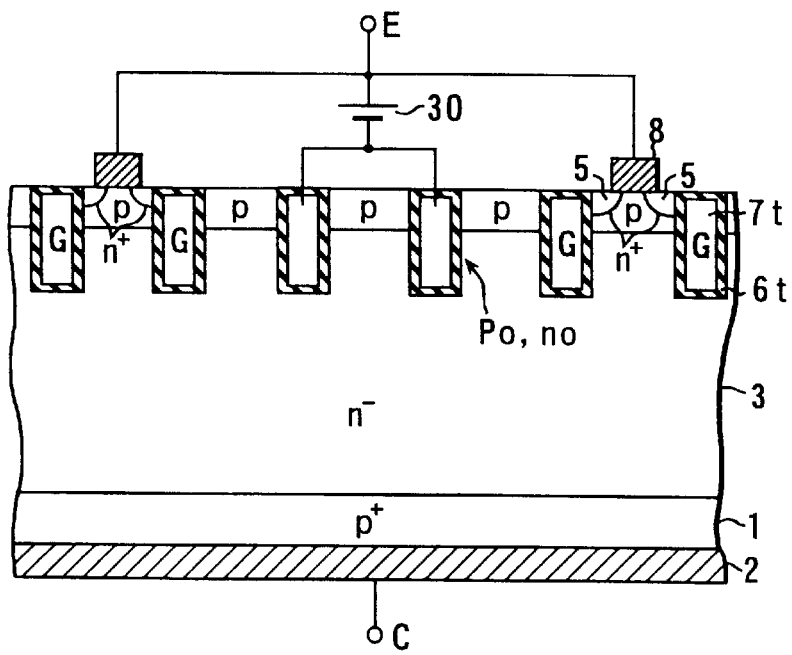
FIG. 46 is a diagram showing a cross-sectional view of a configuration of an IGBT according to a twelfth embodiment of the invention.

FIG. 46 is a cross-sectional view of a configuration of the IEGT. The present embodiment is a modification of the eleventh embodiment, wherein the number of carriers is reduced by means of interface recombination at a trench oxide film interface, resulting in an increase in the accumulated carrier amount in the n-type base layer 3. As FIG. 46 shows in detail, a direction current 30 is inserted between, for instance, the two gate electrodes and the emitter terminal of three bypass regions, the emitter terminal being deemed as the positive potential side and the gate electrodes as the negative side.

In this configuration, an inversion layer or an accumulation layer is formed at the trench oxide film interface between the n-type base layer 3 and the gate insulating film 6*t*, provided around each gate electrode 7*t* in the bypass regions. Here, either one of the electron density $n_S$ at the interface and the positive hole density $p_S$ at the interface is an extremely high number with respect to the other ($n_S<<p_S$ or $n_S>>p_S$).

Generally, at high injection, the carriers eliminated from the oxide film interfaces can be expressed as follows (1 cm$^2$, per second) $Us=s_O$ ($p_S$ $n_S$)/($p_S+n_S$). Here, $s_O$ denotes interface recombination velocity.

Figure 47:
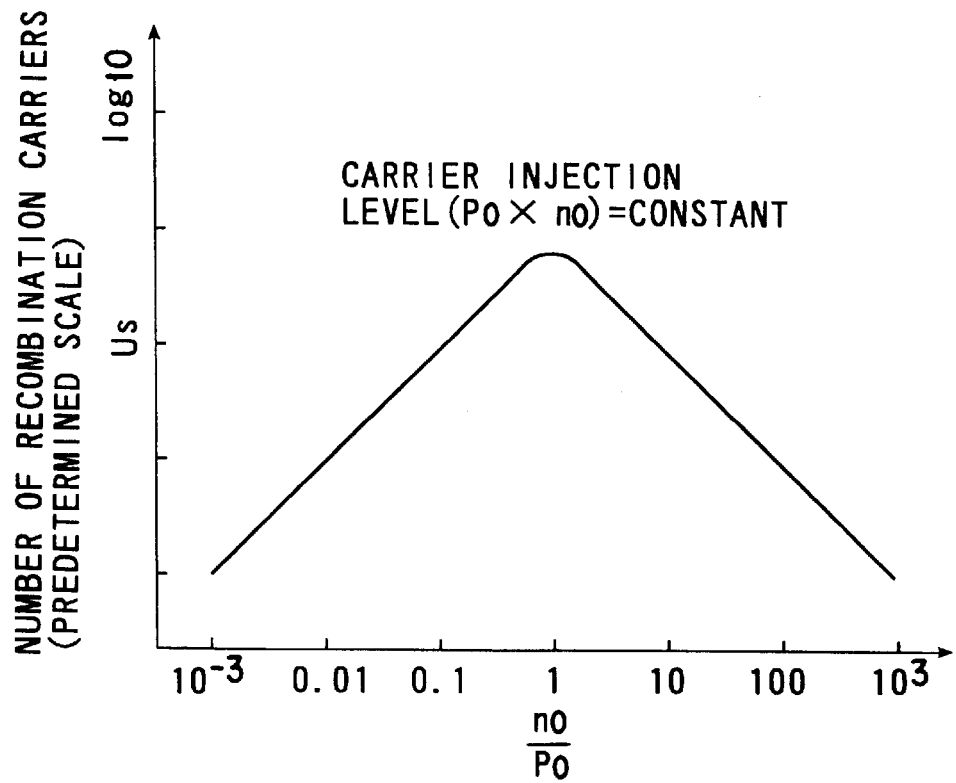
FIG. 47 is a diagram showing carrier non-dependency on the number of recombined carriers illustrating the operation of the twelfth embodiment.

As FIG. 47 shows, number of carriers recombined on the interfaces is greatest when $p_O=n_O$. For instance, when the gate electrodes 7*t* and the emitter terminal have the same potential, $p_O$=approximately $n_O$.

But, the IEGT of the present embodiment, when voltage is applied to the gate electrodes 7*t* in the bypass regions, the interfaces between the gate insulating films 6*t* and the n-type base layer 3 satisfies: $n_S<<p_S$ or $n_S>>p_S$. Consequently, the number of carriers which are recombined on the trench oxide interfaces can be reduced while increasing the carriers accumulated in the n-type base layer 3, whereby negative gate capacitance can be reduced.

The voltage which is applied to the gate electrodes 7*t* in the bypass regions can acceptably be less than approximately 0.5V. Therefore, when high-density doped polysilicon gates are used and a built-in voltage is generated at the gates, the same effects can be obtained without applying voltage from the outside.

THIRTEENTH EMBODIMENT

Thirteenth embodiment through Nineteenth embodiment relate to the protection of electrons from short circuits.

Figure 27:
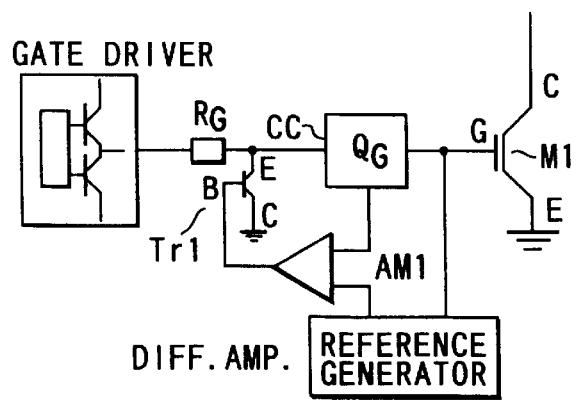
FIG. 27 is a block diagram of a protection circuit based on the knowledge.
Figure 48:
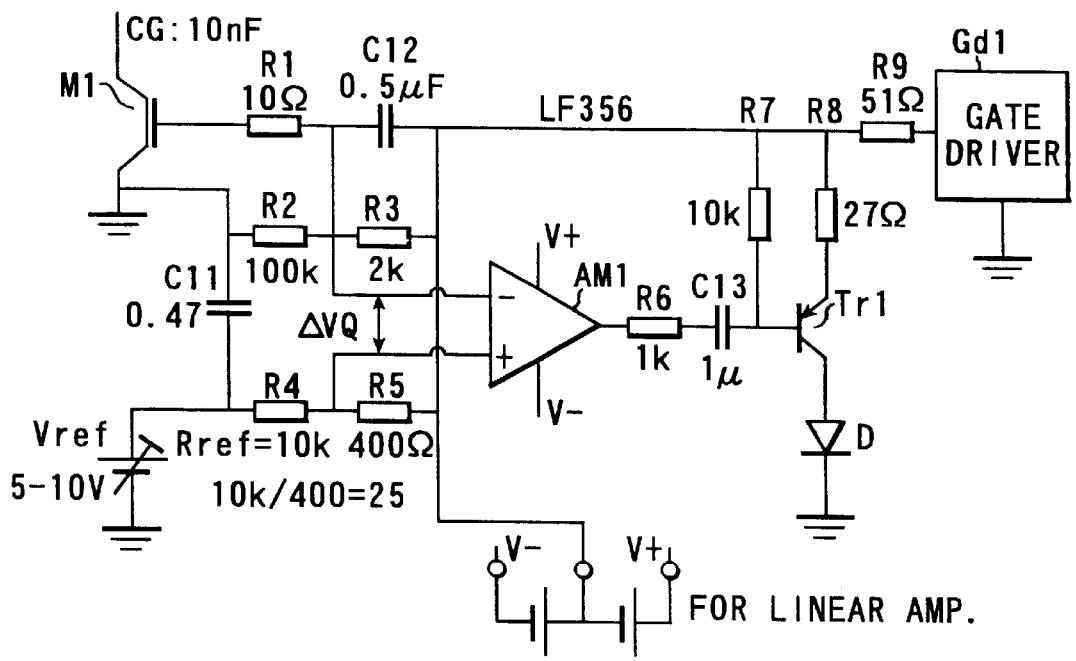
FIG. 48 and FIG. 49 are circuit diagrams of a short-circuit protection system of a semiconductor device according to a thirteenth embodiment of the invention.
Figure 49:
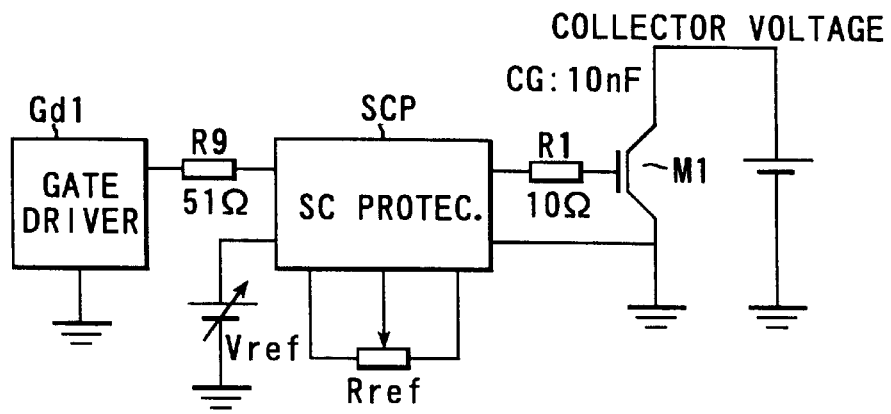

FIG. 48 and FIG. 49 are circuit diagrams showing a short-circuit protection system for a semiconductor device according to a thirteenth embodiment of the invention. This short-circuit protection system protects the semiconductor device when short circuits occur, as in the configuration depicted in FIG. 27.

To summarize, the short-circuit protection system comprises a short-circuit protection circuit SPC, which is inserted between a gate of a main IGBT element (model No. GT25Q101) M1 having a gate capacitance CG (10 nF during normal operation) and a gate driver Gd1 of the gate. The short-circuit protection circuit SPC comprises a voltage bridge circuit having C12, R4 and R5, a differential amplifier (model No. LF356) AM1 which is connected to the voltage bridge circuit, and a transistor (model No. MPSA56) Tr1 which receives output from the differential amplifier AM1 and connects the gate and earth.

Figure 50:
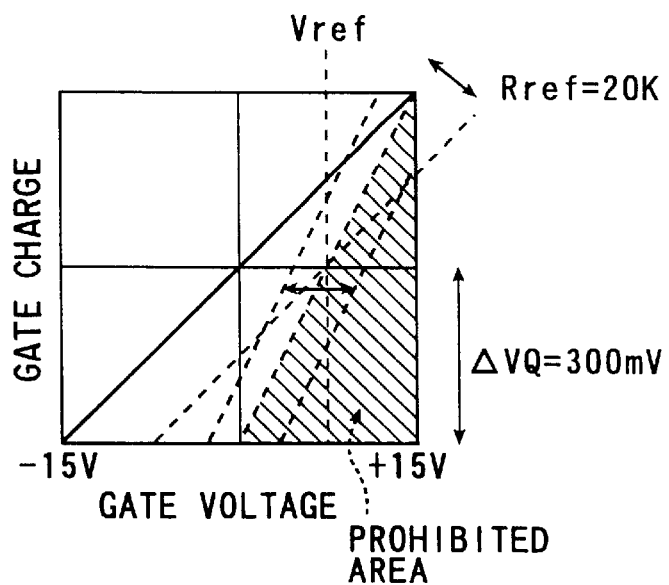
FIG. 50 is a diagram illustrating an adjustment of a prohibited area in the thirteenth embodiment.

The voltage bridge circuit has functions for supplying a voltage, corresponding to the gate charge of the main IGBT element M1, to the inversion input terminal of the differential amplifier AM1, and for determining whether or not the gate charge at the noninversion input terminal is within the prohibited area shown in FIG. 50. Furthermore, the voltage bridge circuit is capable of dynamically altering the prohibited area of the gate charge by adjusting R4 (Rref4) or a power Vref which is connected to R4.

The differential amplifier AM1 detects the gate charge accumulated at the gate of the main IGBT element M1, based on the voltages at both terminals of the gate. The voltage bridge circuit, comprising CG, C12, R4 and R5, detects whether or not the detected value is contained in the prohibited area. When it has been determined that the gate charge lies within the prohibited area, the differential amplifier AM1 sends the output to the base of the transistor TR1.

The resistance R1, provided between the gate and the gate driver, has a function for eliminating unneeded oscillations between the gate capacitance CG and the capacitor C12. When short circuit wires are being used, the resistance R1 can be set to a lower value or omitted altogether.

Next, the operation of the semiconductor device short-circuit protection system of the present invention will be explained.

Normally, current for main IGBT element M1 is switched ON and OFF within the operating range of the main IGBT element M1. The differential amplifier AM1 detects the gate charge of the main IGBT element M1 based on the voltages at both ends of C12, and uses the voltage bridge circuit to detect whether the gate charge detected by the differential amplifier AM1 is outside the prohibited area.

When a short circuit occurs, a large current flows into the main IGBT element M1. As a consequence, the gate charge enters the prohibited area of FIG. 50.

The differential amplifier AM1 detects the entry of the gate charge into the prohibited area, and outputs to the base of the transistor Tr1, whereby the transistor Tr1 turns ON. The transistor Tr1 connects the gate to earth, via a resistance R8 and a diode D and the like, lowering the gate voltage.

As a result of the lowering of the gate voltage, the main IGBT element M1 turns OFF. In addition, the gate charge is retrieved from the prohibited area and re-enters the normal operating area, thereby protecting the main IGBT element M1.

Figure 51:
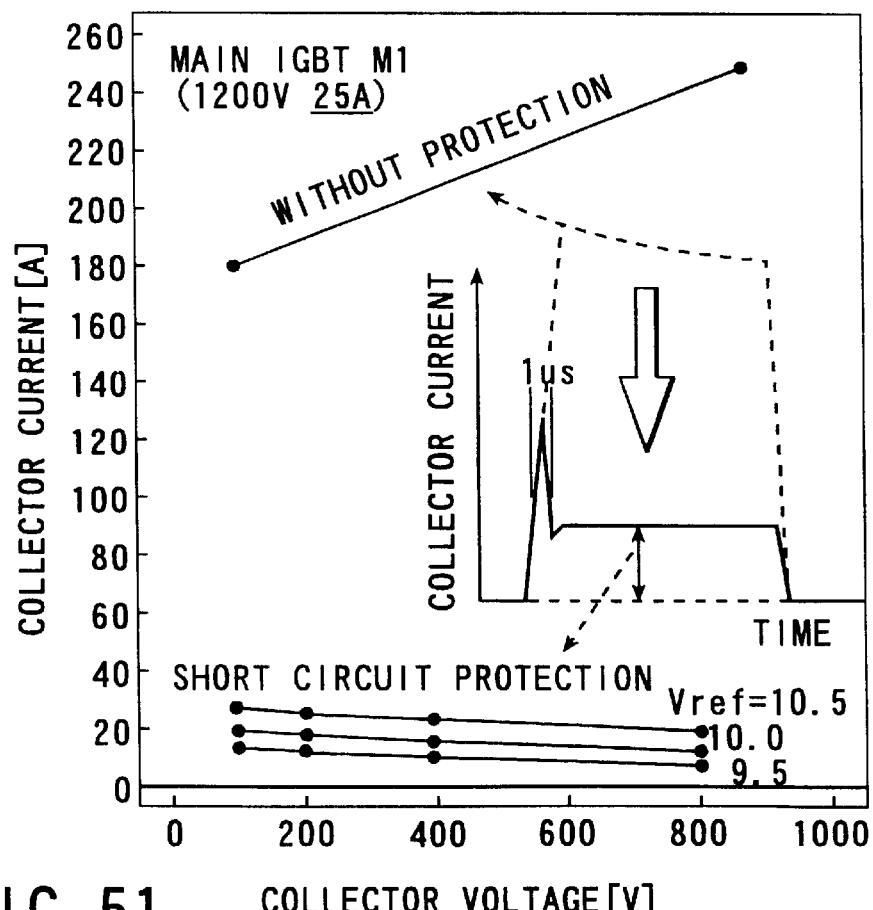
FIG. 51 is a diagram showing a current limiting effect of the thirteenth embodiment.

For instance, if the short-circuit protection circuit SCP of the present embodiment is not provided, as shown in FIG. 51, current of approximately 200A flows to the main IGBT element M1 during a short circuit. But, when the short-circuit protection circuit SCP is inserted as in the present embodiment, the value of the current flowing to the main IGBT element M1 is restricted. Moreover, the current value which initiates the protection operation can be set at predetermined value by adjusting the Vref.

According to the embodiment described above, the main IGBT element M1 can be protected from breakdown by detecting gate charge by means of the voltage bridge circuit, determining whether the gate charge value is within the prohibited area by means of the differential amplifier AM1, and, when the gate charge is within the prohibited area, lowering the gate voltage by means of the transistor TR1 and returning the gate charge to the normal operating area.

As was shown in FIG. 49, a short-circuit protection function can be added to the main IGBT element M1 simply by inserting the short-circuit protection circuit SPC of the present embodiment between the gate driver Gd and the gate of the main IGBT element M1. The present embodiment is therefore easily applicable to an existing IGBT or to a device using an IGBT. In other words, short-circuit protection can even be provided to an IGBT chip which does not contain a sensing IGBT element S1. And, since the short-circuit protection circuit can be housed in a gate driver by means of internal connection or the like, the short-circuit protection function can be added with almost no increase in costs.

The short-circuit protection circuit can be achieved with a small area and a short feedback loop from the detection of the gate charge to the reduction of the gate voltage. Thus, delays and instability in the protection, which were disadvantages of the conventional device, can be eliminated.

The protection level can be electrically controlled by adjusting the Vref and the like. Therefore, the short-circuit protection method can be programmed in accordance with the temperature, operating mode and the like of the main IGBT element M1.

FOURTEENTH EMBODIMENT

Figure 52:
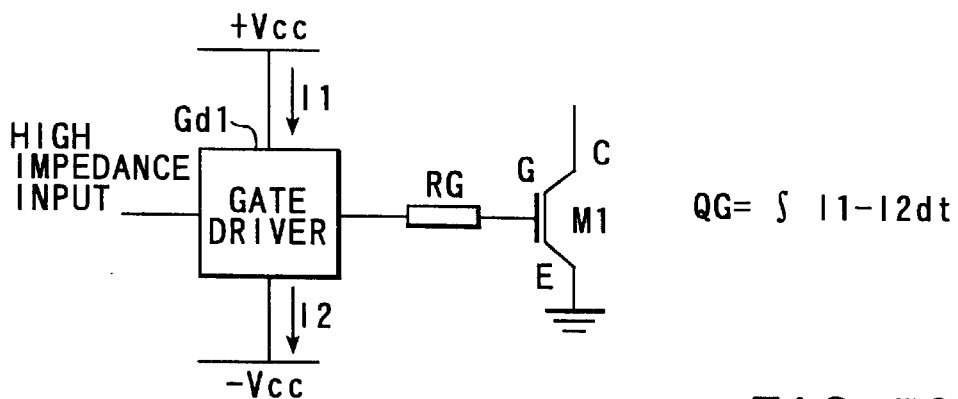
FIG. 52 is a circuit diagram showing a method for detecting gate charge in a short-circuit protection system of a semiconductor device according to a fourteenth embodiment of the invention.

FIG. 52 is a circuit diagram showing a method for detecting gate charge in a short-circuit protection system of a semiconductor device according to a fourteenth embodiment of the invention.

The present embodiment is an improved modification of the thirteenth embodiment, wherein the gate charge was detect ed from the voltages at both ends of the capacitor C12, which was inserted in series to the gate circuit. However, in the thirteenth embodiment, the gate voltage is affected by the voltage load at the capacitor C12. As a consequence, when the main IGBT element M1 is ON (namely, when a positive voltage is being applied to the gate), the voltage applied to the gate of the main IGBT element M1 is in fact slightly lower than the voltage originally supplied by the gate driver Gd1.

However, in the fourteenth embodiment, charge accumulated at the gate is detected from the current flowing through the power wire of the gate driver Gd1.

As FIG. 52 shows, due to the extremely high input resistance of the gate driver Gd1, the value of the charge flowing into the gate is obtained by integrating the differential between the current I1 flowing into the gate driver Gd1 and the current flowing out I2, as expressed by the following equation:

$$QG=\int (I1-I2)dt$$

Then, as in the embodiment described above, a differential amplifier (not shown in the diagram) detects whether or not the gate charge is within the prohibited area. When it has been determined that the gate charge is within the prohibited area, the gate voltage is lowered to protect the main IGBT element M1 from the short circuit.

The above embodiment achieves the same effects as the thirteenth embodiment, and in addition, enables the gate charge to be detected and the short-circuit protection operation to be realized without lowering the voltage supplied to the gate from gate driver.

FIFTEENTH EMBODIMENT

Figure 53:
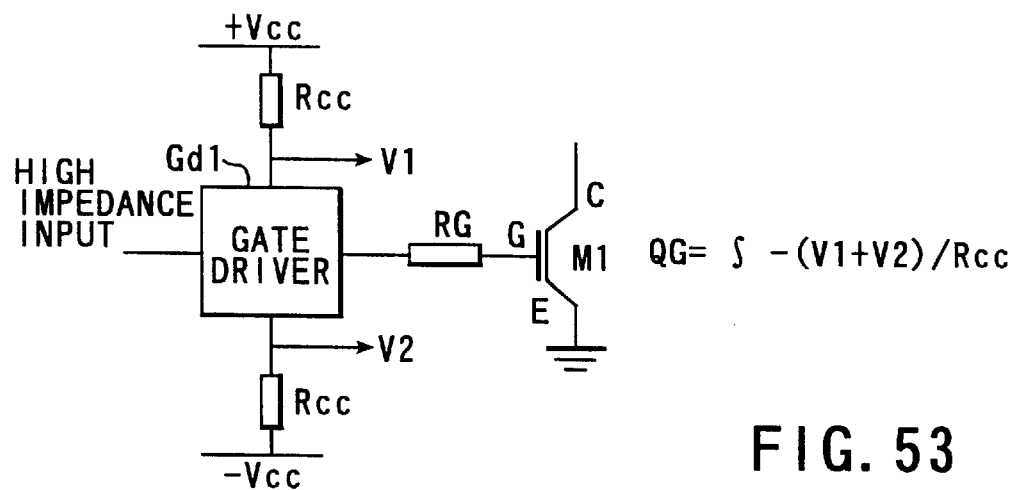
FIG. 53 is a circuit diagram showing a method for detecting gate charge in a short-circuit protection system of a semiconductor device according to a fifteenth embodiment of the invention.

FIG. 53 is a circuit diagram showing a method for detecting gate charge in a short-circuit protection system of a semiconductor device according to a fifteenth embodiment of the invention.

The present embodiment is a modification of the fourteenth embodiment. As illustrated in FIG. 53 and the following equation, the current I1 flowing into the gate driver Gd1 and the current I2 flowing out of the gate driver Gd1 are first detected from the voltage drop at resistance Rcc. Then, the charge QG flowing to the gate is calculated by integrating the differential of both currents I1 and I2.

$$QG=\int (V1-V2)/Rcc \, dt$$

In the above equation, I1=V1/Rcc and I2=V2/Rcc.

Figure 54:
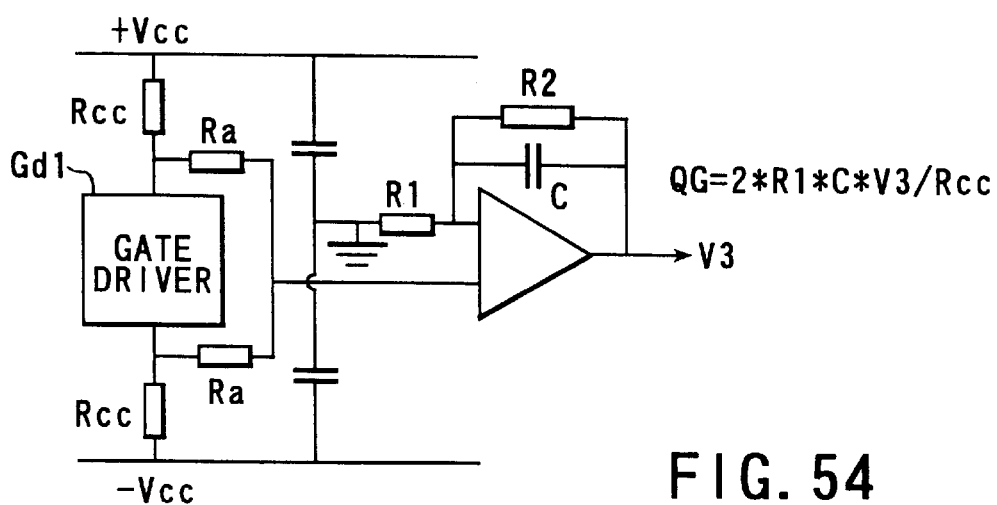
FIG. 54 is a circuit diagram showing a modified configuration of the fifteenth embodiment.

This configuration achieves the same effects as the fourteenth embodiment. Further, the present embodiment can be modified to the configuration shown in FIG. 54. In other words, the currents I1 and I2 are extracted from resistors Ra, and the amount of charge accumulated at the gate is calculated by an integrating circuit according to the following equation.

$$QG=2 \cdot R1 \cdot C \cdot V3/Rcc$$

As above, the same effects can thereby be achieved.

SIXTEENTH EMBODIMENT

Figure 55:
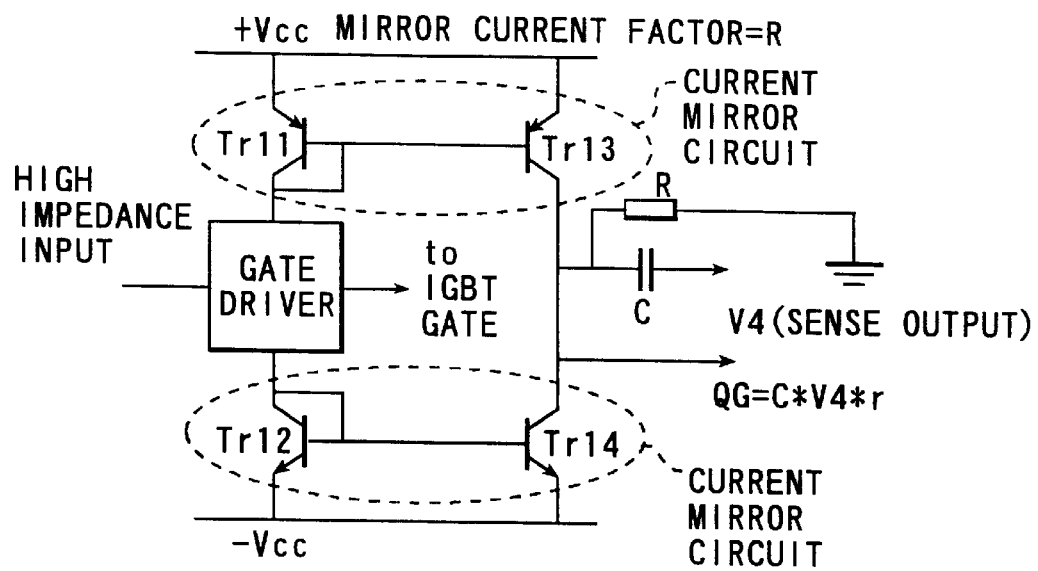
FIG. 55 is a circuit diagram showing a method for detecting gate charge in a short-circuit protection system of a semiconductor device according to a sixteenth embodiment of the invention.

FIG. 55 is a circuit diagram showing a method for detecting gate charge in a short-circuit protection system of a semiconductor device according to a sixteenth embodiment of the invention.

The configuration of the present embodiment is a modification of the fourteenth and fifteenth embodiments. As FIG. 55 shows in detail, current is detected via a current mirror and then fed into a capacitor C. As the following equation shows, the charge QG flowing into the gate is detected based on the voltage differential V4 of both ends of the capacitor C.

$$QG=C \cdot V4 \cdot r$$

Here, r=mirror current factor.

The above configuration achieves the same effects as the fifteenth and sixteenth embodiments. Moreover, the present embodiment offers the additional advantage that circuit power drain can be reduced by providing mirror side transistors Tr13 and Tr14 which have a smaller effective area on the chip than the input side transistors Tr11 and Tr12. The effective area ratio between the mirror side transistors Tr13 and Tr14 and the input side transistors Tr11 and Tr12 should ideally be in the range of 1:5–1000 respectively.

SEVENTEENTH EMBODIMENT

Figure 56:
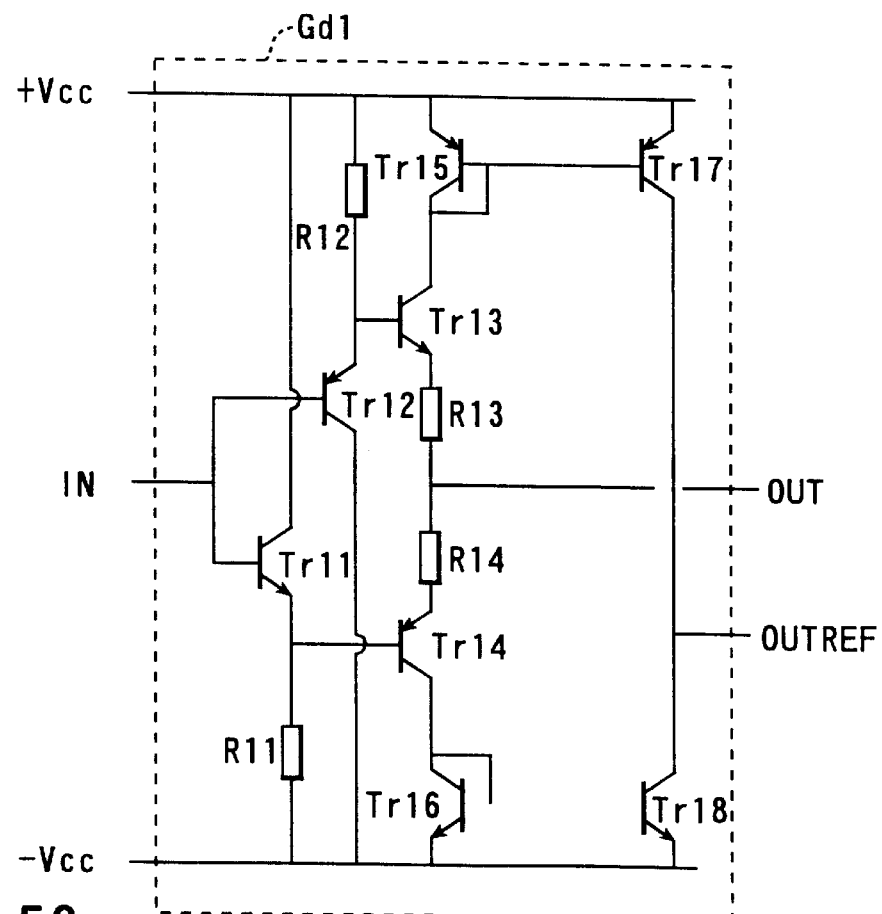
FIG. 56 is a circuit diagram showing a gate driver and a method for detecting gate charge in a short-circuit protection system of a semiconductor device according to a seventeenth embodiment of the invention.

FIG. 56 is a circuit diagram showing a gate driver and a method for detecting gate charge in a short-circuit protection system of a semiconductor device according to a seventeenth embodiment of the invention.

As FIG. 56 shows, the present embodiment is achieved by adding a gate driver Gd1 to the embodiment depicted in FIG. 55.

In FIG. 56, transistors Tr11–Tr14, which interlock in accordance with the potential of input terminal IN, correspond to a gate driver Gd1, and transistors Tr15–Tr18, for extracting current flowing through the transistors Tr13 and Tr14 of the gate driver Gd1, correspond to a current mirror. However, to facilitate explanation, these are shown in the diagram as a compound circuit designated by the symbol Gd1.

The gate driver Gd1 outputs current from a drive output terminal OUT. The current mirror outputs current from an extraction terminal OUTREF. The current flowing to the drive output terminal OUT and the current to the extraction terminal OUTREF are proportionate to the effective area rate of the current mirror, and have no relation to the voltage of the extraction terminal OUTREF.

Therefore, the present embodiment is able to achieve the same effects as the sixteenth embodiment more easily and reliably.

EIGHTEENTH EMBODIMENT

Figure 57:
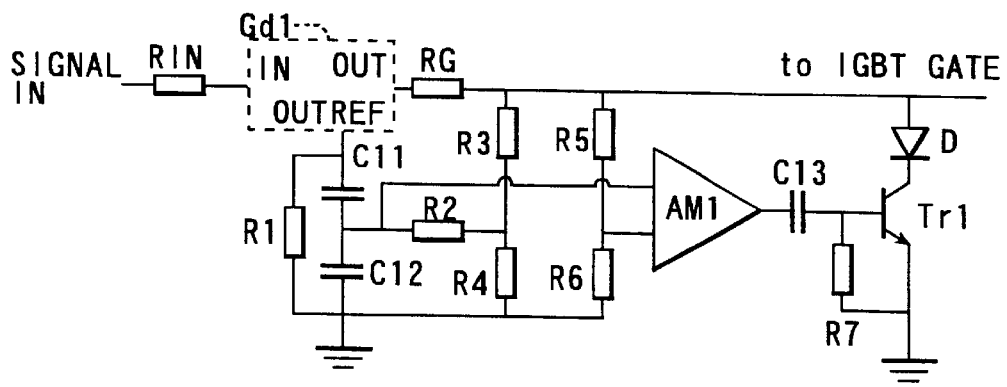
FIG. 57 is a circuit diagram showing a circuit protection system of a semiconductor device according to an eighteenth embodiment of the invention.

FIG. 57 is a circuit diagram showing a circuit protection system of a semiconductor device according to an eighteenth embodiment of the invention, wherein the circuit of FIG. 56 is inserted in the section indicated by a broken line.

The eighteenth embodiment applies the technology of the seventeenth embodiment to a circuit using a voltage bridge circuit identical to that in FIG. 48. In this configuration, the same effects as the thirteenth and seventeenth embodiments can be simultaneously obtained.

Figure 58:
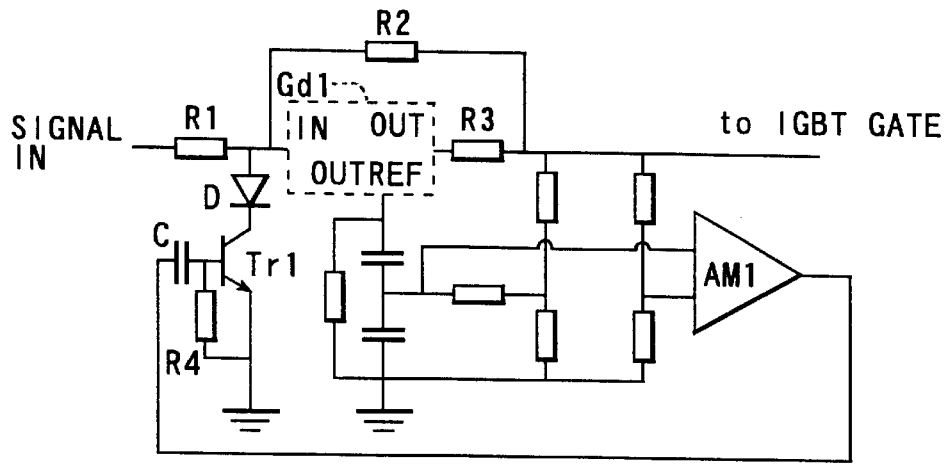
FIG. 58 and FIG. 59 are circuit diagrams showing modified configurations of the eighteenth embodiment.
Figure 59:
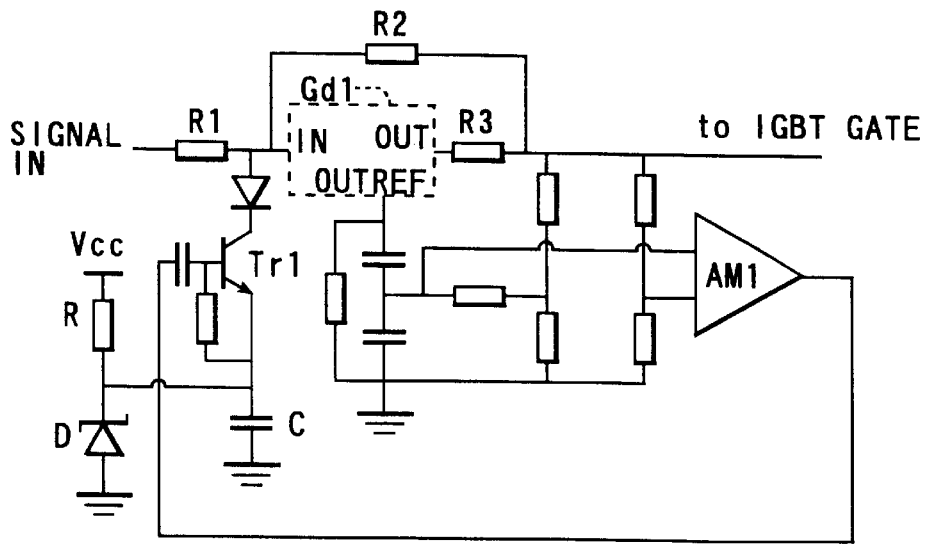

And, the present embodiment can be modified to the configurations shown in FIGS. 58 and 59. As these diagrams show, a transistor Tr1 for short-circuit protection is connected to the input of the gate driver Gd1, and the output from the differential amplifier AM1 is supplied to the transistor Tr1.

In these modified configurations, the transistor Tr1 (for instance, MPSA56) connects the high resistance input portion of the gate driver Gd1 to earth. This prevents a large current from flowing to the gate driver Gd1 during a short circuit, and reduces the possibility of heating and electrical loss in the gate driver Gd1.

Furthermore, since the transistor Tr1 is provided so as to continue the signals of the high resistance input portion of the gate driver Gd1 to earth, the circuit can be realized with a smaller scale than is the case when the transistor Tr1 is provided on the output side of the gate driver Gd1. The configuration shown in FIG. 59 has a more stable emitter potential than the configuration in FIG. 58, achieving more stable operation.

NINETEENTH EMBODIMENT

Figure 60:
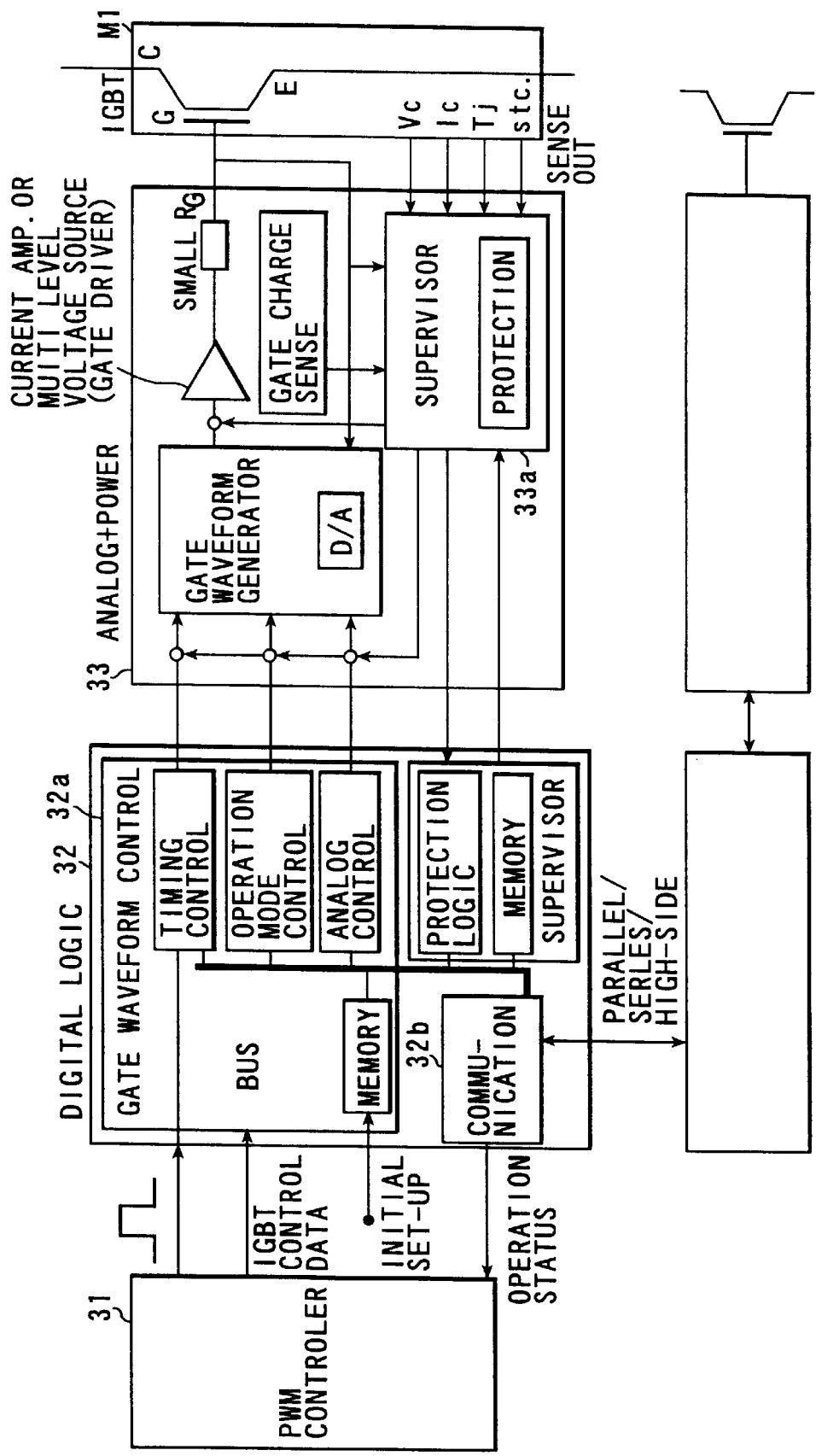
FIG. 60 is a block diagram showing a configuration of a short-circuit protection system of a semiconductor device according to a nineteenth embodiment of the invention.

FIG. 60 is a block diagram showing a configuration of a short-circuit protection system of a semiconductor device according to a nineteenth embodiment of the invention.

As FIG. 60 shows in detail, this embodiment is a modification of thirteenth embodiment through eighteenth embodiment, in which a PWM (pulse width modulation) controller 31, a digital logic circuit 32, a analog gate driver 33 and a main IGBT element M1 are connected in sequence.

The PWM controller 31 sends a gate signal and IGBT control data to the digital logic circuit 32 in compliance with an operation status received from the digital logic circuit 32.

The digital logic circuit 32 sends a gate signal, which has been received from the PWM controller 31, via a gate waveform controller 32a to the analog gate driver 33. In addition, based on detection data received from the analog gate driver 33, the digital logic circuit 32 determines whether or not to initiate short-circuit protection, and sends the result of this determination to a supervisor 33a for supervising the analog gate driver 33.

Furthermore, the digital logic circuit 32 may also have a communication function 32b for communicating and receiving operation statuses to/from other short-circuit protection systems, but this function can be omitted.

The analog gate driver 33 supplies a driving signal to the gate of the main IGBT element M1 in accordance with a gate signal, which it receives from the digital logic circuit 32. In addition, the analog gate driver 33 comprises a supervisor 33a for inputting the gate charge, the gate voltage, the collector voltage Vc, the collector current Ic, the temperature Tj and the like of the main IGBT element M1 to the digital logic circuit 32, and then controlling the driving signal in accordance with the determination supplied by the digital logic circuit 32.

The above configuration achieves the same effects as thirteenth embodiment through eighteenth embodiment, while also enabling the short-circuit protection method to be easily and reliably programmed in accordance with the temperature, operating mode and the like of the main IGBT element M1.

TWENTIETH EMBODIMENT

Twentieth embodiment through twenty-fourth embodiment relate to protection of elements from dV/dt voltage boost when the circuit is turned OFF.

Figure 61:
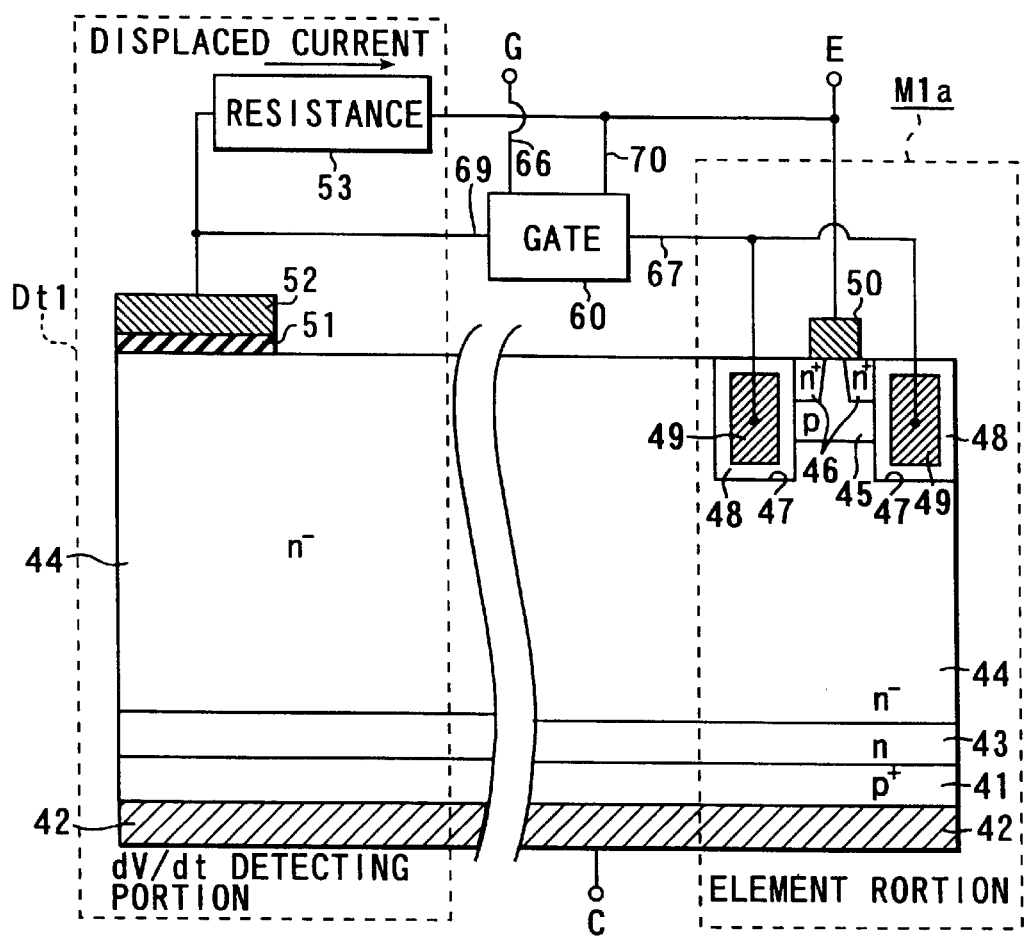
FIG. 61 is a diagram showing a cross-sectional view of a configuration of a semiconductor device according to a twentieth embodiment of the invention.

FIG. 61 is a cross-sectional view of a configuration of a semiconductor device according to a twentieth embodiment of the invention. As FIG. 61 shows, a collector electrode 42 is formed on one surface of a $p^+$-type emitter layer 41. On the other surface of the $p^+$-type emitter layer 41 are formed in sequence an n-type buffer layer 43 and an $n^-$-type base layer 44.

A p-type base layer 45 is selectively formed on the surface of the $n^-$-type base layer 44. Further, $n^+$-type source layers 46 are selectively formed on the surface of the p-type base layer 45. Trenches 47 are formed in the surface of the $n^+$-type source layer 46, passing through the p-type base layer 45 to a depth within the $n^-$-type base layer 44.

A gate electrode 49 is buried inside each trench 47 with a gate insulating film 48 interposed in between. An emitter electrode 50 is formed on the p-type base layer 45 so as to contact parts of the $n^+$-type source layers 46.

The portion denoted by the broken line, extending from the emitter electrode 50 to the collector electrode 42 and including the gate electrode 49, functions as a main IGBT element M1. In the present application, this portion is referred to as element portion M1a.

A sensing element 52 is selectively provided on a $n^-$-type base layer 44, which is separated from the element portion M1a, with insulating film 51 therebetween.

The sensing element 52 connects to the emitter electrode 50, via a resistance 53, and also to a gate controller 60. The portion denoted by the broken line, extending from the collector electrode 42 to the resistance 53 and including the insulating film 5 and the sensing element 52, functions as a dV/dt detector. In the present application, this portion is referred to as dV/dt detecting portion Dt1.

The gate controller 60 has functions for controlling the value of the gate resistance Rg between the gate electrode 49 and a gate driver (not shown in the diagram), in compliance with the potential of the sensing element 52, and fixing the potential of the emitter electrode 50 in accordance with the potential of substrate.

Figure 62:
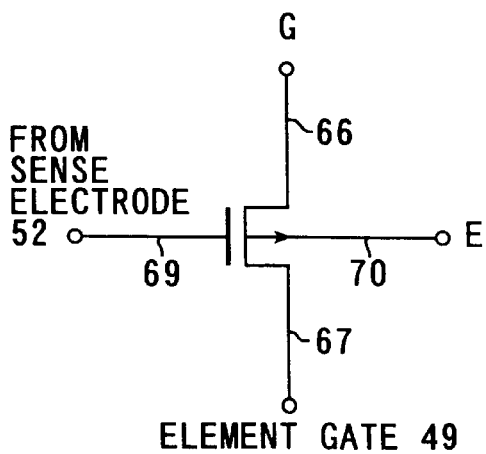
FIG. 62 is a circuit symbol diagram showing a configuration of a gate control portion according to the twentieth embodiment.
Figure 63:
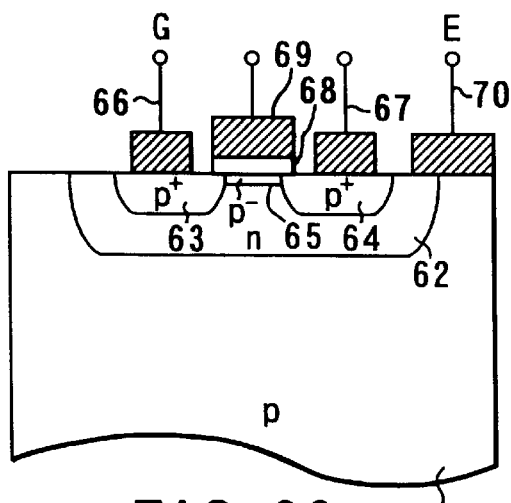
FIG. 63 is a diagram showing a cross-sectional view of the configuration of the gate control portion according to twentieth embodiment.

The gate controller 60 uses a normally on p-channel MOSFET such as those shown in FIG. 62 and FIG. 63. Ordinarily, the resistance of the p-channel MOSFET maintains a fixed value during the ON state; when the circuit is turned OFF, the potential at the control terminal 69 is boosted, in compliance with the dV/dt, to a value approaching the threshold voltage, thereby raising the channel resistance.

More concretely, the semiconductor layers of the gate controller 60 comprise an n-type well layer 62, which is selectively provided on the surface of a p-type substrate 61, a $p^+$-type drain layer 63 and a $p^+$-type source layer 64, which are selectively formed inside the n-type well layer 62, and a $p^-$-type layer 65, which is formed between the $p^+$-type layers 63 and 64.

The $p^+$-type drain layer 63 has an input terminal 66, which connects to the gate driver (not shown in the diagram). The $p^+$-type source layer 64 has an output terminal 67, which connects to the gate electrode 49 of the element portion M1a. A control terminal 69, provided above the p⁻-type layer 65 with an insulating film 68 in between, is connected to the sensing element 52 of the dV/dt detecting portion Dt1. In addition, a potential-fixing terminal 70, provided on the n-type well layer 62 and the p-type substrate 61, is connected to the emitter electrode 50 of the element portion M1a.

Next, the operation of the semiconductor device will be explained.

When the element portion M1a turns OFF, the displaced current (the product of the dV/dt and the capacitance components, which comprise vacant layers within the substrate, the sensing element 52 and the insulating film 51 on the substrate) flows through the resistance 53 to the emitter electrode 50. Simultaneously the potential of the sensing element 52 is boosted, whereby a control signal is sent to the control terminal 69 of the gate controller 60.

Figure 7:
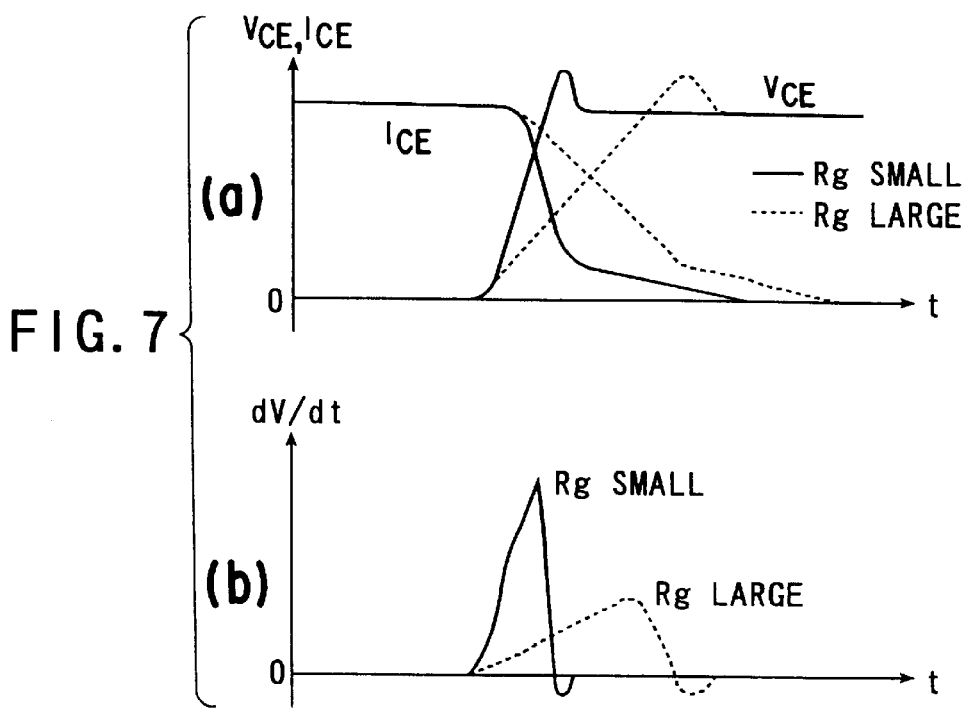
FIG. 7 is a time chart illustrating a conventional protection used during turn-OFF.
Figure 8:
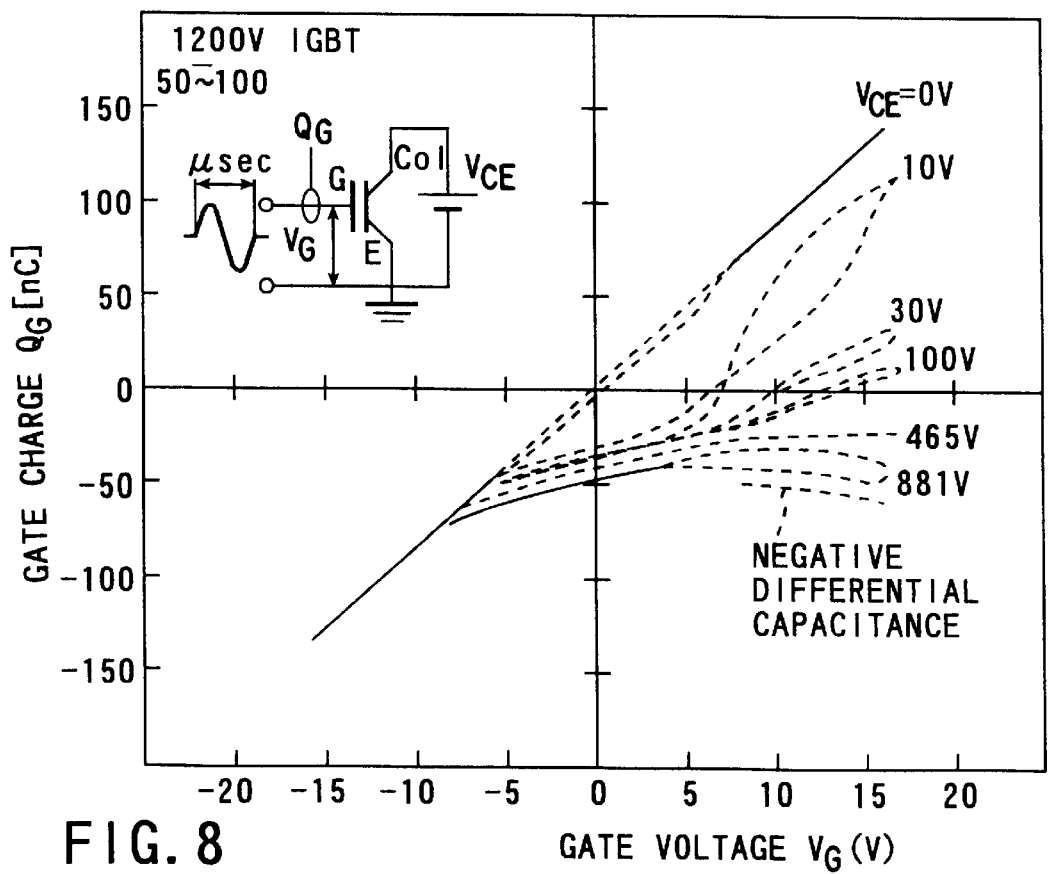
FIG. 8 is a diagram showing test results illustrating knowledge upon which the present invention is based.
Figure 9:
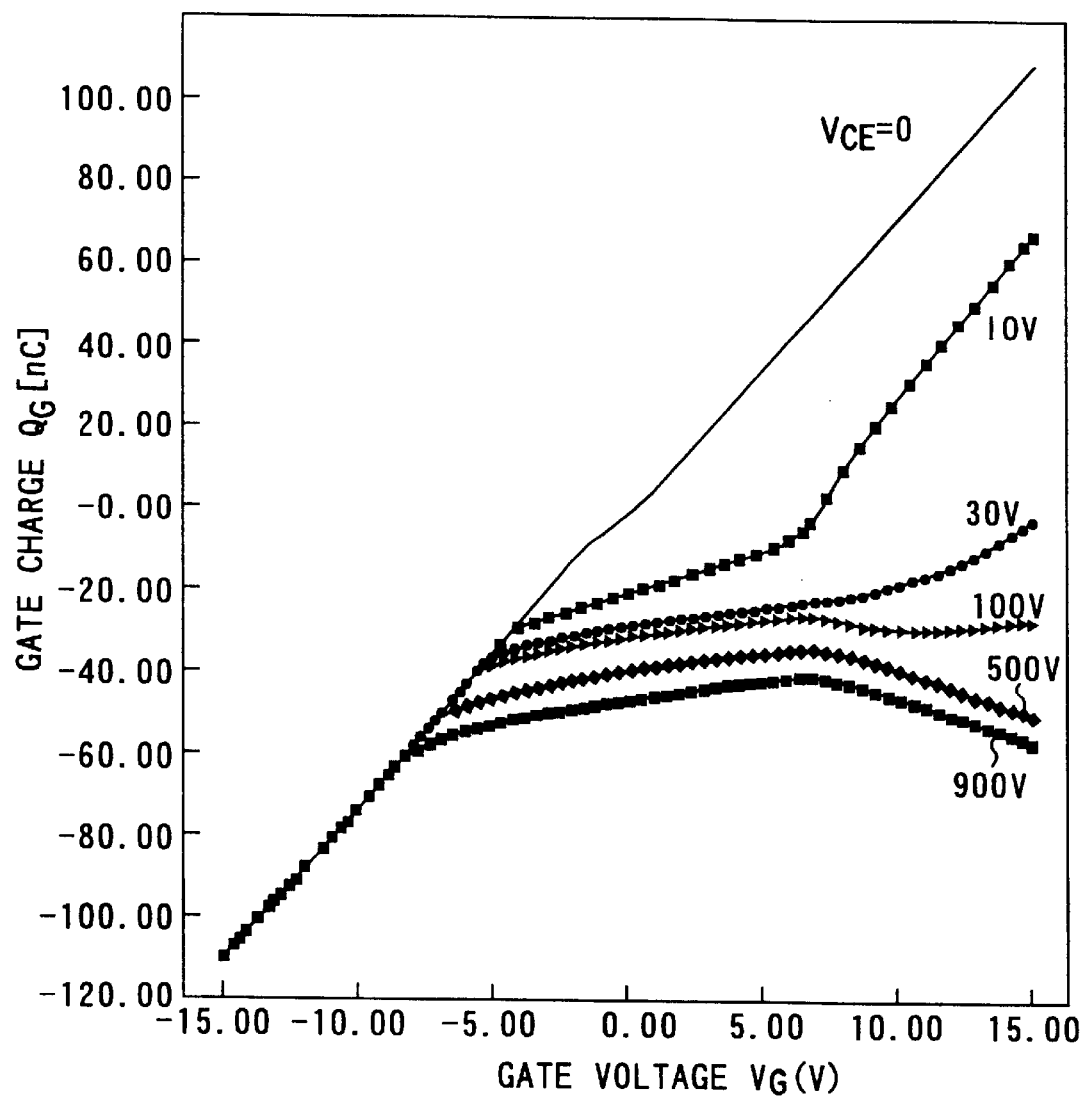
FIG. 9 is a diagram showing simulation results illustrating the knowledge.
Figure 10:
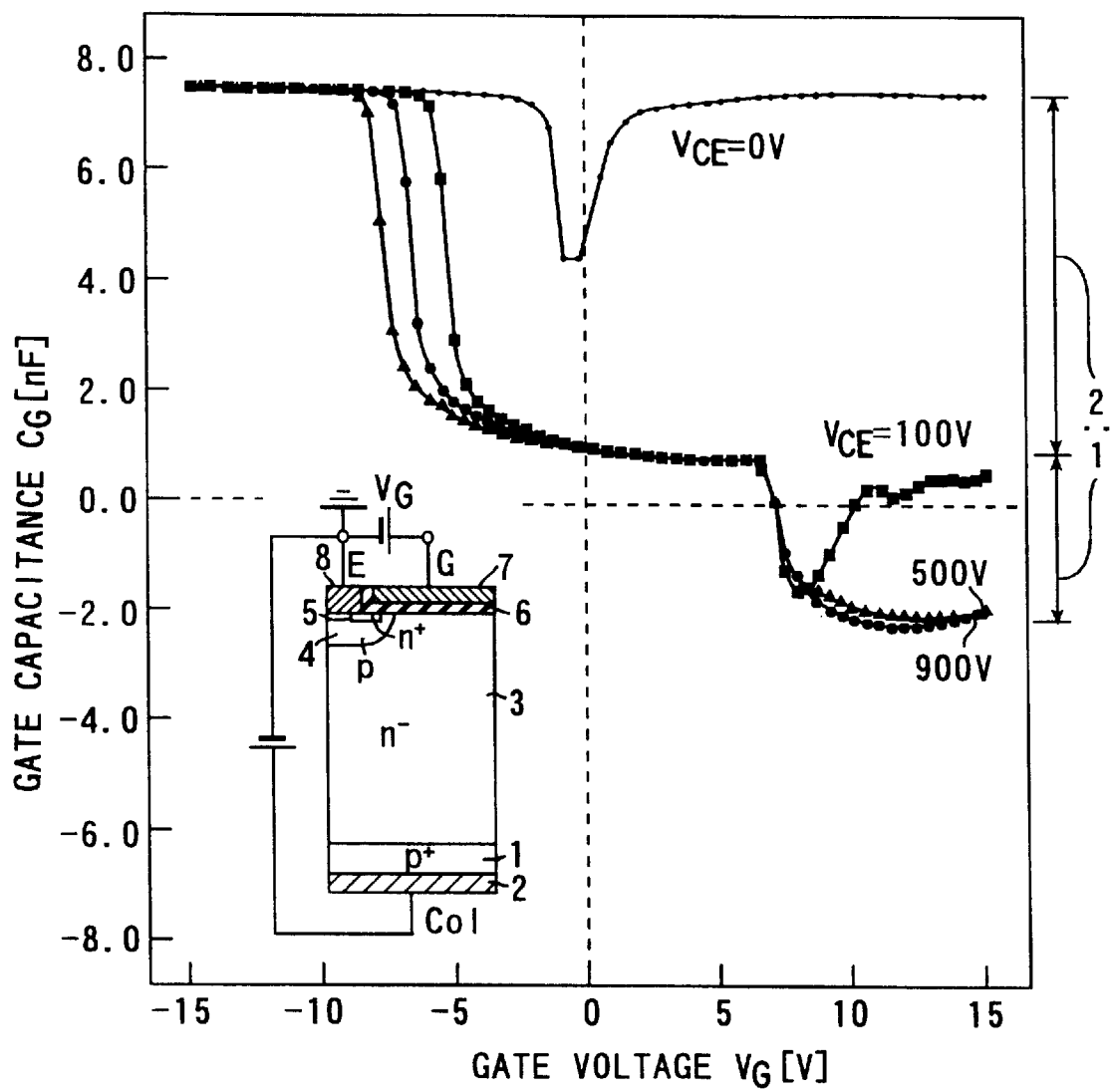
FIG. 10 is a diagram showing simulation results illustrating the knowledge.
Figure 11:
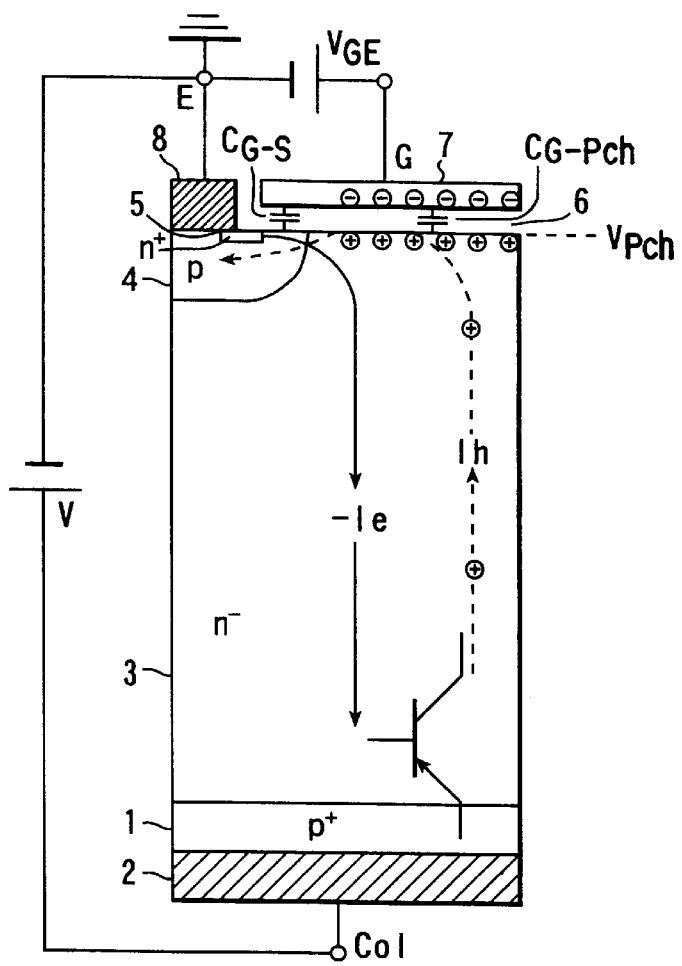
FIG. 11 is a schematic diagram illustrating the knowledge.
Figure 12:
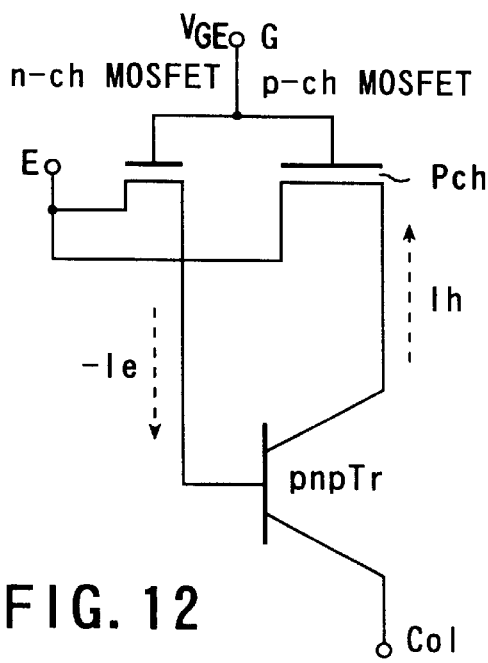
FIG. 12 is an equivalent circuit diagram illustrating the knowledge.
Figure 13:
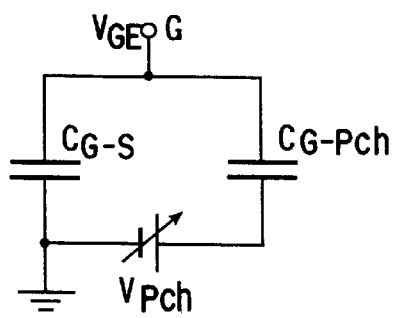
FIG. 13 is an equivalent circuit diagram illustrating the knowledge.
Figure 14:
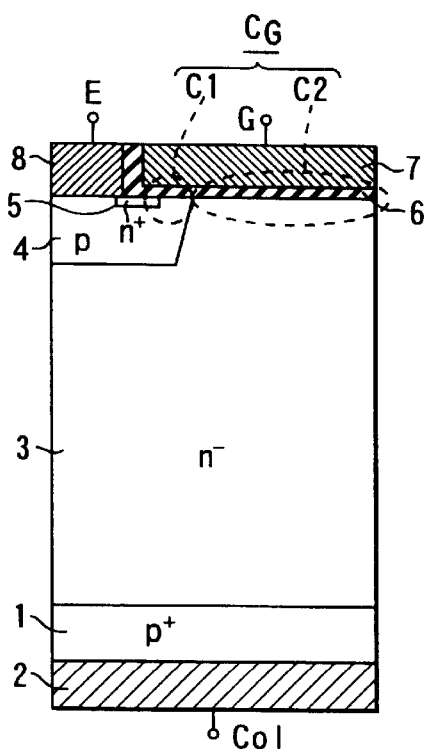
FIG. 14 is a diagram showing a cross-sectional view of an IGBT illustrating the essence of the invention.
Figure 15:
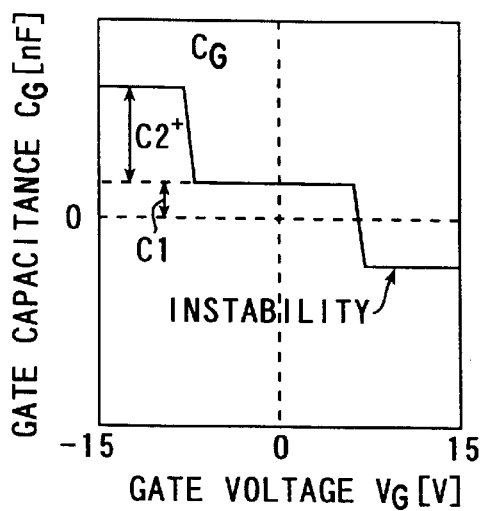
FIG. 15 is a diagram showing conventional gate capacity-gate voltage characteristics in order to illustrate the essence.
Figure 16:
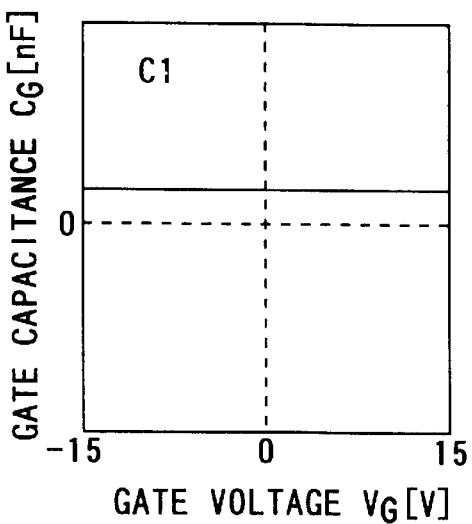
FIG. 16 is a diagram showing capacity C1—gate voltage characteristics in order to illustrate the essence.
Figure 17:
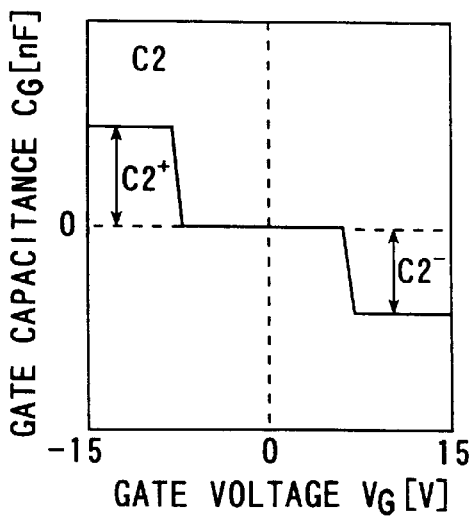
FIG. 17 is a diagram showing capacity C2—gate voltage characteristics in order to illustrate the essence.
Figure 18:
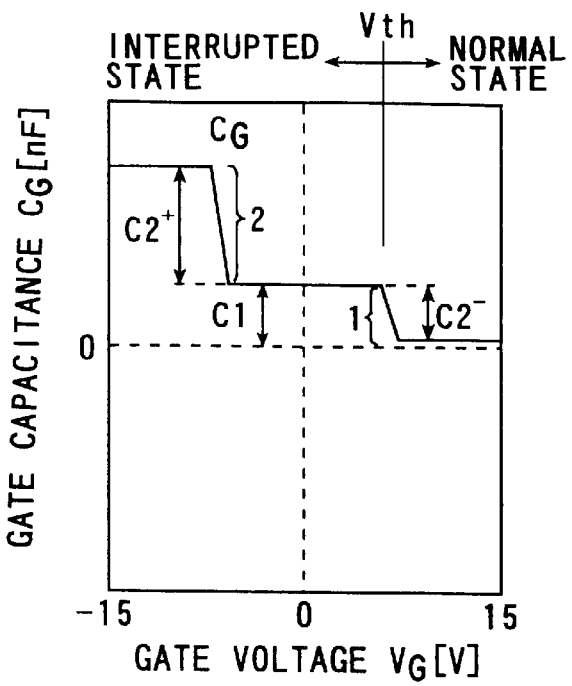
FIG. 18 is a diagram showing gate capacity—gate voltage characteristics according to the invention in order to illustrate the essence.
Figure 19:
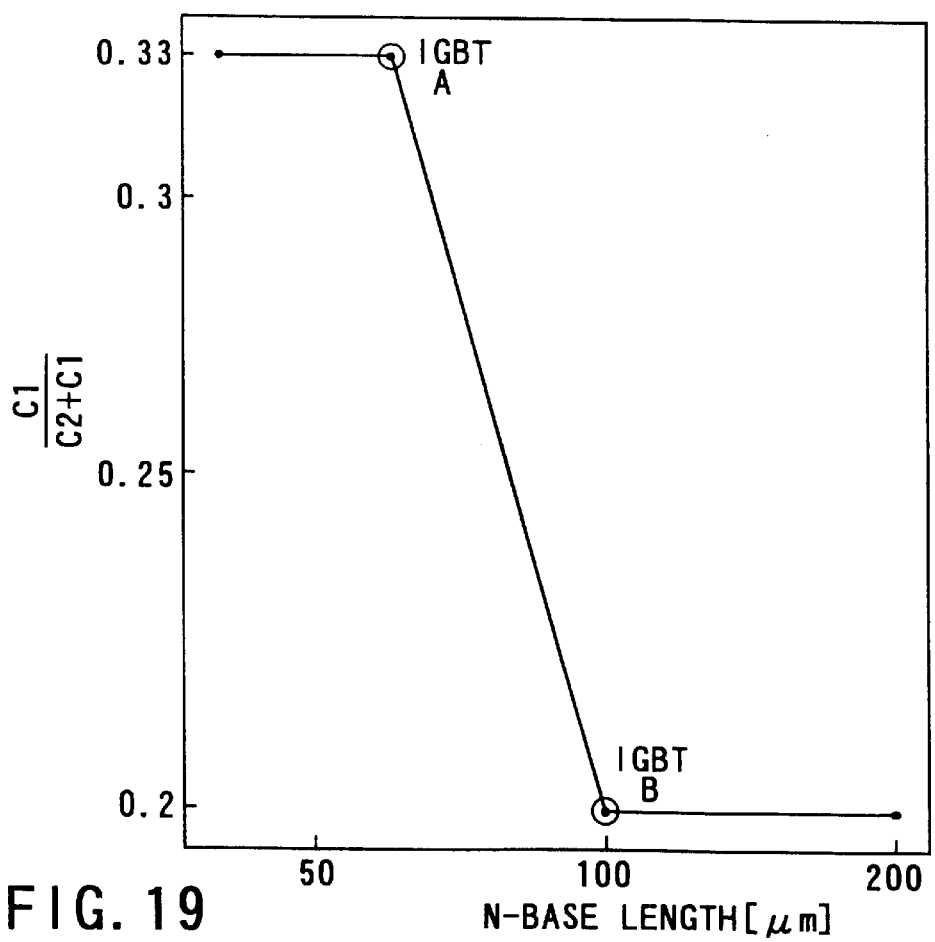
FIG. 19 is a diagram showing test results confirming the knowledge upon which the invention is based.
Figure 20:
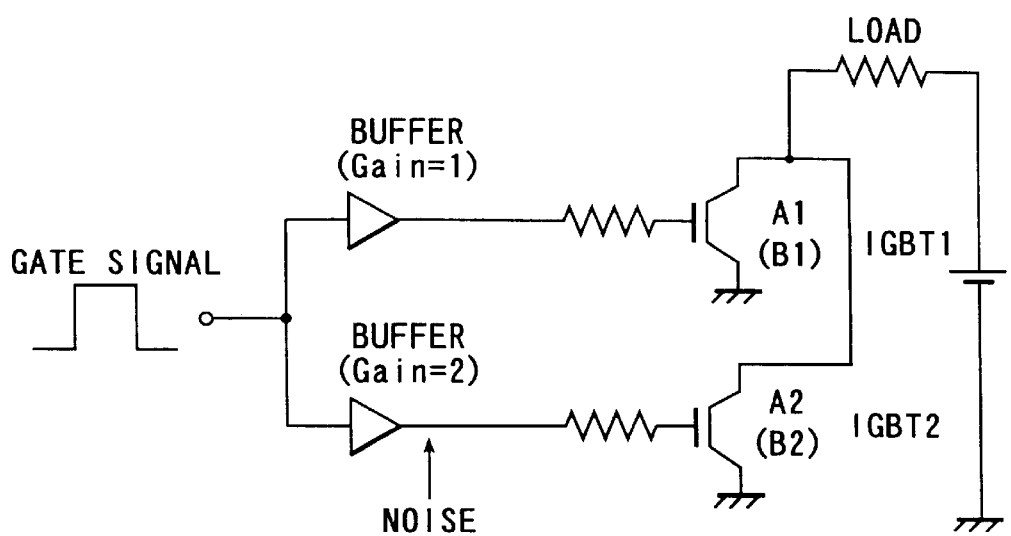
FIG. 20 is a circuit diagram showing a circuit used in the test.
Figure 21:
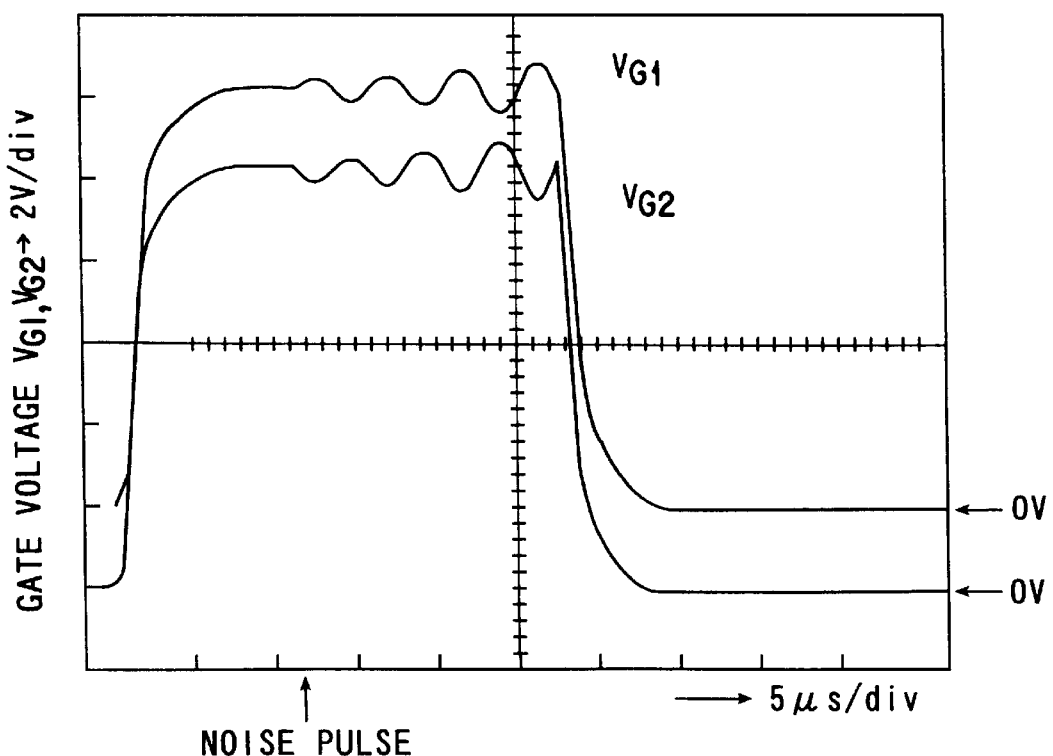
FIG. 21 is a diagram showing the behaviour of gate voltage after noise has become mixed in the same test.
Figure 64:
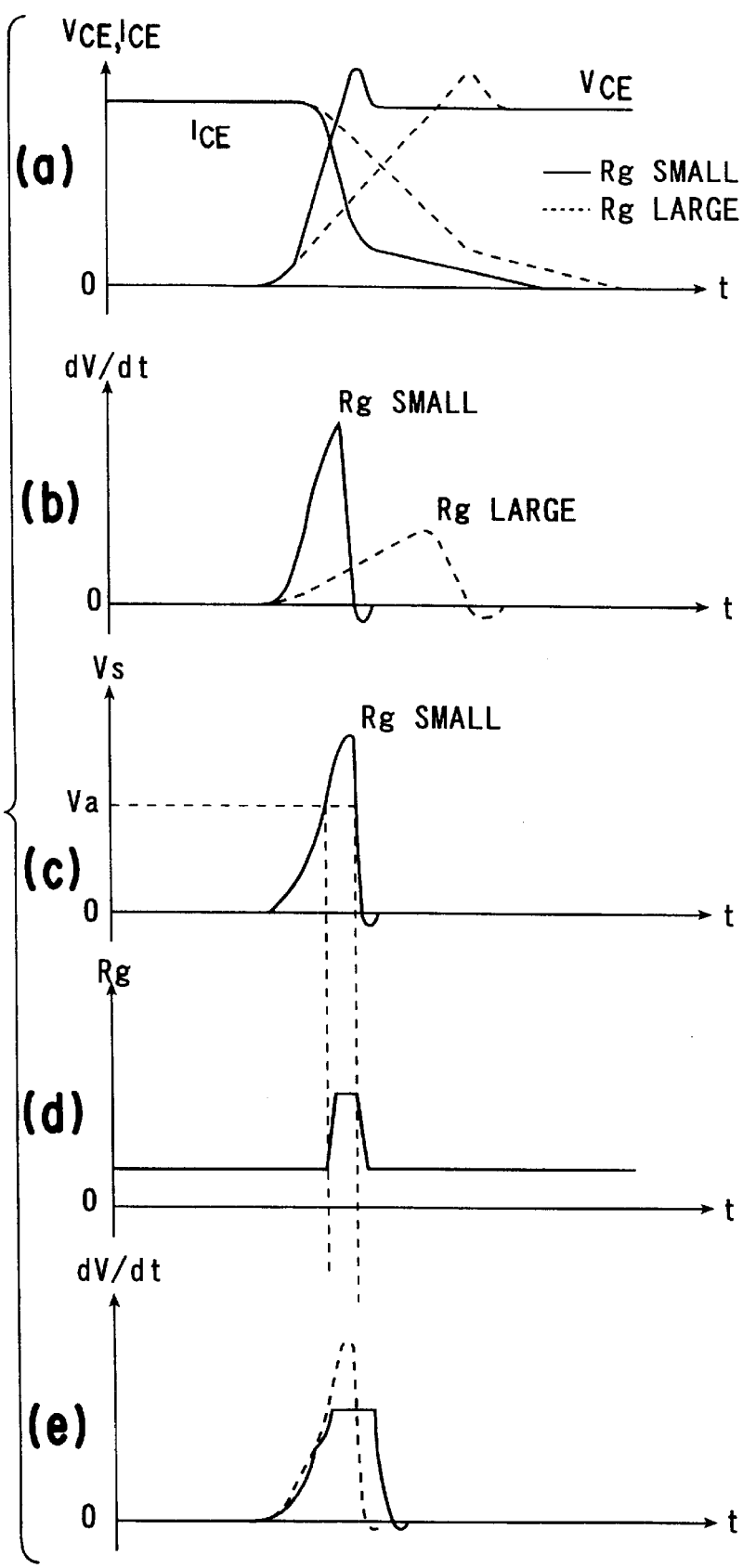
FIG. 64. is a diagram showing timecharts illustrating the operation of the twentieth embodiment.

Timecharts (a) and (b) in FIG. 64 are identical to those shown already at (a) and (b) in FIG. 7.

Timechart (c) in FIG. 64 shows a waveform illustrating how the potential Vs of the sensing element 52 changes as a result of changes in dV/dt (when Rg is low). When the Vs value exceeds the threshold voltage Va of the gate controller 60, the gate controller 60 commences operation, increasing the resistance Rg between the input terminal 66 and the output terminal 67, as (d) in FIG. 64 shows.

Consequently, as the unbroken line of (e) in FIG. 64 shows, the dV/dt peak value is limited, thereby protecting the element portion M1a from breakdown. The present embodiment achieves a faster turn OFF than the conventional method, in which dV/dt was limited by raising the Rg from the start, and therefore reduces OFF loss.

According to the embodiment described above, gate resistance Rg is low in the normal ON state and high at turn OFF. Thus, breakdown due to high dV/dt when the element portion M1a (main IGBT) is turned OFF can be prevented. In addition, turn OFF can be accomplished more quickly, with a reduction in OFF loss.

The present embodiment was described above with reference to an example in which the dV/dt detecting portion Dt1 and the element portion M1a were provided on the same substrate, but the technology of the embodiment is not restricted to such a case, and identical effects can be obtained when the two portions Dt1 and M1a are provided on separate substrates.

TWENTY-FIRST EMBODIMENT

Figure 65:
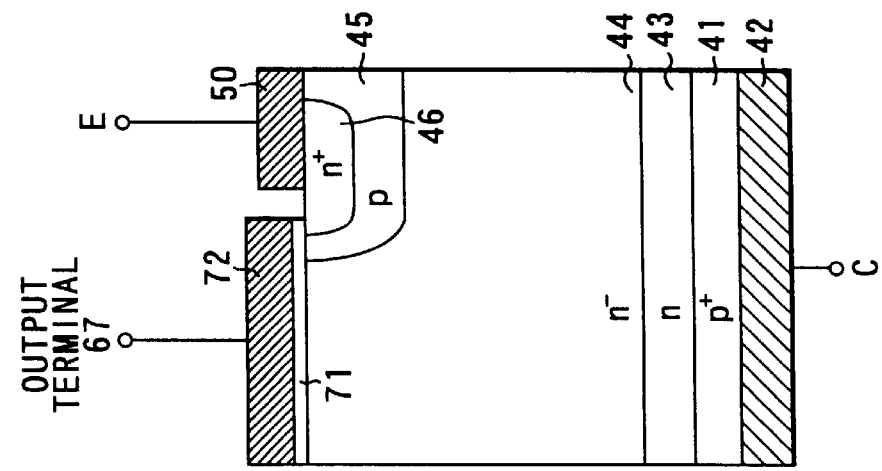
FIG. 65 is a diagram showing a cross-sectional view of a configuration of an element portion used in a control signal device according to a twenty-first embodiment of the invention.

FIG. 65 is a diagram showing a cross-sectional view of a configuration of an element portion used in a control signal device according to a twenty-first embodiment of the invention. Instead of the trench structure of FIG. 61, the IGBT of the present embodiment has a planar structure. In other words, the trenches 47 are omitted, an insulating layer 71 is provided over an n-type base layer 44, a p-type base layer 45 and an n-type source layer 46, and a gate electrode 72 is formed on the insulating layer 71.

The above configuration achieves the same effects as twentieth embodiment. FIG. 61 and FIG. 65 illustrated a case using an IGBT as the element portion M1a, but the present invention is not restricted to such a case. According to the present invention, an entire vertical MOS gate drive power semiconductor element can be used as the element portion M1a.

A trench-type MOSFET or a planar-type MOSFET are examples of this type of vertical MOS gate drive power semiconductor.

Figure 66:
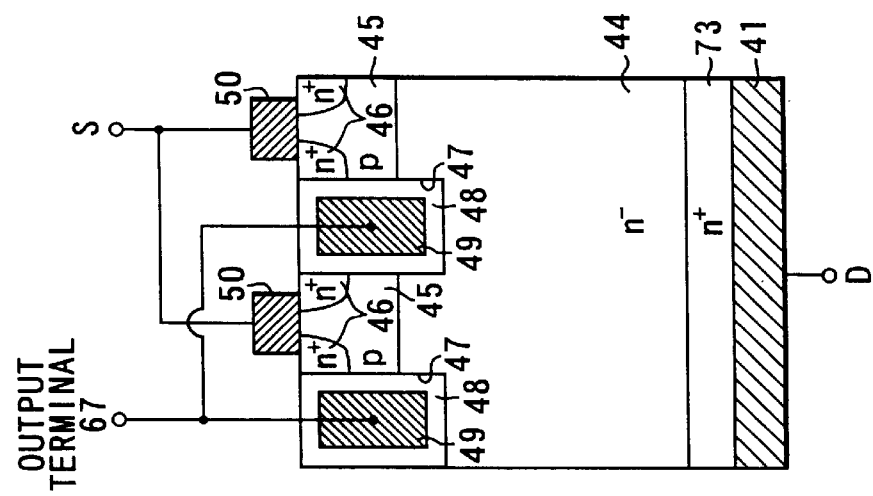

As FIG. 66 shows, a trench-type MOSFET comprises an n⁺-type drain 73, in place of the p⁺-type emitter layer 41 and the n-type buffer layer 43 shown in FIG. 61.

Figure 67:
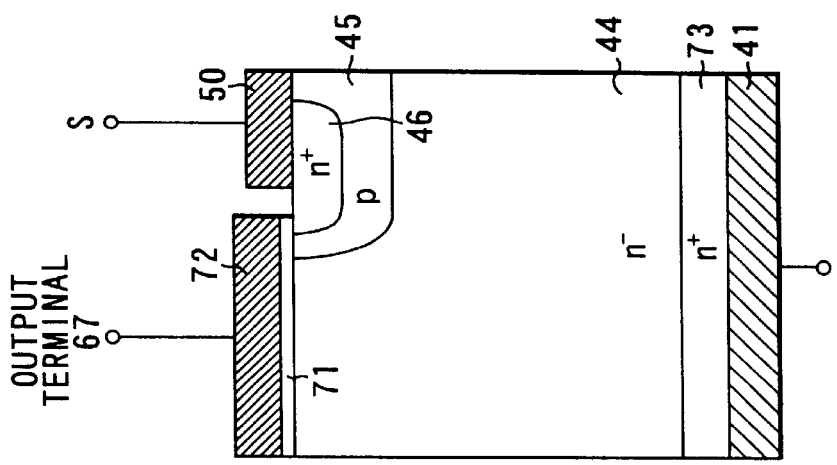
FIG. 66 and FIG. 67 are diagrams showing cross-sectional views of element portion according to the twenty-first embodiment.

Similarly, as FIG. 67 shows, a planar-type MOSFET comprises an n⁺-type drain 73, in place of the p⁺-type emitter layer 41 and the n-type buffer layer 43 shown in FIG. 65.

The collector sides (in a MOSFET, the drain side) of these types of IGBTs and MOSFETs are different. However, by providing the collector side of a dV/dt detecting portion Dt1 with the same configuration as the element portion M1a, the present invention can be accomplished in either.

TWENTY-SECOND EMBODIMENT

FIG. 68 is a diagram showing a cross-sectional view of a configuration of a dV/dt detecting portion used in a semiconductor device according to a twenty-second embodiment of the invention. As FIG. 68 shows, in place of the insulating film 51, provided over the n⁻-type base layer 44, and the sensing element 52 which were depicted in FIG. 61, the present embodiment has an insulating film 75 and a sensing electrode 76, which are provided on a p-type reserve layer 74 at the termination portion of the junction.

According to the above configuration, in addition to achieving the effects of twentieth embodiment, the effective area of the element portion M1a can be increased.

TWENTY-THIRD EMBODIMENT

FIG. 69 is a diagram showing a cross-sectional view of a configuration of a dV/dt detecting portion used in a semiconductor device according to a c of the invention. The present embodiment applies the trench structure, which was a feature of the element portion M1a shown in FIG. 61, to the dV/dt detecting portion Dt1. In other words, as FIG. 69 shows, in place of the insulating film 51, provided over the n⁻-type base layer 44, and the sensing element 52, the present embodiment comprises sensing electrodes 49a which are buried in trenches 47a, provided in the n⁻-type base layer 44, with insulating films 48 a provided in between.

According to this configuration, the trenches of the element portion M1a and the dV/dt detecting portion Dt1 can be created simultaneously. Therefore, in addition to achieving the effects obtained by twentieth embodiment, the number of manufacturing steps required when manufacturing the semiconductor device can be reduced.

TWENTY-FOURTH EMBODIMENT

FIG. 70 is a diagram showing a cross-sectional view of a configuration of a dV/dt detecting portion used in a semiconductor device according to a twenty-fourth embodiment of the invention. The present embodiment combines the configurations of FIGS. 68 and 69. In other words, as FIG. 70 shows, in place of the insulating film 51, provided over the n⁻-type base layer 44, and the sensing element 52 which are depicted in FIG. 61, the present embodiment comprises sensing electrodes 49a which are buried in trenches 47a, provided in the p-type reserve layer 74 at the termination of the junction, with insulating films 48a provided in between.

Therefore, in addition to the effects obtained by twentieth embodiment, the effects of twenty-second and twenty-third embodiments can be simultaneously achieved.

The configurations of the element M1a and the dV/dt detecting portion Dt1 described above in twenty embodiments through twenty-fourth can be combined together as desired.

The above description referred to an example in which the main switching element is an IGBT or a MOSFET, but the invention is not restricted to such cases. For instance, the invention can be applied in a variety of modifications to devices such as MCT (CMOS Controlled Thyristor) and IGTTs.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirits or scope of the general inventive concept as defined by the appended claims and their equivalents.

What is claimed is:

1. A method for protecting a semiconductor device when short circuits occur, said semiconductor device having two main electrodes and a control electrode which controls a current flowing between said main electrodes, said method comprising steps of:

detecting an amount of charge accumulated at said control electrode based on a voltage of said control electrode; and controlling at least one of a voltage applied to said control electrode and current flow to said control electrode based on a charge amount detected by said detecting.

2. A method for protecting a semiconductor device according to claim 1, wherein:

when said amount of charge has a negative value, said applied voltage and/or said current flow is/are lower by said controlling.

3. A method for protecting a semiconductor device when short circuits occur, said semiconductor device having two main electrodes and a control electrode which controls a current flowing between said main electrodes, said method comprising steps of:

detecting current, which crosses through said control electrode, before and after said current crosses; and controlling at least one of a voltage applied to the control electrode and current flow to the control electrode based on a difference current detected before crossing and current detected after crossing.

4. A method for protecting a semiconductor device according to claim 3, wherein:

when an integral of said difference has a negative value, said applied voltage and/or said current flow is/are reduced by said controlling.

* * * * *